US012652918B2

(12) United States Patent
Seo

(10) Patent No.: US 12,652,918 B2
(45) Date of Patent: Jun. 9, 2026

(54) DISPLAY DEVICE

(71) Applicant: Samsung Display Co., Ltd., Yongin-Si (KR)

(72) Inventor: Dong Rock Seo, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 463 days.

(21) Appl. No.: 18/207,560

(22) Filed: Jun. 8, 2023

(65) Prior Publication Data

US 2024/0099087 A1 Mar. 21, 2024

(30) Foreign Application Priority Data

Sep. 16, 2022 (KR) ......................... 10-2022-0116984

(51) Int. Cl.
 H10K 59/35 (2023.01)
 H10K 50/81 (2023.01)
 (Continued)

(52) U.S. Cl.
 CPC ......... H10K 59/1315 (2023.02); H10K 50/81 (2023.02); H10K 50/844 (2023.02);
 (Continued)

(58) Field of Classification Search
 CPC ............. H10K 59/121; H10K 59/1213; H10K 59/1216; H10K 59/131; H10K 59/1315;
 (Continued)

(56) References Cited

U.S. PATENT DOCUMENTS 10,964,771 B2 * 3/2021 Lee ...................... H10K 59/131
11,250,803 B2 * 2/2022 Han ................... G02F 1/13312
 (Continued)

FOREIGN PATENT DOCUMENTS

KR 10-2017-0117291 A 10/2017
KR 10-2020-0051108 A 5/2020
 (Continued)

OTHER PUBLICATIONS

Korean Intellectual Property Office, Request for the Submission of an Opinion, Korean Application No. 10-2022-0116984, Feb. 5, 2026, all pages. (Year: 2026).*

*Primary Examiner* — Victoria K. Hall
(74) *Attorney, Agent, or Firm* — Innovation Counsel LLP

(57) ABSTRACT

A display device comprises a substrate comprising a display area, a main non-display area, a hole area, and an additional non-display area; a circuit array layer; a light emitting array layer; an encapsulation layer; and a through portion. The circuit array layer comprises pixel drivers; and second direction lines comprised in a line conductive layer. The light emitting array layer comprises an anode electrode comprised in an electrode conductive layer on an insulating layer covering the line conductive layer. The second direction lines comprise hole intersection lines intersecting the additional non-display area. The hole intersection lines are electrically connected to detour line portions, respectively. The detour line portions are disposed in the additional non-display area and detour around the hole area. Some of the detour line portions are comprised in the electrode conductive layer.

28 Claims, 28 Drawing Sheets

(51) Int. Cl.

| | |
|---|---|
| *H10K 50/844* | (2023.01) |
| *H10K 59/121* | (2023.01) |
| *H10K 59/124* | (2023.01) |
| *H10K 59/131* | (2023.01) |
| *H10K 59/40* | (2023.01) |
| *H10K 59/80* | (2023.01) |

(52) U.S. Cl.
CPC ....... *H10K 59/121* (2023.02); *H10K 59/1213* (2023.02); *H10K 59/124* (2023.02); *H10K 59/131* (2023.02); *H10K 59/353* (2023.02); *H10K 59/8051* (2023.02); *H10K 59/873* (2023.02)

(58) Field of Classification Search
CPC ........... H10K 59/35–353; H10K 59/60; H10K 59/65; H05K 2201/09063; H05K 2201/09072
See application file for complete search history.

(56) References Cited

U.S. PATENT DOCUMENTS

| | | | | |
|---|---|---|---|---|
| 11,620,933 | B2 | 4/2023 | Orio et al. | |
| 11,631,730 | B2 | 4/2023 | Ka et al. | |
| 11,839,121 | B2 * | 12/2023 | Lee | H10K 59/131 |
| 12,066,733 | B2 | 8/2024 | Hong et al. | |
| 2017/0294502 | A1 * | 10/2017 | Ka | H10K 71/00 |
| 2020/0144352 | A1 * | 5/2020 | Lee | G09G 3/3233 |
| 2020/0176538 | A1 * | 6/2020 | Um | H10K 59/126 |
| 2021/0210585 | A1 | 7/2021 | Lee et al. | |
| 2022/0187878 | A1 * | 6/2022 | Chang | G06F 1/1688 |
| 2024/0411193 | A1 | 12/2024 | Hong et al. | |

FOREIGN PATENT DOCUMENTS

| | | | |
|---|---|---|---|
| KR | 10-2020-0066503 | A | 6/2020 |
| KR | 10-2021-0016152 | A | 2/2021 |
| KR | 10-2022-0048943 | A | 4/2022 |

* cited by examiner

SEL: CHDT, CH11, CH12, CH2, CH31, CH32, CH4,
     CH5, CH6, SDT, S11, S12, S1, S2, S31, S32, S4, S5,
     S6, DDT, D11, D12, D2, D31, D32, D4, D5, D6
CDL1: GIL, GWL, GCL, ECL, GDT

CDL3: DL, VDL, CCE1, CCE2, ANDE

SL: GWL, GIL, GCL, ECL
VDRL: DL, VDL
DL: DL', HINL1
VDL: VDL', HINL2

SL: GWL, GIL, GCL, ECL
VDRL: DL, VDL
DL: DL', HINL1
VDL: VDL', HINL2

CDL3: DL, VDL, VIAL, CCE1, CCE2, ANDE
VDRL: DL, VDL, VIAL

SL: GWL, GIL, GCL, ECL
VDRL: DL, VDL, VIAL
DL: DL', HINL1
VDL: VDL', HINL2
VIAL: VIAL, HINL3

SL: GWL, GIL, GCL, ECL

CDL3: DL, VDL, VIAL1, VIAL2, CCE1, CCE2, ANDE
VDRL: DL, VDL, VIAL1, VIAL2

SL: GWL, GIL, GCL, ECL
VDRL: DL, VDL, VIAL1, VIAL2
DL: DL', HINL1
VDL: VDL', HINL2
VIAL1: VIAL1', HINL3
VIAL2: VIAL2', HINL4

SL: GWL, GIL, GCL, ECL

SL: GWL, GIL, GCL, ECL

DISPLAY DEVICE

CROSS-REFERENCE TO RELATED APPLICATION

This application claims priority from Korean Patent Application No. 10-2022-0116984 filed on Sep. 16, 2022, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions.

The display device may be a flat panel display device such as a liquid crystal display device, a field emission display device and a light emitting display device. Examples of the light emitting display device may include an organic light emitting display device including organic light emitting elements, an inorganic light emitting display device including inorganic light emitting elements such as inorganic semiconductors, and a micro light emitting display device including micro light emitting elements.

The organic light emitting display device displays an image using a plurality of light emitting elements, each including a light emitting layer made of an organic material. As described above, the organic light emitting display device implements image display using a self-light emitting element, and thus may have relatively superior performance in power consumption, response speed, luminous efficiency, luminance, and wide viewing angle compared to other display devices.

SUMMARY

According to embodiments, the circuit array layer of the display device may include signal lines transmitting signals or power to pixel drivers.

Further, according to embodiments, the display device may include a through portion disposed in a hole area surrounded by a display area.

In this case, some of the signal lines may intersect an additional non-display area between the hole area and the display area, and the hole area. These signal lines may be electrically connected to detour line portions disposed in the additional non-display area and detouring around the hole area.

Since, however, the width of the display area decreases as the additional non-display area becomes wider, the display quality of the display device may deteriorate. Therefore, the detour line portions need to be arranged in the limited additional non-display area and, thus, the gap between the detour line portions may be reduced. Accordingly, short-circuit defects or coupling defects between lines may occur.

Aspects of the present disclosure provide a display device capable of reducing coupling defects between lines or short-circuit defects of detour line portions disposed in an additional non-display area.

According to an embodiment, a display device may include a substrate comprising a display area in which emission areas are arranged, a main non-display area disposed around the display area, a hole area surrounded by the display area, and an additional non-display area between the hole area and the display area; a circuit array layer disposed on the substrate; a light emitting array layer disposed on the circuit array layer and comprising light emitting elements respectively corresponding to the emission areas; an encapsulation layer disposed on the light emitting array layer; and a through portion disposed in the hole area and penetrating the substrate, the circuit array layer, the light emitting array layer, and the encapsulation layer. The circuit array layer comprises pixel drivers electrically connected to the light emitting elements, respectively, and second direction lines spaced apart from each other in a first direction, extending in a second direction crossing the first direction, comprised in a line conductive layer, and electrically connected to the pixel drivers. The light emitting array layer comprises an anode electrode of each of the light emitting elements comprised in an electrode conductive layer on an insulating layer covering the line conductive layer. The second direction lines comprise hole intersection lines intersecting the additional non-display area. The hole intersection lines are electrically connected to detour line portions, respectively. The detour line portions are disposed in the additional non-display area and detour around the hole area. Some of the detour line portions are comprised in the electrode conductive layer.

In an embodiment, the second direction lines comprise data lines configured to transmit a data signal to the pixel drivers, and first power lines configured to transmit a first power to the pixel drivers. The data lines comprise first hole intersection lines intersecting the additional non-display area. The first power lines comprise second hole intersection lines intersecting the additional non-display area.

In an embodiment, first detour line portions electrically connected to the first hole intersection lines, respectively, are comprised in the line conductive layer and are continuous with the first hole intersection lines, respectively. A second detour line portion electrically connected to the second hole intersection lines is comprised in the electrode conductive layer and overlaps the first detour line portions.

In an embodiment, a first data detour line portion electrically connected to some of the first hole intersection lines is comprised in the line conductive layer and is continuous with the some of the first hole intersection lines. A second data detour line portion electrically connected to the other of the first hole intersection lines is comprised in the electrode conductive layer. Second detour line portions electrically connected to the second hole intersection lines, respectively, are comprised in the electrode conductive layer and are spaced apart from the second data detour line portion. The first data detour line portion overlaps some of the second detour line portions.

In an embodiment, the second data detour line portions and the second detour line portions are alternately disposed.

In an embodiment, one pixel driver of the pixel drivers comprises a driving transistor configured to generate a driving current for driving one light emitting element of the light emitting elements electrically connected to the one pixel driver, a first transistor disposed between a gate electrode of the driving transistor and a second electrode of the driving transistor, a second transistor disposed between one of the data lines and a first electrode of the driving transistor, a third transistor disposed between an initialization voltage line transmitting an initialization voltage and the gate electrode of the driving transistor, a fourth transistor disposed between the initialization voltage line and the one light emitting element, a fifth transistor disposed between one of the first power lines and the first electrode of the driving transistor, and a sixth transistor disposed between the one light emitting element and the second electrode of the driving transistor.

In an embodiment, the circuit array layer comprises a semiconductor layer disposed on the substrate, a first conductive layer disposed on a gate insulating layer covering the semiconductor layer and comprising first direction lines extending in the first direction, a second conductive layer disposed on an interlayer insulating layer covering the first conductive layer, a third conductive layer disposed on a first planarization layer covering the second conductive layer and comprising the second direction lines, and a second planarization layer covering the third conductive layer. The line conductive layer comprises the third conductive layer. The insulating layer comprises the second planarization layer. The initialization voltage line is comprised in the second conductive layer and extends in the first direction.

In an embodiment, the second direction lines further comprise initialization voltage auxiliary lines configured to transmit an initialization voltage to the pixel drivers. The initialization voltage auxiliary lines comprise third hole intersection lines intersecting the additional non-display area.

In an embodiment, first detour line portions electrically connected to the first hole intersection lines, respectively, are comprised in the line conductive layer and are continuous with the first hole intersection lines, respectively. A second detour line portion electrically connected to the second hole intersection lines is comprised in the electrode conductive layer. Third detour line portions electrically connected to the third hole intersection lines, respectively, are comprised in the line conductive layer, are spaced apart from the first detour line portions, and are continuous with the third hole intersection lines, respectively. The second detour line portion overlaps the first detour line portions and the third detour line portions.

In an embodiment, the first detour line portions and the third detour line portions are alternately disposed.

In an embodiment, first detour line portions electrically connected to the first hole intersection lines, respectively, are comprised in the line conductive layer and are continuous with the first hole intersection lines, respectively. Second detour line portions electrically connected to the second hole intersection lines, respectively, are comprised in the line conductive layer, are spaced apart from the first detour line portions, and are continuous with the second hole intersection lines, respectively. Third detour line portions electrically connected to the third hole intersection lines, respectively, are comprised in the electrode conductive layer and overlap the second detour line portions, respectively.

In an embodiment, the first detour line portions and the second detour line portions are alternately disposed.

In an embodiment, first detour line portions electrically connected to the first hole intersection lines, respectively, are comprised in the line conductive layer and are continuous with the first hole intersection lines, respectively. Second detour line portions electrically connected to the second hole intersection lines, respectively, are comprised in the electrode conductive layer. Third detour line portions electrically connected to the third hole intersection lines are comprised in the electrode conductive layer and are spaced apart from the second detour line portions. At least some of the second detour line portions overlap the first detour line portions, respectively.

In an embodiment, the second detour line portions and the third detour line portions are alternately disposed.

In an embodiment, one pixel driver of the pixel drivers comprises a driving transistor configured to generate a driving current for driving one light emitting element of the light emitting elements electrically connected to the one pixel driver, a first transistor disposed between a gate electrode of the driving transistor and a second electrode of the driving transistor, a second transistor disposed between one of the data lines and a first electrode of the driving transistor, a third transistor disposed between an initialization voltage line transmitting the initialization voltage and the gate electrode of the driving transistor, a fourth transistor disposed between the initialization voltage line and the one light emitting element, a fifth transistor disposed between one of the first power lines and the first electrode of the driving transistor, and a sixth transistor disposed between the one light emitting element and the second electrode of the driving transistor.

In an embodiment, the circuit array layer comprises a semiconductor layer disposed on the substrate, a first conductive layer disposed on a gate insulating layer covering the semiconductor layer and comprising first direction lines extending in the first direction, a second conductive layer disposed on an interlayer insulating layer covering the first conductive layer, a third conductive layer disposed on a first planarization layer covering the second conductive layer and comprising the second direction lines, and a second planarization layer covering the third conductive layer. The line conductive layer comprises the third conductive layer. The insulating layer comprises the second planarization layer. The initialization voltage line is comprised in the second conductive layer, extends in the first direction, and is electrically connected to the initialization voltage auxiliary lines.

In an embodiment, one pixel driver of the pixel drivers comprises a driving transistor configured to generate a driving current for driving one light emitting element of the light emitting elements electrically connected to the one pixel driver. The second direction lines further comprise first initialization voltage auxiliary lines configured to transmit a first initialization voltage for initializing a potential of a gate electrode of the driving transistor to the pixel drivers, and second initialization voltage auxiliary lines configured to transmit a second initialization voltage for initializing a potential of the anode electrode of the light emitting element to the pixel drivers. The first initialization voltage auxiliary lines comprise a third hole intersection line intersecting the additional non-display area. The second initialization voltage auxiliary lines comprise a fourth hole intersection line intersecting the additional non-display area.

In an embodiment, first detour line portions electrically connected to the first hole intersection lines, respectively, are comprised in the line conductive layer and are continuous with the first hole intersection lines, respectively. A second detour line portion electrically connected to the second hole intersection lines is comprised in the electrode conductive layer. A third detour line portion electrically connected to the third hole intersection line is comprised in the line conductive layer, is spaced apart from the first detour line portions, and is continuous with the third hole intersection line. A fourth detour line portion electrically connected to the fourth hole intersection line is comprised in the line conductive layer, is spaced apart from the first detour line portions and the third detour line portion, and is continuous with the fourth hole intersection line. The second detour line portion overlaps the first detour line portions, the third detour line portion, and the fourth detour line portion.

In an embodiment, each of the third detour line portion and the fourth detour line portion is disposed between the first detour line portions.

In an embodiment, first detour line portions electrically connected to the first hole intersection lines, respectively, are comprised in the line conductive layer and are continuous with the first hole intersection lines, respectively. Second detour line portions electrically connected to the second hole intersection lines, respectively, are comprised in the line conductive layer, are spaced apart from the first detour line portions, and are continuous with the second hole intersection lines, respectively. A third detour line portion electrically connected to the third hole intersection line is comprised in the electrode conductive layer. A fourth detour line portion electrically connected to the fourth hole intersection line is comprised in the electrode conductive layer and is spaced apart from the third detour line portion. The third detour line portion and the fourth detour line portion overlap the second detour line portions, respectively.

In an embodiment, the first detour line portions and the second detour line portions are alternately disposed.

In an embodiment, first detour line portions electrically connected to the first hole intersection lines, respectively, are comprised in the line conductive layer and are continuous with the first hole intersection lines, respectively. Second detour line portions electrically connected to the second hole intersection lines, respectively, are comprised in the electrode conductive layer. A third detour line portion electrically connected to the third hole intersection line is comprised in the line conductive layer and is spaced apart from the first detour line portions. A fourth detour line portion electrically connected to the fourth hole intersection line is comprised in the electrode conductive layer and is spaced apart from the second detour line portions. At least some of the second detour line portions overlap the first detour line portions, respectively.

In an embodiment, the third detour line portion is disposed between the first detour line portions. The fourth detour line portion is disposed between the second detour line portions.

In an embodiment, a first data detour line portion electrically connected to some of the first hole intersection lines is comprised in the line conductive layer and is continuous with the some of the first hole intersection lines. A second data detour line portion electrically connected to the other of the first hole intersection lines is comprised in the electrode conductive layer. Second detour line portions electrically connected to the second hole intersection lines, respectively, are comprised in the electrode conductive layer and are spaced apart from the second data detour line portion. A third detour line portion electrically connected to the third hole intersection line is comprised in the line conductive layer and is spaced apart from the first data detour line portions. A fourth detour line portion electrically connected to the fourth hole intersection line is comprised in the line conductive layer and is spaced apart from the first data detour line portions and the third detour line portion. The first data detour line portion overlaps some of the second detour line portions.

In an embodiment, the fourth detour line portion overlaps some others of the second detour line portions.

In an embodiment, a first data detour line portion electrically connected to some of the first hole intersection lines is comprised in the line conductive layer and is continuous with the some of the first hole intersection lines. A second data detour line portion electrically connected to the other of the first hole intersection lines is comprised in the electrode conductive layer. Second detour line portions electrically connected to the second hole intersection lines, respectively, are comprised in the electrode conductive layer and are spaced apart from the second data detour line portion. A third detour line portion electrically connected to the third hole intersection line is comprised in the line conductive layer and is spaced apart from the first data detour line portions. A fourth detour line portion electrically connected to the fourth hole intersection line is comprised in the electrode conductive layer and is spaced apart from the second data detour line portion and the second detour line portions. The first data detour line portion overlaps some of the second detour line portions.

In an embodiment, the fourth detour line portion is disposed between the second detour line portions.

In an embodiment, one pixel driver of the pixel drivers comprises a driving transistor configured to generate a driving current for driving one light emitting element of the light emitting elements electrically connected to the one pixel driver, a first transistor disposed between a gate electrode of the driving transistor and a second electrode of the driving transistor, a second transistor disposed between one of the data lines and a first electrode of the driving transistor, a third transistor disposed between a first initialization voltage line transmitting the first initialization voltage and the gate electrode of the driving transistor, a fourth transistor disposed between a second initialization voltage line transmitting the second initialization voltage and the one light emitting element, a fifth transistor disposed between one of the first power lines and the first electrode of the driving transistor, and a sixth transistor disposed between the one light emitting element and the second electrode of the driving transistor.

In an embodiment, the circuit array layer comprises a semiconductor layer disposed on the substrate, a first conductive layer disposed on a gate insulating layer covering the semiconductor layer and comprising first direction lines extending in the first direction, a second conductive layer disposed on an interlayer insulating layer covering the first conductive layer, a third conductive layer disposed on a first planarization layer covering the second conductive layer and comprising the second direction lines, and a second planarization layer covering the third conductive layer. The line conductive layer comprises the third conductive layer. The insulating layer comprises the second planarization layer. Each of the first initialization voltage line and the second initialization voltage line is comprised in the second conductive layer and extends in the first direction. The first initialization voltage line is electrically connected to the first initialization voltage auxiliary line. The second initialization voltage line is electrically connected to the second initialization voltage auxiliary line.

In an embodiment, a display device may include a substrate including a display area and a hole area surrounded by the display area, a circuit array layer on the substrate, a light emitting array layer on the circuit array layer, an encapsulation layer on the light emitting array layer, and a through portion disposed in the hole area and penetrating the substrate, the circuit array layer, the light emitting array layer, and the encapsulation layer. The circuit array layer includes pixel drivers, and second direction lines spaced apart from each other in a first direction, extending in a second direction, formed of a line conductive layer, and electrically connected to the pixel drivers. The light emitting array layer includes anode electrodes of light emitting elements formed of an electrode conductive layer on an insulating layer covering the second direction lines. The second direction lines include hole intersection lines intersecting the additional non-display area between the hole area and the display area, and the hole intersection lines are electrically connected to the detour line portions disposed in the additional non-display area and detouring around the hole area. Some of the detour line portions are formed of the electrode conductive layer similarly to the anode electrode.

That is, some of the detour line portions of the second direction lines are formed of the electrode conductive layer unlike the second direction lines, and the other detour line portions are formed of the line conductive layer similarly to the second direction lines.

In this way, the detour line portions of the second direction lines are arranged while being divided into the electrode conductive layer and the line conductive layer, so that the gap between the detour line portions may be widened, or the width of the additional non-display area may be reduced, compared to when all the detour line portions of the second direction lines are formed of the line conductive layer.

When the gap between the detour line portions is widened, short-circuit defects between the detour line portions and coupling defects between the detour line portions may be reduced. Accordingly, poor image quality around the through portion may be reduced, which makes it possible to improve the display quality of the display device.

However, the effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

Figure 1:
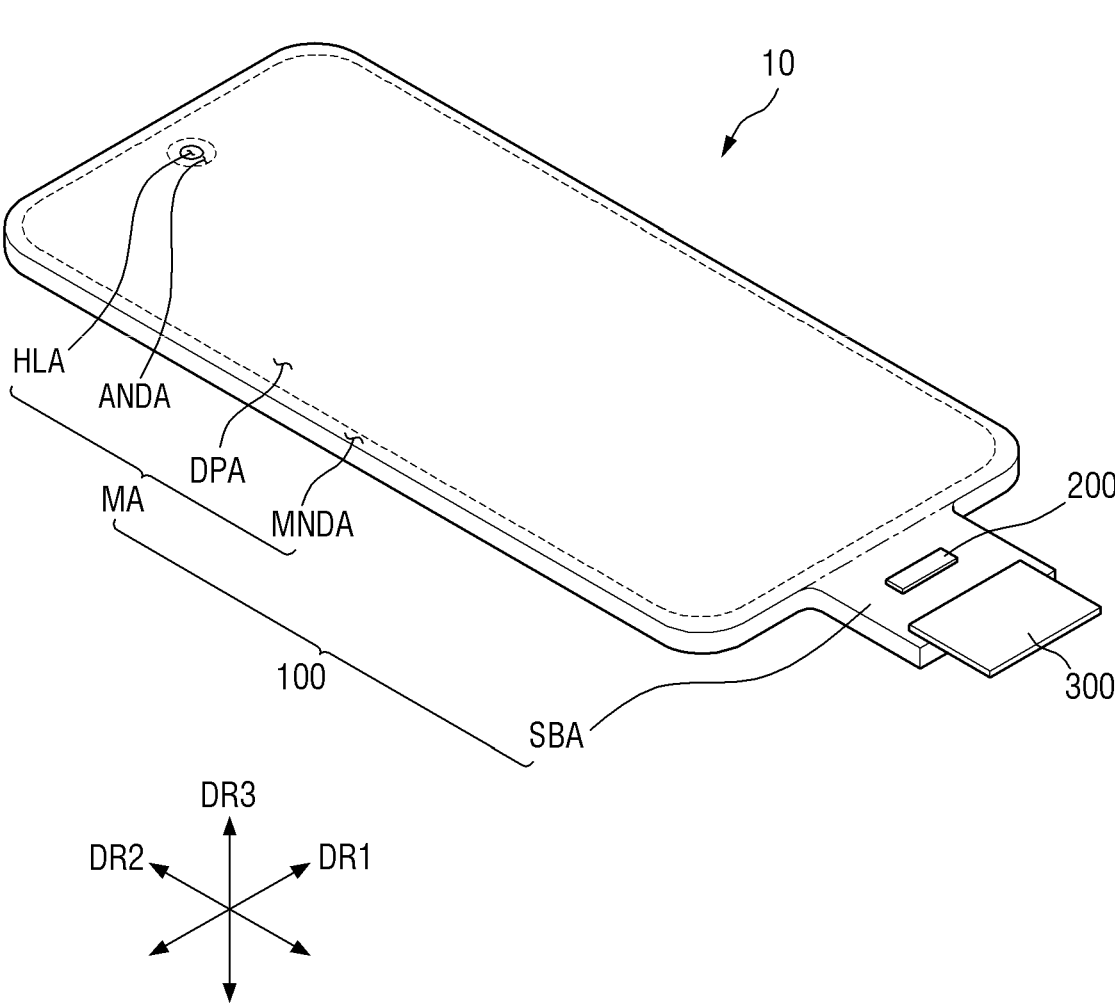
FIG. 1 is a perspective view illustrating a display device according to one embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" or "including" are used, they may specify the presence of stated features, integers, steps, operations, elements or components, but do not preclude the presence or addition of other features, integers, steps, operations, elements, components, or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a perspective view illustrating a display device according to one embodiment.

Referring to FIG. 1, a display device 10 is a device for displaying a moving image or a still image. The display device 10 may be used as a display screen of various devices, such as a television, a laptop computer, a monitor, a billboard and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 10 may be a light emitting display device such as an organic light emitting display using an organic light emitting diode, a quantum dot light emitting display including a quantum dot light emitting layer, an inorganic light emitting display including an inorganic semiconductor, and a micro light emitting display using a micro or nano light emitting diode (LED). Hereinafter, a case in which the display device 10 is an organic light emitting display device will be mainly described, but the present disclosure may be applied to a display device including an organic insulating material, an organic light emitting material, and a metal material.

The display device 10 may be formed to be flat, but is not limited thereto. For example, the display device 10 may include a curved portion formed at left and right ends and having a predetermined curvature or a varying curvature. In addition, the display device 10 may be formed flexibly so that it can be curved, bent, folded, or rolled.

The display device 10 may include a display panel 100, a display driving circuit 200, and a circuit board 300.

The display panel 100 may include a main region MA including a display area DPA in which an image is displayed, and a sub-region SBA protruding from one side of the main region MA.

The main region MA includes the display area DPA, a main non-display area MNDA disposed around the display area DPA, a hole area HLA surrounded by the display area DPA, and an additional non-display area ANDA between the hole area HLA and the display area DPA. Emission areas EA (see FIG. 5) are arranged in the display area DPA.

That is, the display device 10 may include the display area DPA in which the emission areas EA (see FIG. 5) for displaying an image are arranged, the main non-display area MNDA disposed around the display area DPA, the hole area HLA surrounded by the display area DPA, and the additional non-display area ANDA disposed between the hole area HLA and the display area DPA.

The display device 10 may further include a through portion THM (see FIG. 13) disposed in the hole area HLA and penetrating the display panel 100. The through portion THM may overlap at least a part of a functional module (not shown) disposed outside the display panel 100, and may be provided as a path for inputting sensing information of the functional module or a path for outputting sound of the functional module.

For example, the functional module may be disposed to overlap the through portion THM and its vicinity on the rear surface of the display panel 100, or may be disposed in the through portion THM.

For example, the functional module may include a camera module for imaging or recognizing an image corresponding to the front surface of the display device 10, a face recognition sensor module for detecting a user's face, a pupil recognition sensor module for detecting a user's pupil, an acceleration sensor module and a geomagnetic sensor module for determining the movement of the display device, a proximity sensor module and an infrared sensor module for detecting whether the front surface of the display device 10 is close, and an illuminance sensor module for measuring a degree of external brightness, or the like.

The sub-region SBA may be a region protruding from one side of the main non-display area MNDA of the main region MA in the second direction DR2.

The display driving circuit 200 may be mounted on the sub-region SBA, and the circuit board 300 may be attached to the sub-region SBA.

The display driving circuit 200 may be provided as an integrated circuit (IC) and mounted on the second sub-region SB2 by a chip on glass (COG) method, a chip on plastic (COP) method, or an ultrasonic bonding method, but the present disclosure is not limited thereto. For example, the display driving circuit 200 may be mounted on the circuit board 300 by a chip on film (COF) method, or may be embedded as a part of the display panel 100.

The circuit board 300 may be attached to and electrically connected to signal pads SPD (see FIG. 4) of the second sub-region SB2 using a low-resistance high-reliability material such as SAP or an anisotropic conductive film.

The circuit board 300 may supply digital video data, timing signals, and driving voltages to the pixel drivers PXD (see FIG. 6) disposed in the display area DPA or the display driving circuit 200 of the sub-region SBA.

The circuit board 300 may be a flexible printed circuit board, a printed circuit board, or a flexible film such as a chip on film.

Figure 2:
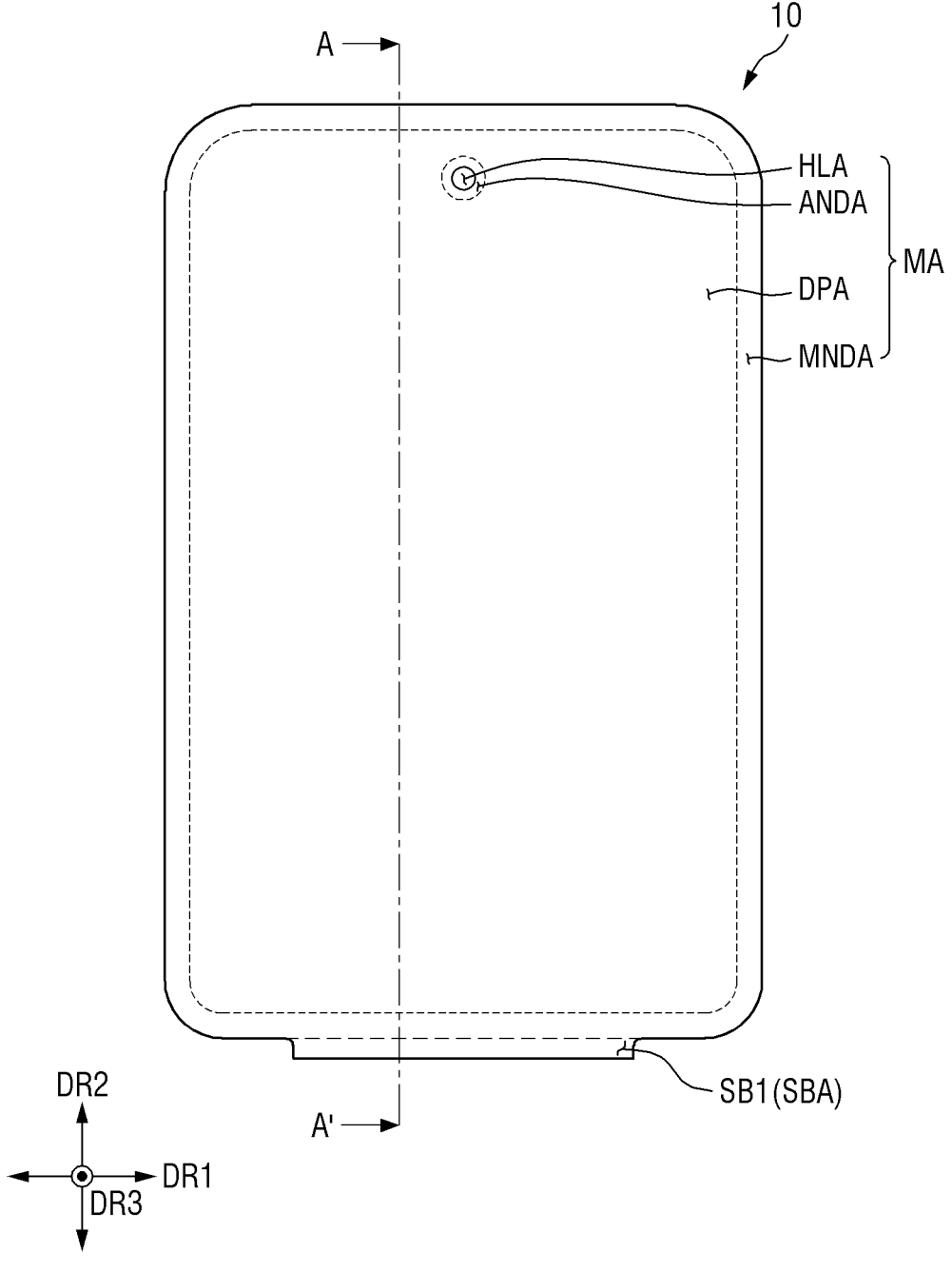
FIG. 2 is a plan view illustrating the display device of FIG. 1.
Figure 3:
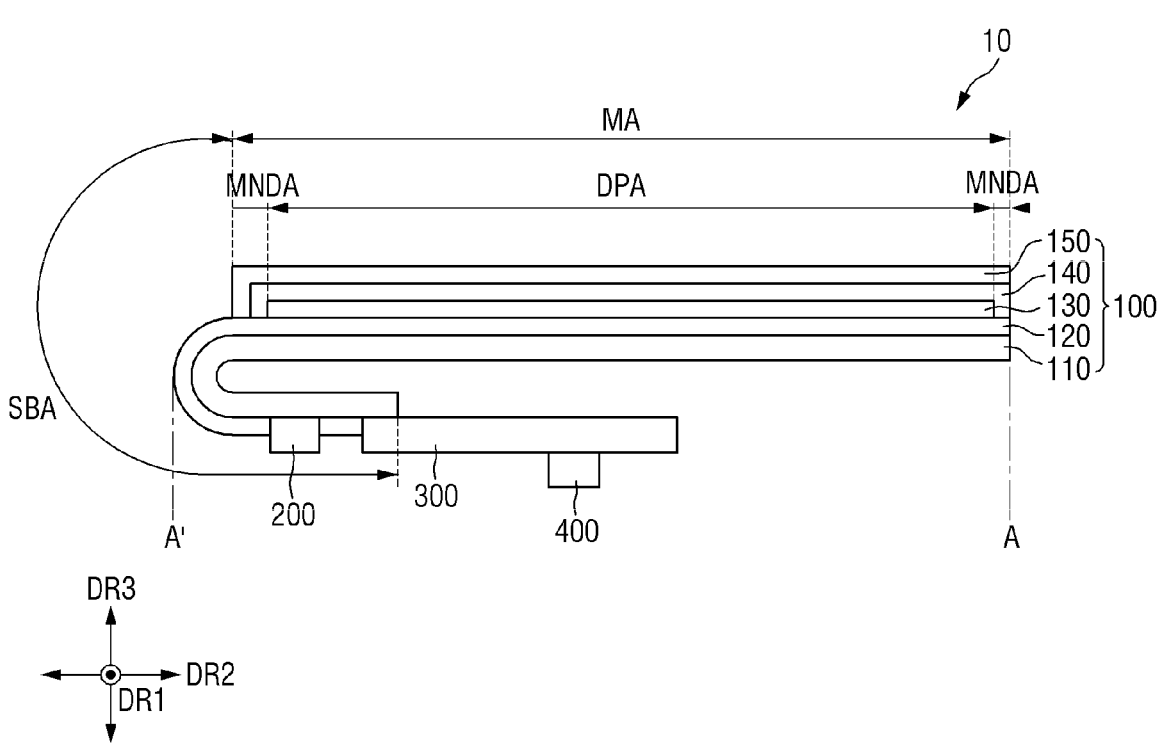
FIG. 3 is a cross-sectional view taken along line A-A' of FIG. 2.

FIG. 2 is a plan view illustrating the display device of FIG. 1. FIG. 3 is a cross-sectional view taken along line A-A' of FIG. 2.

Referring to FIG. 2, a part of the sub-region SBA may be bent. Accordingly, the display driving circuit 200 disposed in the sub-region SBA and the circuit board 300 attached to the sub-region SBA may be mounted on the rear surface of the display panel 100.

Referring to FIG. 3, the display panel 100 of the display device 10 includes a substrate 110, a circuit array layer 120 disposed on the substrate 110, a light emitting array layer 130 disposed on the circuit array layer 120, and an encapsulation layer 140 disposed on the light emitting array layer 130.

The light emitting array layer 130 includes light emitting elements LE (see FIGS. 6 and 11) respectively corresponding to the emission areas EA.

The display device 10 may further include the through portion THM disposed in the hole area HLA and penetrating the substrate 110, the circuit array layer 120, the light emitting array layer 130, and the encapsulation layer 140.

The substrate 110 includes the main region MA and the sub-region SBA, and the main region MA includes the display area DPA, the main non-display area MNDA, the hole area HLA, and the additional non-display area ANDA.

The substrate 110 may be formed of an insulating material such as a polymer resin. For example, the substrate 110 may be formed of polyimide. The substrate 110 may be a flexible substrate which can be bent, folded or rolled.

Figure 12:
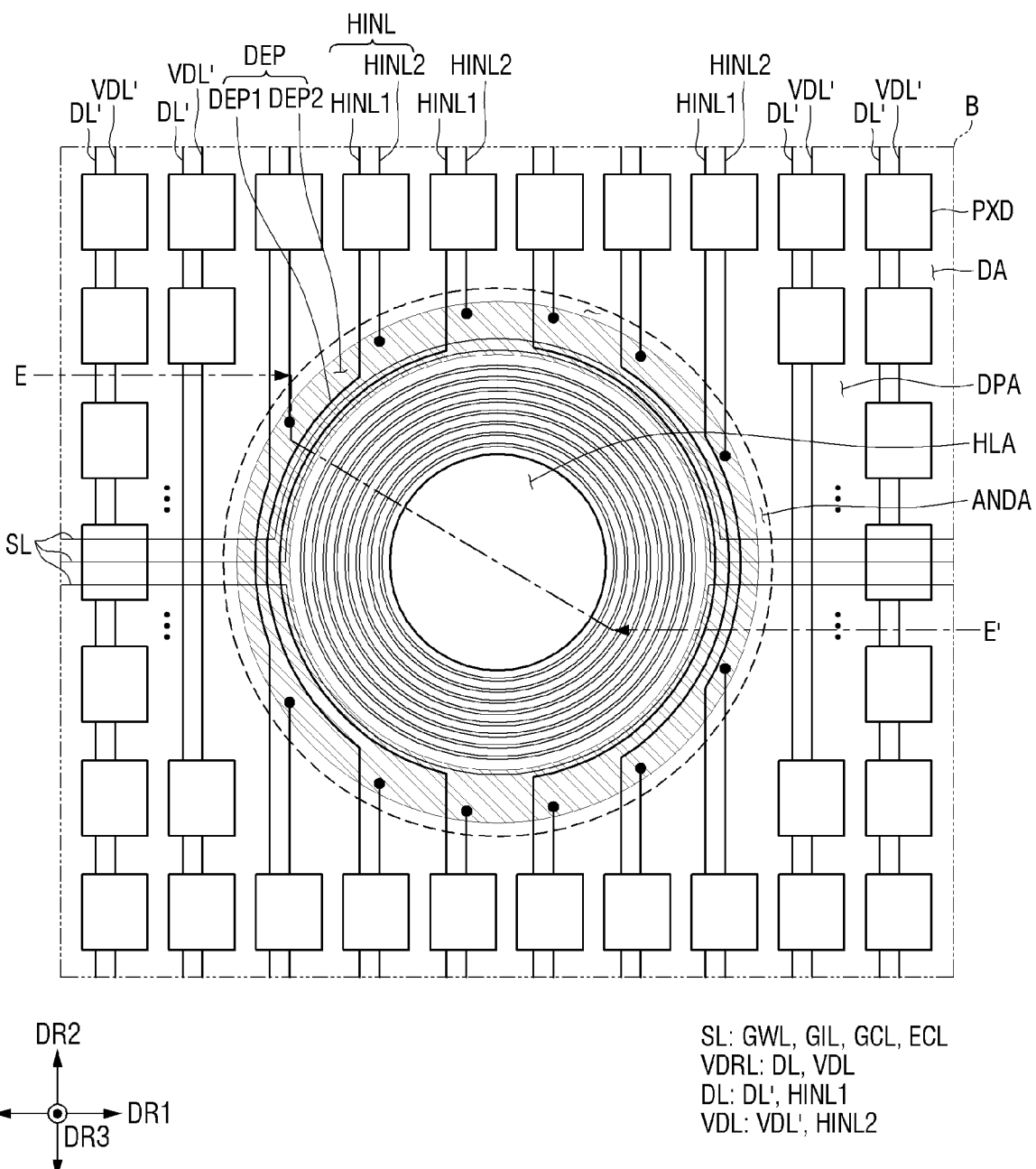
FIG. 12 is a layout diagram showing portion C of FIG. 4 according to a first embodiment.

The circuit array layer 120 includes the pixel drivers PXD (see FIG. 6) electrically connected to the light emitting elements LE respectively corresponding to the emission areas EA, and second direction lines VDRL (see FIG. 12)

spaced apart from each other in a first direction DR1, extending in a second direction DR2 intersecting the first direction DR1, formed of the line conductive layer, and electrically connected to the pixel drivers PXD.

The second direction lines VDRL may include data lines DL (see FIG. 6) transmitting a data signal Vdata (see FIG. 6) to the pixel drivers PXD, and first power lines VDL (see FIG. 6) transmitting a first power ELVDD (see FIG. 6) to the pixel drivers PXD.

The light emitting array layer 130 may be disposed in the display area DPA on the circuit array layer 120. The light emitting array layer 130 includes the light emitting elements LE. Each of the light emitting elements LE may include an anode electrode 131 (see FIG. 11) and a cathode electrode 134 (see FIG. 11) facing each other, and a light emitting layer 133 (see FIG. 11) interposed between the anode electrode 131 and the cathode electrode 134.

The encapsulation layer 140 may be disposed on the light emitting array layer 130 and may be in contact with the circuit array layer 120 in the main non-display area MNDA and the additional non-display area ANDA.

The encapsulation layer 140 is used to protect the light emitting array layer 130 from permeation of oxygen or moisture. The encapsulation layer 140 may have a structure in which at least one inorganic layer and at least one organic layer are stacked.

In addition, the display device 10 may further include a sensor electrode layer 150 disposed on the encapsulation layer 140.

The sensor electrode layer 150 may be disposed in the main region MA on the encapsulation layer 140. The sensor electrode layer 150 may include touch electrodes for sensing a touch of a person or an object.

The display device 10 may further include a cover window (not shown) disposed on the sensor electrode layer 150. The cover window may be attached to the sensor electrode layer 150 by a transparent adhesive member such as an optically clear adhesive (OCA) film or an optically clear resin (OCR). The cover window may be made of an inorganic material such as glass, or an organic material such as plastic or a polymer material. Due to the cover window, the sensor electrode layer 150, the encapsulation layer 140, the light emitting array layer 130, and the circuit array layer 120 may be protected from electrical and physical impact on the display surface.

In addition, the display device 10 may further include an anti-reflection member (not shown) disposed between the sensor electrode layer 150 and the cover window. The anti-reflection member may be a polarizing film or a color filter. The anti-reflection member blocks external light reflected from the sensor electrode layer 150, the encapsulation layer 140, the light emitting array layer 130, the circuit array layer 120, and the interfaces thereof, so that it is possible to prevent a decrease in visibility of an image in the display device 10.

The display device 10 may further include a touch driving circuit 400 for driving the sensor electrode layer 150.

The touch driving circuit 400 may be provided as an integrated circuit (IC). The touch driving circuit 400 may be electrically connected to the sensor electrode layer 150 while being mounted on the circuit board 300.

Alternatively, similarly to the display driving circuit 200, the touch driving circuit 400 may be mounted on the sub-region SBA of the substrate 110.

The touch driving circuit 400 may apply a touch driving signal to a plurality of driving electrodes provided on the sensor electrode layer 150, receive a touch sensing signal of each of a plurality of touch nodes through the plurality of sensing electrodes, and sense a charge change amount of mutual capacitance based on the touch sensing signal.

That is, the touch driving circuit 400 may determine whether the user's touch occurs, whether the user is proximate, and the like, according to the touch sensing signals of each of the plurality of touch nodes. The user's touch indicates direct contact of an object such as a user's finger or a pen with the front surface of the display device 10. The proximity of the user indicates that an object such as a user's finger or a pen is positioned away from the front surface of the display device 10, such as hovering.

Figure 4:
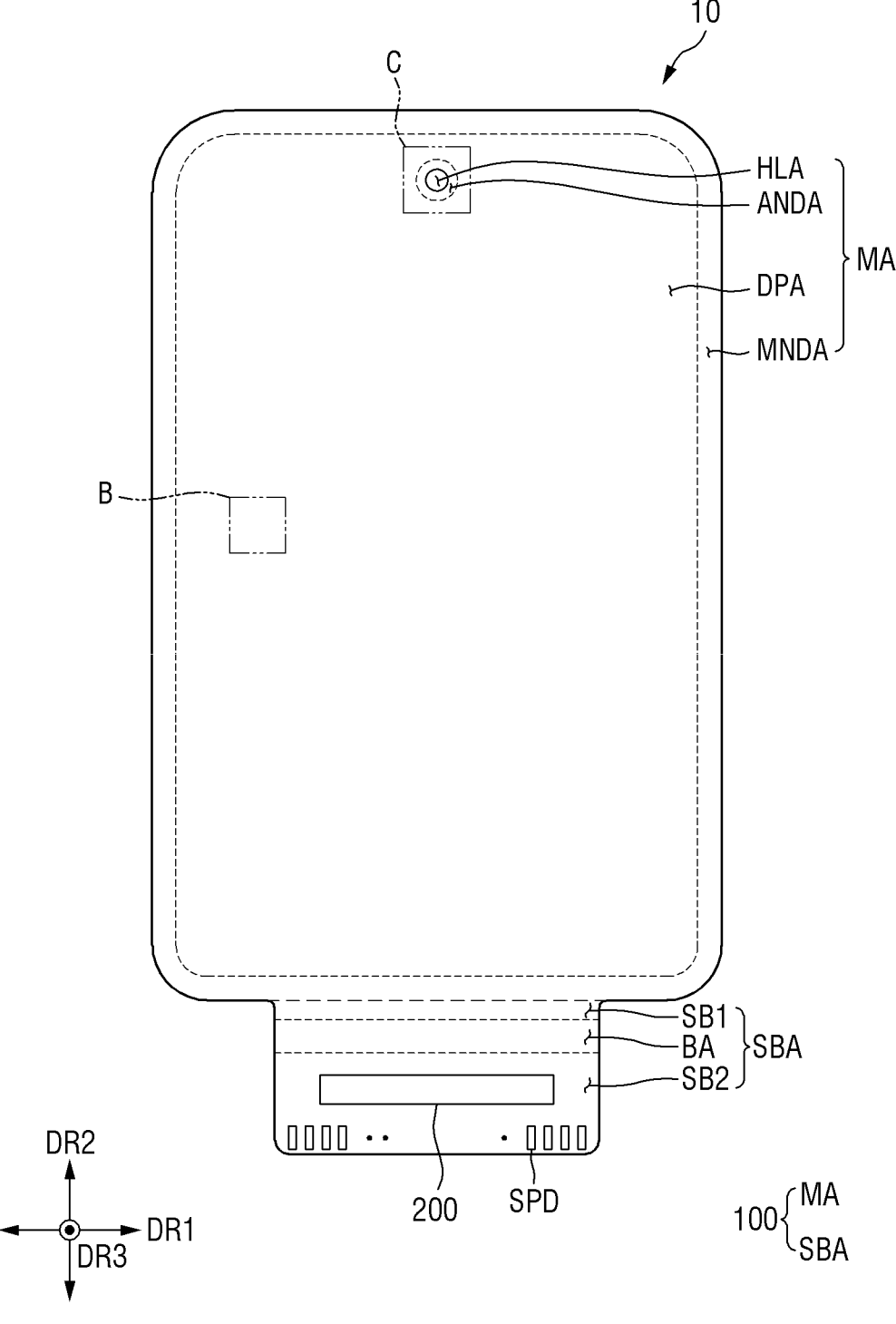
FIG. 4 is a plan view illustrating a main region and a sub-region of the display device of FIG. 1.

FIG. 4 is a plan view illustrating a main region and a sub-region of the display device of FIG. 1.

The display device 10 may include the main region MA including the display area DPA in which an image is displayed, and the sub-region SBA protruding from one side of the main region MA.

The main region MA includes the display area DPA in which the emission areas EA (see FIG. 5) are arranged, the main non-display area MNDA disposed around the display area DPA, the hole area HLA surrounded by the display area DPA, and the additional non-display area ANDA between the hole area HLA and the display area DPA.

The display area PDA may, in plan view, be formed in a rectangular shape having short sides in a first direction DR1 and long sides in a second direction DR2 crossing the first direction DR1. The corner where the short side in the first direction DR1 and the long side in the second direction DR2 meet may be rounded to have a predetermined curvature or may be right-angled. The planar shape of the display area DPA is not limited to the rectangular shape, and may be formed in another polygonal shape, a circular shape or an elliptical shape.

The display area DPA may occupy most of the main region MA. The display area DPA may be disposed at the center of the main region MA.

The main non-display area MNDA may be adjacent to the display area DPA and may be disposed outside the edge of the display area DPA. That is, the main non-display area MNDA may be an area outside the display area DPA. The main non-display area MNDA may be disposed to surround the periphery of display area DPA. The main non-display area MNDA may be an edge area of the main region MA.

The sub-region SBA may protrude from one side of the main region MA in the second direction DR2. The length of the sub-region SBA in the second direction DR2 may be less than the length of the main region MA in the second direction DR2. The length of the sub-region SBA in the first direction DR1 may be substantially equal to or less than the length of the main region MA in the first direction DR1.

The sub-region SBA may include a bending area BA that is deformed to be bent, and a first sub-region SB1 and a second sub-region SB2 that are in contact with both sides of the bending area BA.

The first sub-region SB1 is disposed between the main region MA and the bending area BA. One side of the first sub-region SB1 may be in contact with the main non-display area MNDA of the main region MA, and the other side of the first sub-region SB1 may be in contact with the bending area BA.

The second sub-region SB2 is spaced apart from the main region MA with the bending area BA interposed therebetween, and is disposed on the rear surface of the display panel 100 by the bending area BA deformed to be bent. That is, the second sub-region SB2 may overlap the main region MA in a thickness direction DR3 of the display panel 100 due to the bending region BA deformed to be bent.

One side of the second sub-region SB2 may be in contact with the bending area BA. The other side of the second sub-region SB2 may be in contact with a part of the edge of the substrate 110 (see FIG. 3).

Signal pads SPD and the display driving circuit 200 may be disposed in the second sub-region SB2.

The display driving circuit 200 may generate signals and voltages for driving the pixel drivers PXD of the display area DPA.

The circuit board 300 may be attached to and electrically connected to the signal pad SPD of the second sub-region SB2.

The hole area HLA may be disposed adjacent to the edge of the display area DPA.

Although FIGS. 1, 2, and 4 illustrate one hole area HLA formed in a circular shape, the shape of the hole area HLA according to one embodiment is not limited to a circular shape, and may be a polygonal shape such as a triangular shape and a quadrilateral shape, or an elliptical shape. Further, the display device 10 according to one embodiment may include two or more hole areas HLA.

The additional non-display area ANDA which is a separation region disposed between the hole area HLA and the display area DPA may be disposed outside the edge of the hole area HLA. That is, the additional non-display area ANDA is an area outside the hole area HLA, and may be disposed to surround the periphery of the hole area HLA.

The additional non-display area ANDA may have a shape similar to that of the hole area HLA, but the present disclosure is not limited thereto, and the additional non-display area ANDA according to one embodiment may have a shape different from that of the hole area HLA.

Figure 5:
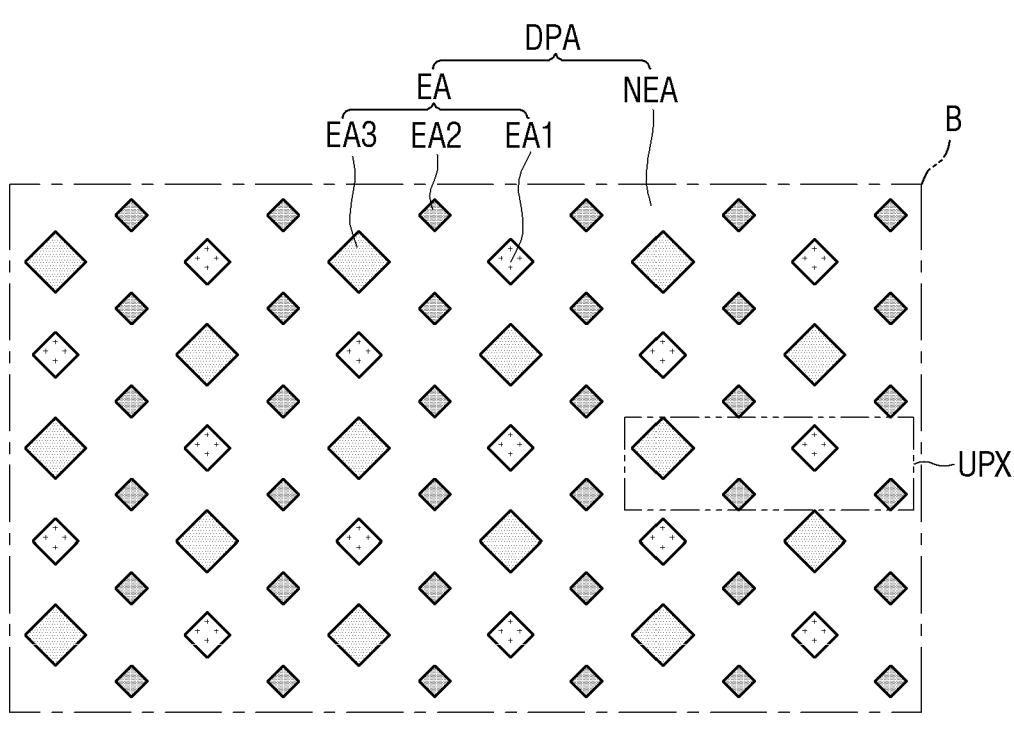
FIG. 5 is a layout diagram illustrating an example of emission areas arranged in portion B of FIG. 4.
Figure 5:
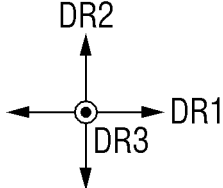

FIG. 5 is a layout diagram illustrating an example of emission areas arranged in portion B of FIG. 4.

Referring to FIG. 5, the display area DPA may include the emission areas EA and a non-emission area NEA which is a separation region disposed between the emission areas EA.

Two emission areas EA disposed adjacent to each other among the emission areas EA may be adjacent in the first direction DR1 or the second direction DR2.

Each of the emission areas EA may be a unit driven individually to display light of any one of two or more different colors with a predetermined luminance.

For example, the emission areas EA may include a first emission area EA1 emitting light of a first color having a predetermined wavelength band, a second emission area EA2 emitting light of a second color having a wavelength band lower than that of the first color, and a third emission area EA3 emitting light of a third color having a wavelength band lower than that of the second color.

For example, the first color may be red having a wavelength band of approximately 600 nm to approximately 750 nm, the second color may be green having a wavelength band of approximately 480 nm to approximately 560 nm, and the third color may be blue having a wavelength band of approximately 370 nm to approximately 460 nm. However, this is only an example, and the wavelength bands of the first color, the second color, and the third color according to one embodiment of this specification are not limited thereto.

Since the emission areas EA include the first emission area EA1, the second emission area EA2, and the third emission area EA3, unit pixels UPX, each including a combination of the first emission area EA1, the second emission area EA2, and the third emission area EA3 adjacent to each other among the emission areas EA, may be provided.

Each of the unit pixels UPX may be a unit for individually displaying various colors including white. That is, lights of various colors displayed by the unit pixels UPX may be implemented as a mixture of lights emitted from two or more emission areas EA included in each unit pixel UPX.

FIG. 5 illustrates a case in which the first emission area EA1 and the third emission area EA3 are alternately disposed in the first direction DR1 and the second direction DR2, and the second emission areas EA2 arranged side by side are disposed adjacent to the first emission area EA1 and the third emission area EA3 in a diagonal direction intersecting the first direction DR1 and the second direction DR2. In this case, each of the unit pixels UPX may include one first emission area EA1 and one third emission area EA3 adjacent to each other in the first direction DR1 or the second direction DR2, and two second emission areas EA2 adjacent thereto in a diagonal direction.

However, this is only an example, and the arrangement pattern of the emission areas EA according to one embodiment is not limited to that illustrated in FIG. 5.

Figure 6:
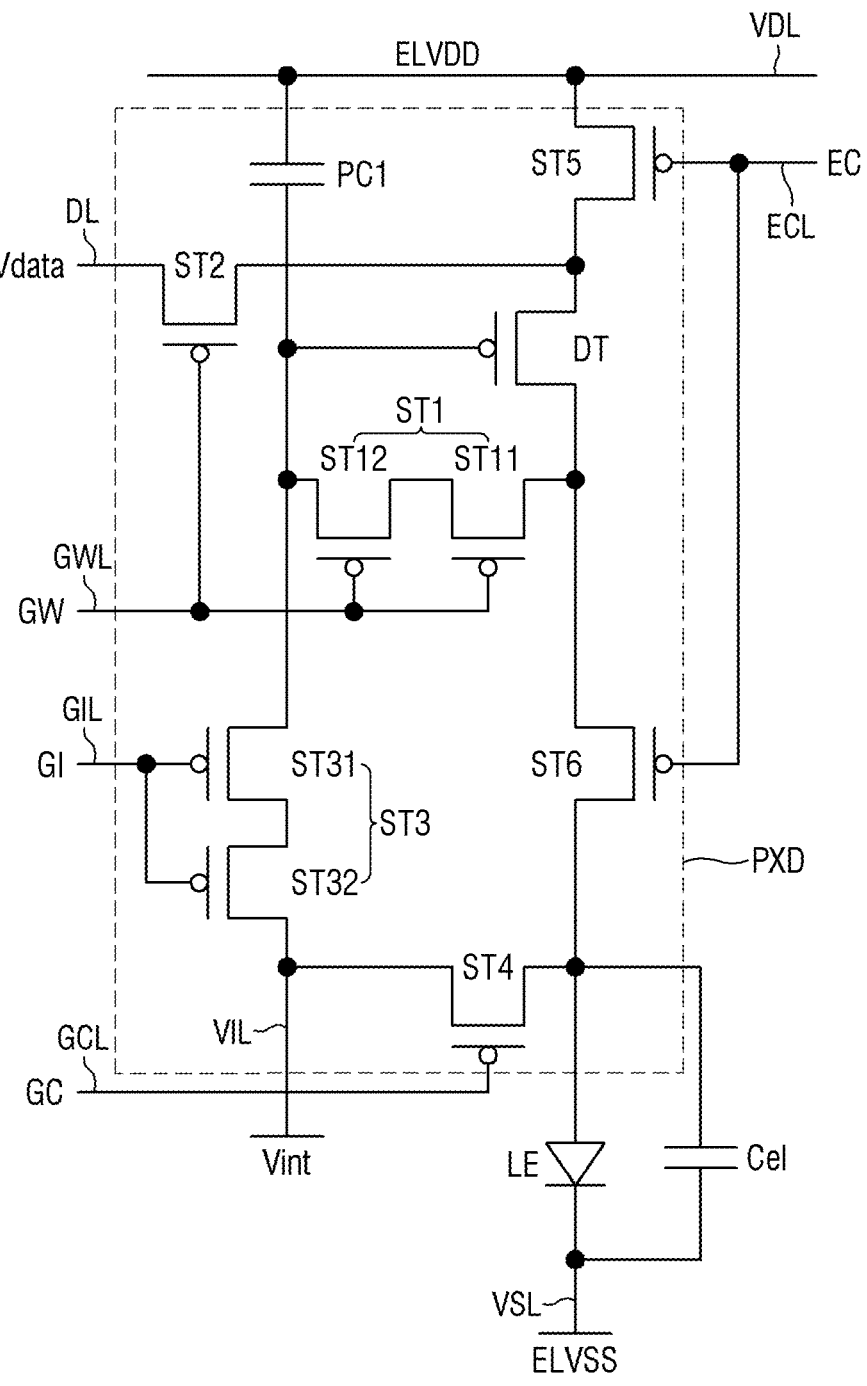
FIG. 6 is an equivalent circuit diagram illustrating a pixel driver according to a first embodiment.

FIG. 6 is an equivalent circuit diagram illustrating a pixel driver according to a first embodiment.

As described above, the circuit array layer 120 of the display device 10 may include the pixel drivers PXD respectively electrically connected to the light emitting elements LE respectively corresponding to the emission areas EA.

The circuit array layer 120 may include the data lines DL transmitting the data signal Vdata to the pixel drivers PXD, the first power lines VDL transmitting the first power ELVDD to the pixel drivers PXD, and an initialization voltage line VIL transmitting an initialization voltage Vint to the pixel drivers PXD. Here, the data lines DL and the first power lines VDL may be the second direction lines VDRL formed of the line conductive layer and extending in the second direction DR2 (see FIG. 7).

Figure 7:
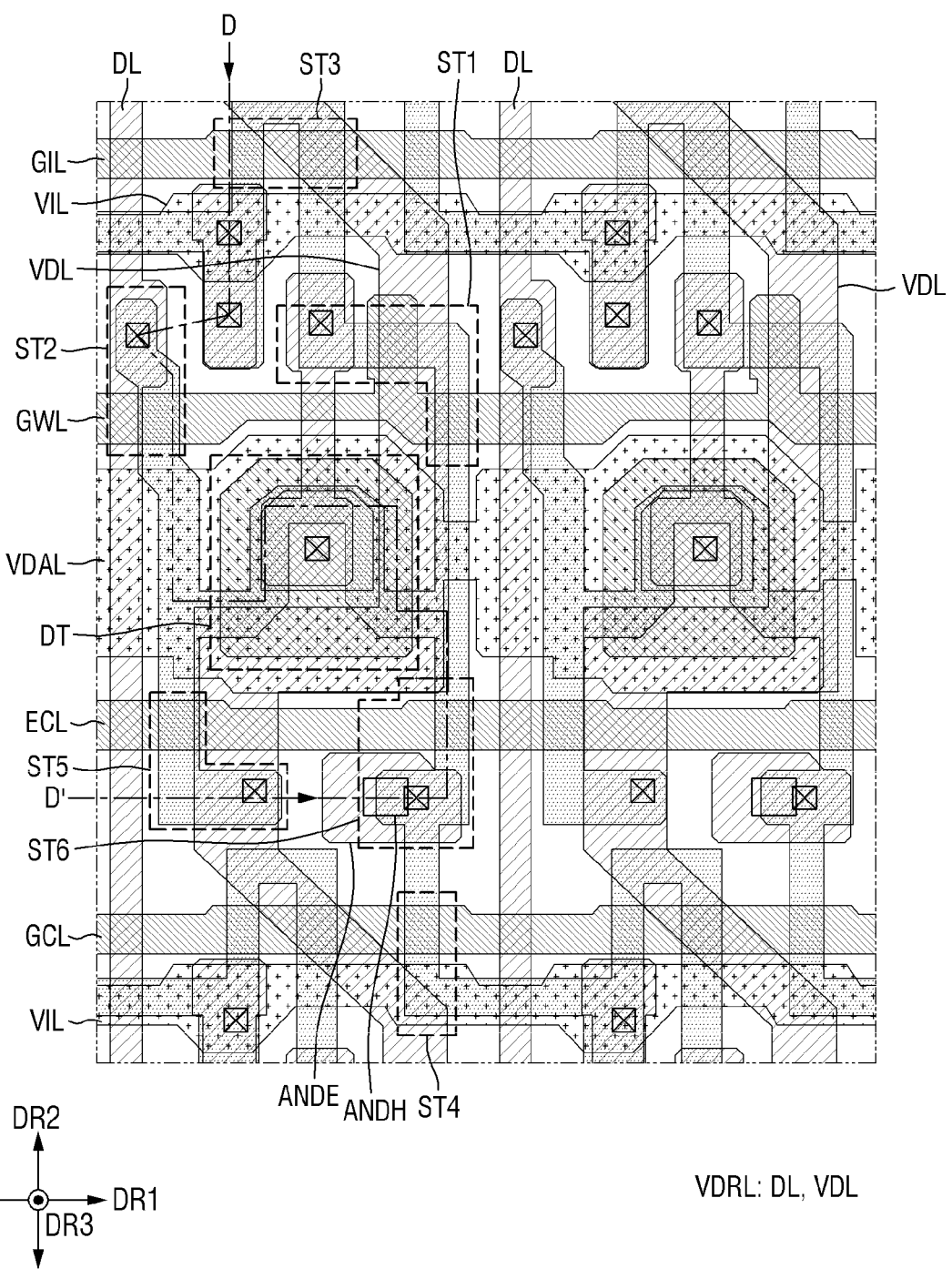
FIG. 7 is a plan view illustrating two pixel drivers according to the first embodiment.

The initialization voltage line VIL may extend in the first direction DR1 (see FIG. 7).

The circuit array layer 120 may include a scan write line GWL transmitting a scan write signal GW to the pixel drivers PXD, a scan initialization line GIL transmitting a scan initialization signal GI to the pixel drivers PXD, an emission control line ECL transmitting an emission control signal EC to the pixel drivers PXD, and a gate control line GCL transmitting a gate control signal GC to the pixel drivers PXD.

One of the pixel drivers PXD may include first to sixth transistors ST1 to ST6 and a driving transistor DT, which generates a driving current for driving the light emitting element LE electrically connected to the one pixel driver PXD, and at least one capacitor PC1.

The anode electrode of the light emitting element LE may be electrically connected to the pixel driver PXD, and the cathode electrode of the light emitting element LE may be electrically connected to a second power line VSL supplying a second driving power ELVSS having a voltage level lower than that of the first power ELVDD.

The light emitting element LE may be an organic light emitting diode having a light emitting layer made of an organic light emitting material. Alternatively, the light emitting element LE may be an inorganic light emitting element including a light emitting layer made of an inorganic semiconductor. Alternatively, the light emitting element LE may be a quantum dot light emitting element having a quantum dot light emitting layer. Alternatively, the light emitting element LE may be a micro light emitting diode.

A capacitor Cel connected in parallel with the light emitting element LE provides a parasitic capacitance between the anode electrode and the cathode electrode.

The driving transistor DT is connected in series to the light emitting element LE between the first power line VDL and the second power line VSL. That is, the first electrode (e.g., source electrode) of the driving transistor DT may be connected to the first power line VDL through the fifth transistor ST5, and the second electrode (e.g., the drain electrode) of the driving transistor DT may be connected to the anode electrode of the light emitting element LE through the sixth transistor ST6.

Further, the first electrode of the driving transistor DT may be connected to the data line DL through the second transistor T2.

The gate electrode of the driving transistor DT may be connected to the first power line VDL through the first capacitor PC1. That is, the first capacitor PC1 may be connected between the gate electrode of the driving transistor DT and the first power line VDL.

Accordingly, the potential of the gate electrode of the driving transistor DT may be maintained by the first power ELVDD of the first power line VDL.

Accordingly, when the data signal Vdata of the data line DL is transmitted to the first electrode of the driving transistor DT through the turned-on second transistor T2, the voltage difference corresponding to the data signal Vdata and the first power ELVDD may be generated between the gate electrode of the driving transistor DT and the first electrodes of the driving transistor DT.

In this case, when the voltage difference between the gate electrode of the driving transistor DT and the first electrode of the driving transistor DT, that is, the gate-source voltage difference is greater than or equal to a threshold voltage, the driving transistor DT may be turned on.

Then, when the fifth transistor ST5 and the sixth transistor T6 are turned on, the driving transistor DT may generate the drain-source current corresponding to the data signal Vdata. The drain-source current of the driving transistor DT may be supplied as the driving current of the light emitting element LE.

Accordingly, the light emitting element LE may emit light having a luminance corresponding to the data signal Vdata.

The second transistor ST2 may be connected between the first electrode of the driving transistor DT and the data line DL.

The first transistor ST1 may be connected between the gate electrode of the driving transistor DT and the second electrode of the driving transistor DT.

The first transistor ST1 may include a plurality of sub-transistors connected in series. For example, the first transistor ST1 may include a first sub-transistor ST11 and a second sub-transistor ST12.

The first electrode of the first sub-transistor ST11 may be connected to the gate electrode of the driving transistor DT, the second electrode of the first sub-transistor ST11 may be connected to the first electrode of the second sub-transistor ST12, and the second electrode of the second sub-transistor ST12 may be connected to the second electrode of the driving transistor DT.

In this way, it is possible to prevent the potential of the gate electrode of the driving transistor DT from changing due to the leakage current caused by the first transistor ST1 that is not turned on.

The gate electrode of each of the second transistor ST2, the first sub-transistor ST11, and the second sub-transistor ST12 may be connected to the scan write line GWL.

Accordingly, when the scan write signal GW is transmitted through the scan write line GWL, the second transistor ST2, the first sub-transistor ST11, and the second sub-transistor ST12 may be turned on.

In this case, the data signal Vdata may be transmitted to the first electrode of the driving transistor DT through the turned-on second transistor ST2.

Further, the gate electrode of the driving transistor DT and the second electrode of the driving transistor DT may have the same potential through the turned-on first sub-transistor ST11 and the turned-on second sub-transistor ST12.

Accordingly, the driving transistor DT may be turned on.

The third transistor ST3 may be connected between the gate electrode of the driving transistor DT and an initialization voltage line VIL.

The third transistor ST3 may include a plurality of sub-transistors connected in series. For example, the third transistor ST3 may include a third sub-transistor ST31 and a fourth sub-transistor ST32.

The first electrode of the third sub-transistor ST31 may be connected to the gate electrode of the driving transistor DT, the second electrode of the third sub-transistor ST31 may be connected to the first electrode of the fourth sub-transistor ST32, and the second electrode of the fourth sub-transistor ST32 may be connected to the initialization voltage line VIL.

In this way, it is possible to prevent the potential of the gate electrode of the driving transistor DT from changing due to the leakage current caused by the third transistor ST3 that is not turned on.

The gate electrode of each of the third sub-transistor ST31 and the fourth sub-transistor ST32 may be connected to the scan initialization line GIL.

Accordingly, when the scan initialization signal GI is transmitted through the scan initialization line GIL, the third sub-transistor ST31 and the fourth sub-transistor ST32 are turned on and, thus, the potential of the gate electrode of the driving transistor DT may be initialized to the initialization voltage Vint of the initialization voltage line VIL.

The fourth transistor ST4 may be connected between the anode electrode of the light emitting element LE and the initialization voltage line VIL.

The gate electrode of the fourth transistor ST4 may be connected to the gate control line GCL.

Accordingly, when the gate control signal GC is transmitted through the gate control line GCL, the fourth transistor ST4 may be turned on.

In this case, the potential of the anode electrode of the light emitting element LE may be initialized to the initialization voltage Vint of the initialization voltage line VIL through the turned-on fourth transistor ST4.

Accordingly, it is possible to prevent the light emitting element LE from being driven by the current remaining in the anode electrode.

The fifth transistor ST5 may be connected between the first electrode of the driving transistor DT and the first power line VDL.

The sixth transistor ST6 may be connected between the second electrode of the driving transistor DT and the anode electrode of the light emitting element LE.

The gate electrode of each of the fifth transistor ST5 and the sixth transistor ST6 may be connected to the emission control line ECL.

Accordingly, when the emission control signal EC is transmitted through the emission control line ECL, the fifth transistor ST5 and the sixth transistor ST6 are turned on and, thus, the drain-source current of the driving transistor DT may be supplied as the driving current of the light emitting element LE.

Although FIG. 6 illustrates a case in which the driving transistor DT and the first to sixth transistors ST1 to ST6 included in the pixel driver PXD are all N-type metal oxide semiconductor field effect transistors (MOSFET), it should be noted that the pixel driver PXD of one embodiment is not limited to that illustrated in FIG. 6. That is, at least one of the driving transistor DT and the first to sixth transistors ST1 to ST6 included in the pixel driver PXD according to one embodiment may be a P-type MOSFET.

Figure 8:
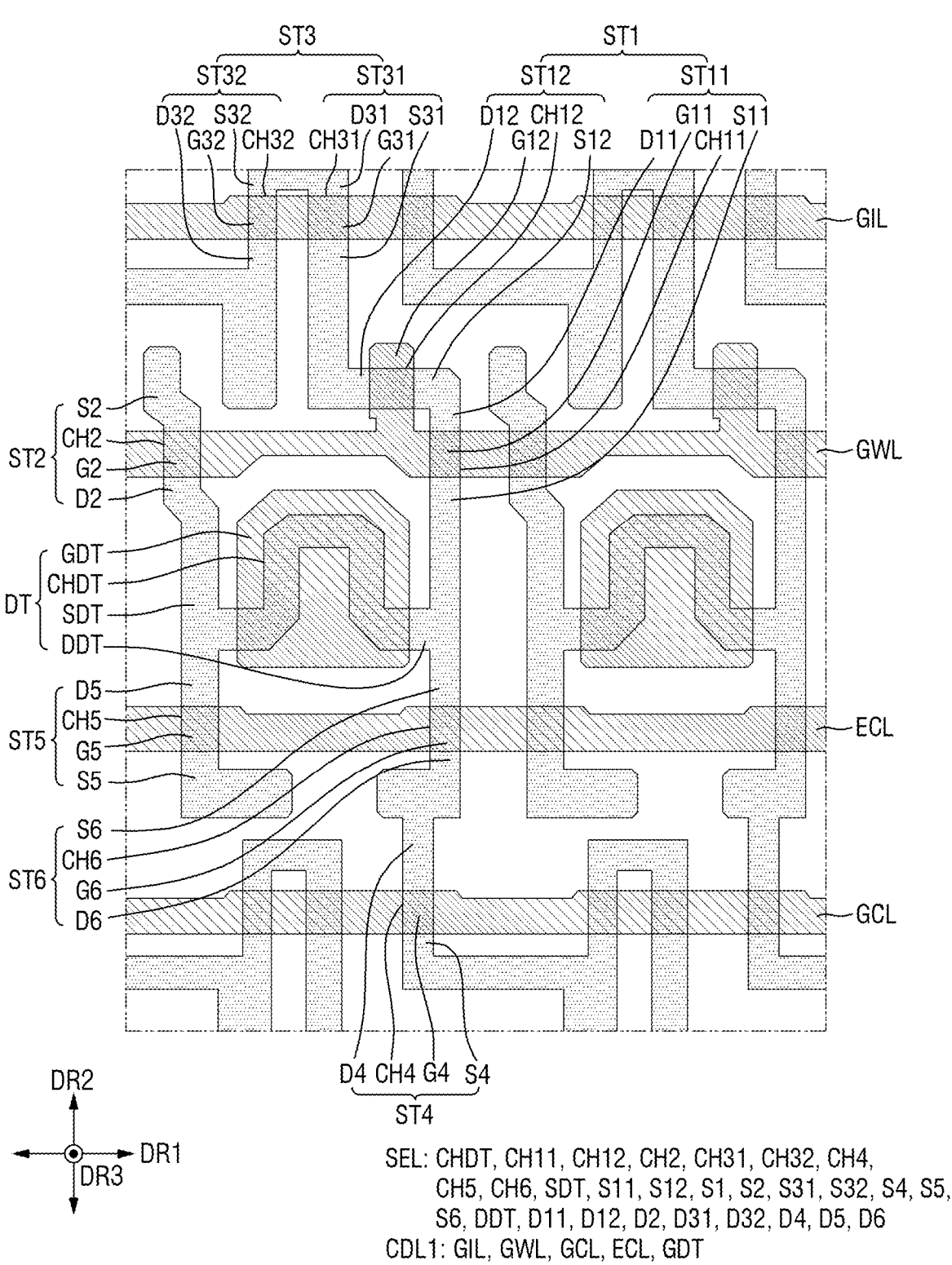
FIG. 8 is a plan view illustrating a semiconductor layer and a first conductive layer of FIG. 7.
Figure 9:
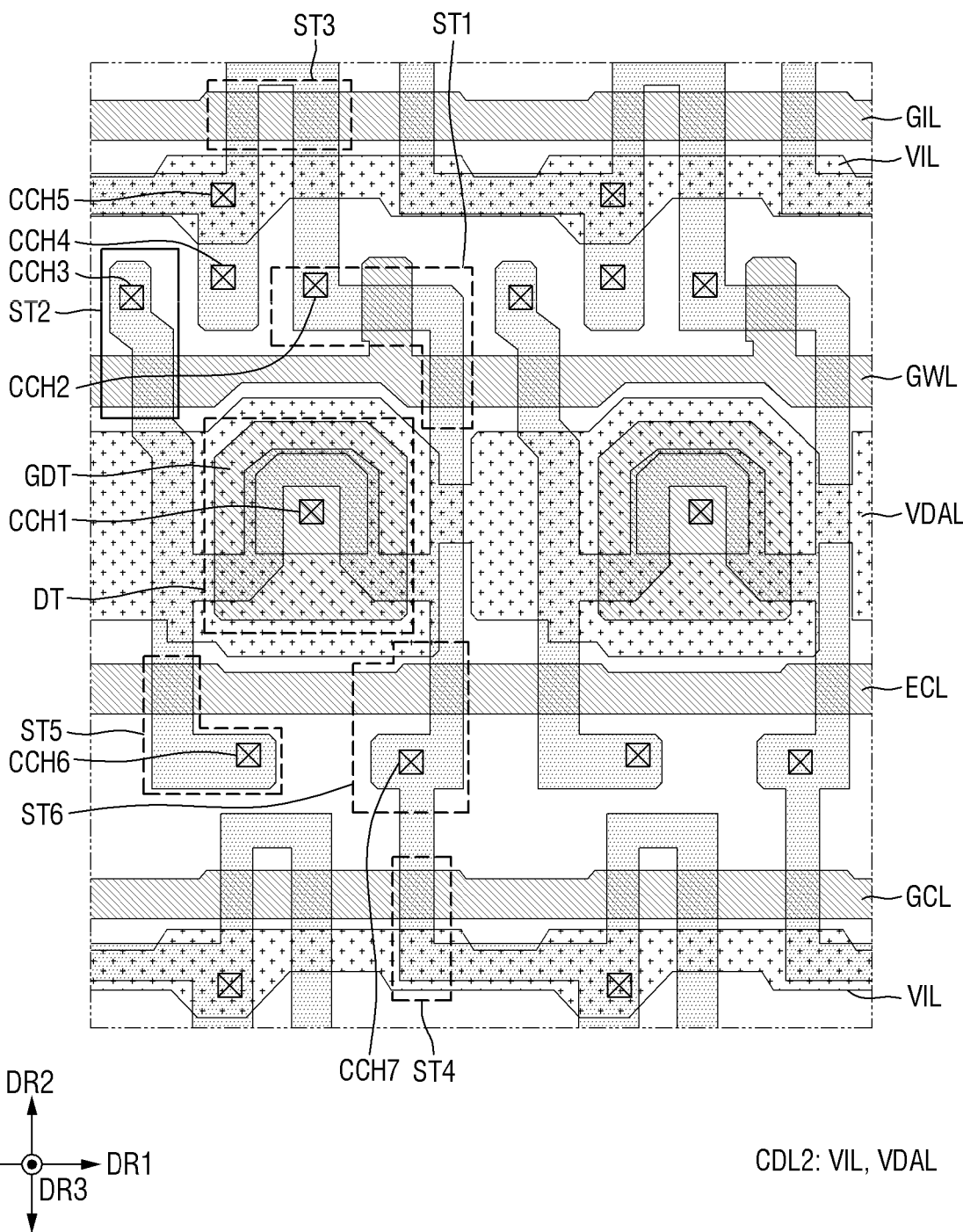
FIG. 9 is a plan view illustrating the semiconductor layer, the first conductive layer, and a second conductive layer of FIG. 7.
Figure 10:
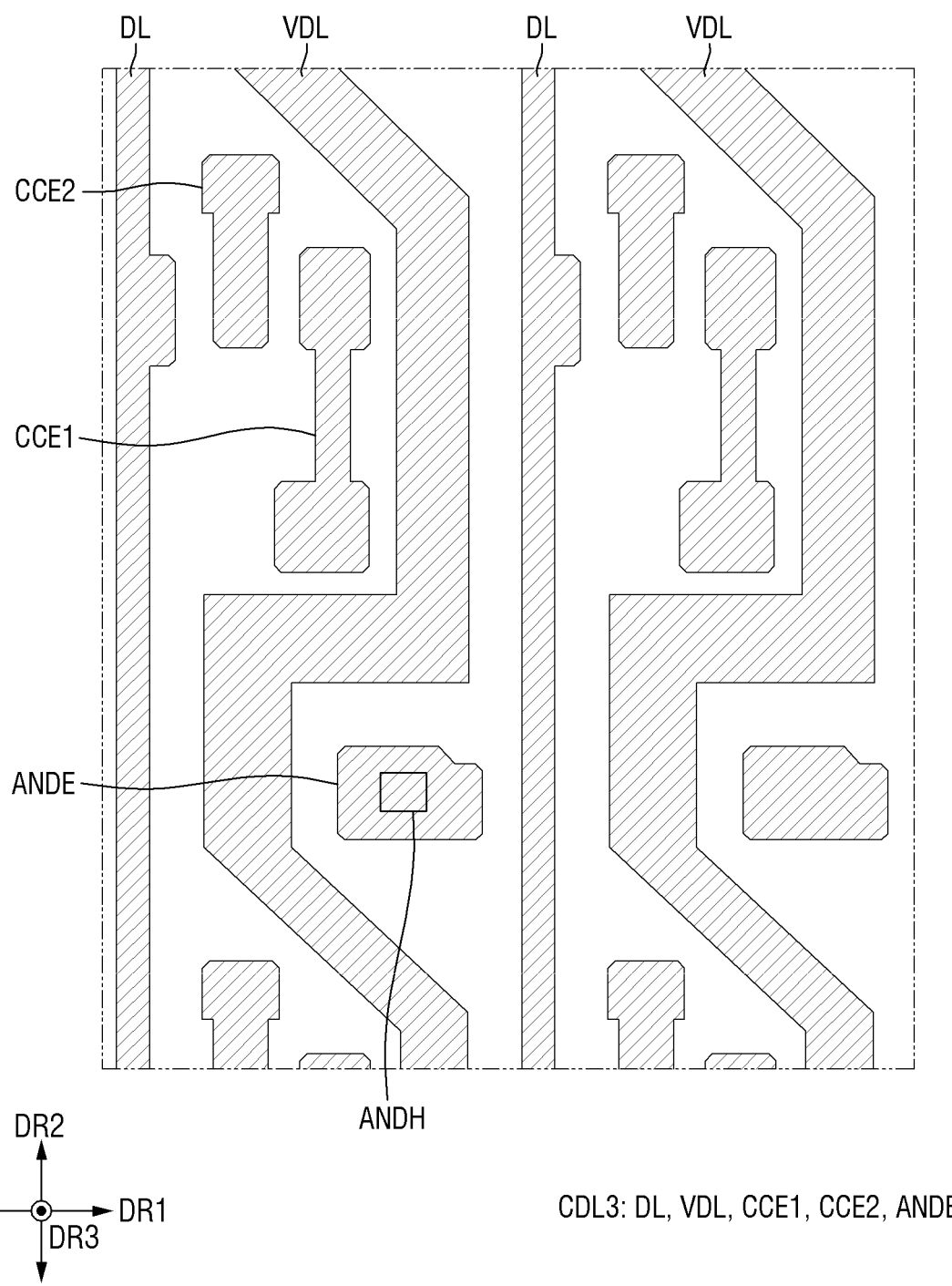
FIG. 10 is a plan view illustrating a third conductive layer of FIG. 7.
Figure 11:
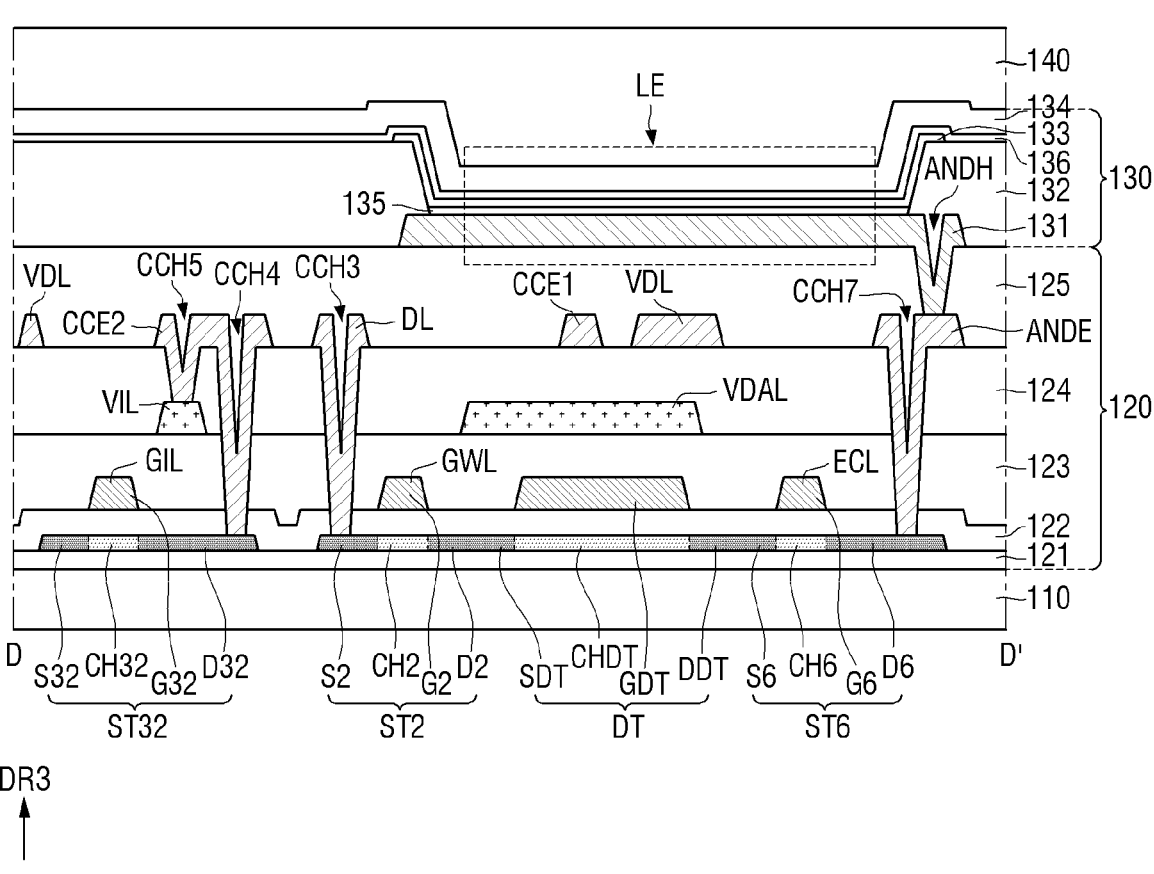
FIG. 11 is a cross-sectional view taken along line D-D' of FIG. 7.

FIG. 7 is a plan view illustrating two pixel drivers according to the first embodiment. FIG. 8 is a plan view illustrating a semiconductor layer and a first conductive layer of FIG. 7. FIG. 9 is a plan view illustrating the semiconductor layer, the first conductive layer, and a second conductive layer of FIG. 7. FIG. 10 is a plan view illustrating a third conductive layer of FIG. 7. FIG. 11 is a cross-sectional view taken along line D-D' of FIG. 7.

Referring to FIG. 7, the pixel driver PXD according to one embodiment may include the driving transistor DT and the first to sixth transistors ST1 to ST6.

The scan write line GWL, the scan initialization line GIL, the emission control line ECL, and the gate control line GCL of the circuit array layer 120 may be scan lines extending in the first direction DR1.

The initialization voltage line VIL may be formed of a conductive layer different from the scan write line GWL, the scan initialization line GIL, the emission control line ECL, and the gate control line GCL, and may extend in the first direction DR1.

The data line DL and the first power line VDL of the circuit array layer 120 may be the second direction lines VDRL, which extend in the second direction and which are formed of a conductive layer different from the scan write line GWL, the scan initialization line GIL, the emission control line ECL, and the gate control line GCL.

The circuit array layer 120 may further include a first power auxiliary line VDAL that is formed of the same conductive layer as the initialization voltage line VIL, extends in the first direction DR1, and is electrically connected to the first power line VDL.

Referring to FIG. 8, the semiconductor layer SEL may include a channel CHDT, a first electrode SDT, and a second electrode DDT of the driving transistor DT, and channels CH11, CH12, CH2, CH31, CH32, CH4, CH5, and CH6, first electrodes S11, S12, S2, S31, S32, S4, S5, and S6, and second electrodes D11, D12, D2, D31, D32, D4, D5, and D6 of the first to sixth transistors ST1 to ST6.

A first conductive layer CDL1 may include a gate electrode GDT of the driving transistor DT, the scan write line GWL, the scan initialization line GIL, the emission control line ECL, and the gate control line GCL. The scan write line GWL, the scan initialization line GIL, the emission control line ECL, and the gate control line GCL extend in the first direction DR1.

The semiconductor layer SEL may be made of any one of polysilicon, amorphous silicon, and an oxide semiconductor.

Parts of the semiconductor layer SEL that overlap the first conductive layer CDL1 (GDT, GWL, GIL, ECL, and GCL), that is, parts other than the channels CH11, CH12, CH2, CH31, CH32, CH4, CH5, and CH6 of the transistors DT and ST1 to ST6 may become conductive.

The first conductive layer CDL1 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The gate electrode G11 of the first sub-transistor ST11, the gate electrode G12 of the second sub-transistor ST12, and the gate electrode G2 of the second transistor ST2 may be different parts of the scan write line GWL.

The gate electrode G31 of the third sub-transistor ST31 and the gate electrode G32 of the fourth sub-transistor ST32 may be different parts of the scan initialization line GIL.

The gate electrode G4 of the fourth transistor ST4 may be a part of the gate control line GCL.

The gate electrode G5 of the fifth transistor ST5 and the gate electrode G6 of the sixth transistor ST6 may be different parts of the emission control line ECL.

The channel CHDT of the driving transistor DT overlaps the gate electrode GDT of the driving transistor DT, and first and second ends of the channel CHDT of the driving transistor DT are connected to the first electrode SDT of the driving transistor DT and the second electrode DDT of the driving transistor DT, respectively.

The first electrode SDT of the driving transistor DT may be connected to the second electrode D2 of the second transistor ST2 and the second electrode D5 of the fifth transistor ST5.

The second electrode DDT of the driving transistor DT may be connected to the first electrode S11 of the first sub-transistor ST11 and the first electrode S6 of the sixth transistor ST6.

The first transistor ST1 may include the first sub-transistor ST11 and the second sub-transistor ST12 connected in series.

The channel CH11 of the first sub-transistor ST11 overlaps the gate electrode G11 of the first sub-transistor ST11 that is a part of the scan write line GWL, and first and second ends of the channel CH11 of the first sub-transistor ST11 are connected to the first electrode S11 of the first sub-transistor ST11 and the second electrode D11 of the first sub-transistor ST11, respectively.

The second electrode D11 of the first sub-transistor ST11 may be connected to the first electrode S12 of the second sub-transistor ST12.

The channel CH12 of the second sub-transistor ST12 overlaps the gate electrode G12 of the second sub-transistor ST12 that is a part of the scan write line GWL, and first and second ends of the channel CH12 of the second sub-transistor ST12 are connected to the first electrode S12 of the second sub-transistor ST12 and the second electrode D12 of the second sub-transistor ST12, respectively.

The second electrode D12 of the second sub-transistor ST12 may be connected to the first electrode S31 of the third sub-transistor ST31.

The channel CH2 of the second transistor ST2 overlaps the gate electrode G2 of the second transistor ST2 that is a part of the scan write line GWL, and first and second ends of the channel CH2 of the second transistor ST2 are connected to the first electrode S2 of the second transistor ST2 and the second electrode D2 of the second transistor ST2, respectively.

The third transistor T3 may include a third sub-transistor T31 and a fourth sub-transistor T32 connected in series.

The channel CH31 of the third sub-transistor T31 overlaps the gate electrode G31 of the third sub-transistor T31 that is a part of the scan initialization line GIL, and first and second ends of the channel CH31 of the third sub-transistor T31 are connected to the source electrode S31 of the third sub-transistor T31 and the drain electrode D31 of the third sub-transistor T31, respectively.

The drain electrode D31 of the third sub-transistor T31 may be connected to the source electrode S32 of the fourth sub-transistor T32.

The channel CH32 of the fourth sub-transistor T32 overlaps the gate electrode G32 of the fourth sub-transistor T32 that is a part of the scan initialization line GIL, and first and second ends of the channel CH32 of the fourth sub-transistor T32 are connected to the source electrode S32 of the fourth sub-transistor T32 and the drain electrode D32 of the fourth sub-transistor T32, respectively.

The channel CH4 of the fourth transistor ST4 overlaps the gate electrode G4 of the fourth transistor ST4 that is a part of the gate control line GCL, and first and second ends of the channel CH4 of the fourth transistor ST4 are connected to the first electrode S4 of the fourth transistor ST4 and the second electrode D4 of the fourth transistor ST4, respectively.

The second electrode D4 of the fourth transistor ST4 may be connected to the second electrode D6 of the sixth transistor ST6.

The channel CH5 of the fifth transistor ST5 overlaps the gate electrode G5 of the fifth transistor ST5 that is a part of the emission control line ECL, and first and second ends of the channel CH5 of the fifth transistor ST5 are connected to the first electrode S5 of the fifth transistor ST5 and the second electrode D5 of the fifth transistor ST5, respectively.

The channel CH6 of the sixth transistor ST6 overlaps the gate electrode G6 of the sixth transistor ST6 that is a part of the emission control line ECL, and first and second ends of the channel CH6 of the sixth transistor ST6 are connected to the first electrode S6 of the sixth transistor ST6 and the second electrode D6 of the sixth transistor ST6, respectively.

Referring to FIG. 9, a second conductive layer CDL2 may include the initialization voltage line VIL and the first power auxiliary line VDAL. The initialization voltage line VIL and the first power auxiliary line VDAL may extend in the first direction DR1.

The second conductive layer CDL2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A part of the first power auxiliary line VDAL may overlap the gate electrode GDT of the driving transistor DT.

Accordingly, the first capacitor PC1 may be provided by the overlapping area between the first power auxiliary line VDAL and the gate electrode GDT of the driving transistor DT.

The circuit array layer 120 may include first to seventh connection contact holes CCH1 to CCH7 penetrating at least a first planarization layer 124 among a gate insulating layer 122 (see FIG. 11) covering the semiconductor layer SEL, an interlayer insulating layer 123 (see FIG. 11) covering the first conductive layer CDL1, and the first planarization layer 124 (see FIG. 11) covering the second conductive layer CDL2.

The first connection contact hole CCH1 overlaps the gate electrode GDT of the driving transistor DT.

The second connection contact hole CCH2 overlaps the contact points D12 and S31 (see FIG. 8) between the first transistor ST1 and the third transistor ST3.

The third connection contact hole CCH3 overlaps the first electrode S2 of the second transistor ST2.

The fourth connection contact hole CCH4 overlaps the second electrode D32 (see FIG. 8) of the fourth sub-transistor ST32 (see FIG. 8) of the third transistor ST3.

The fifth connection contact hole CCH5 overlaps the initialization voltage line VIL.

The sixth connection contact hole CCH6 overlaps the first electrode S5 (see FIG. 8) of the fifth transistor ST5.

The seventh connection contact hole CCH7 overlaps the contact points D4 and D6 (see FIG. 8) between the fourth transistor ST4 and the sixth transistor ST6.

Among the first to seventh connection contact holes CCH1 to CCH7, each of the second connection contact hole CCH2, the third connection contact hole CCH3, the fourth contact hole CCH4, the sixth connection contact hole CCH6, and the seventh connection contact hole CCH7 overlapping the semiconductor layer SEL may penetrate the first planarization layer 124, the interlayer insulating layer 123, and the gate insulating layer 122 to expose the semiconductor layer SEL (see FIG. 11).

The first connection contact hole CCH1 may penetrate the first planarization layer 124 and the interlayer insulating layer 123 to expose the gate electrode GDT of the driving transistor DT formed of the first conductive layer CDL1.

The fifth connection contact hole CCH5 may penetrate the first planarization layer 124 to expose the initialization voltage line VIL formed of the second conductive layer CDL2.

Referring to FIG. 10, a third conductive layer CDL3 may include the data lines DL, the first power lines VDL, a first connection electrode CCE1, a second connection electrode CCE2, and an anode connection electrode ANDE.

The third conductive layer CDL3 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The data line DL and the first power line VDL extend in the second direction DR2.

Referring to FIGS. 7, 9, and 10, the first connection electrode CCE1 may be electrically connected to the gate electrode GDT of the driving transistor DT through the first connection contact hole CCH1, and may be electrically connected to the first transistor ST1 and the third transistor ST3 through the second connection contact hole CCH2.

Accordingly, the gate electrode GDT of the driving transistor DT may be electrically connected to the first transistor ST1 and the third transistor ST3 through the first connection electrode CCE1, the first connection contact hole CCH1, and the second connection contact hole CCH2.

The data line DL may be electrically connected to the first electrode S2 of the second transistor ST2 through the third connection contact hole CCH3.

The second connection electrode CCE2 may be electrically connected to the second electrode D32 (see FIG. 8) of the fourth sub-transistor ST32 (see FIG. 8) through the fourth connection contact hole CCH4, and may be electrically connected to the initialization voltage line VIL through the fifth connection contact hole CCH5.

Accordingly, the second electrode D32 (see FIG. 8) of the fourth sub-transistor ST32 (see FIG. 8) may be electrically connected to the initialization voltage line VIL through the second connection electrode CCE2, the fourth connection contact hole CCH4, and the fifth connection contact hole CCH5.

The first power line VDL may be electrically connected to the first electrode S5 (see FIG. 8) of the fifth transistor ST5 through the sixth connection contact hole CCH6.

The anode connection electrode ANDE may be electrically connected to the fourth transistor ST4 and the sixth transistor ST6 through the seventh connection contact hole CCH7.

Referring to FIG. 11, the circuit array layer 120 may include the semiconductor layer SEL (CHDT, SDT, DDT, CH2, S2, D2, CH32, S32, D32, CH6, S6, and D6) on the substrate 110, the first conductive layer CDL1 (GWL, GIL, ECL, and GDT) including first direction lines GWL, GIL, ECL, and GCL of FIG. 8 disposed on the gate insulating layer 122 covering the semiconductor layer SEL (CHDT, SDT, DDT, CH2, S2, D2, CH32, S32, D32, CH6, S6, and D6) and extending in the first direction DR1, the second conductive layer CDL2 (VIL and VDAL) disposed on the interlayer insulating layer 123 covering the first conductive layer CDL1 (GWL, GIL, ECL, and GDT), the third conductive layer CDL3 (DL, VDL, CCE1, CCE2, and ANDE) including the second direction lines VDRL disposed on the first planarization layer 124 covering the second conductive layer CDL2 (VIL and VDAL) and extending in the second direction DR2, and a second planarization layer 125 covering the third conductive layer CDL3 (DL, VDL, CCE1, CCE2, and ANDE).

The circuit array layer 120 may further include a buffer layer 121 disposed between the substrate 110 and the semiconductor layer SEL (CHDT, SDT, DDT, CH2, S2, D2, CH32, S32, D32, CH6, S6, and D6).

Each of the buffer layer 121, the gate insulating layer 122, and the interlayer insulating layer 123 may be formed of at least one inorganic layer. For example, each of the buffer layer 121, the gate insulating layer 122, and the interlayer insulating layer 123 may be formed of multiple layers in which one or more inorganic layers of a silicon nitride layer, a silicon oxynitride layer, a silicon oxide layer, a titanium oxide layer, and an aluminum oxide layer are alternately stacked.

Alternatively, the interlayer insulating layer 123 may be formed of an organic layer such as acryl resin, epoxy resin, phenolic resin, polyamide resin, polyimide resin and the like.

Each of the first planarization layer 124 and the second planarization layer 125 may be formed of an organic layer such as acryl resin, epoxy resin, phenolic resin, polyamide resin, polyimide resin and the like.

The light emitting array layer 130 may be disposed on the second planarization layer 125.

The light emitting array layer 130 may include the anode electrode 131 disposed on the second planarization layer 125 and corresponding to each of the emission areas EA, a pixel defining layer 132 disposed on the second planarization layer 125 and corresponding to the separation region between the emission areas EA, the light emitting layer 133 disposed on the anode electrode 131, and the cathode electrode 134 disposed on the pixel defining layer 132 and the light emitting layer 133.

The anode electrode 131 may be electrically connected to the anode connection electrode ANDE through an anode contact hole ANDH penetrating the second planarization layer 125.

Accordingly, the fourth transistor ST4 and the sixth transistor ST6 may be electrically connected to the anode electrode 131 through the anode connection electrode ANDE.

The anode electrode 131 may be formed of a metal material, having high reflectivity, such as a stacked structure (Ti/Al/Ti) of aluminum (Al) and titanium (Ti), a stacked structure (ITO/Al/ITO) of Al and indium tin oxide (ITO), an APC alloy, a stacked structure (ITO/APC/ITO) of an APC alloy and ITO, or the like. The APC alloy is an alloy of silver (Ag), palladium (Pd) and copper (Cu).

The pixel defining layer 132 may cover the edges of the anode electrode 131.

The pixel defining layer 132 may be formed of an organic layer such as acryl resin, epoxy resin, phenolic resin, polyamide resin, polyimide resin and the like.

The light emitting array layer 130 may further include a first common layer 135 disposed between the anode electrode 131 and the light emitting layer 133, and a second common layer 136 disposed between the light emitting layer 133 and the cathode electrode 134.

The first common layer 135 may include a hole transporting layer corresponding to each of the emission areas EA and made of an organic material having a hole transporting property. Alternatively, the first common layer 135 may further include a hole injection layer disposed between the anode electrode 131 and the hole transporting layer and made of an organic material having a hole injecting property.

The second common layer 136 may include an electron transporting layer corresponding to the entire emission areas EA and made of an organic material having an electron transporting property. Alternatively, the second common layer 136 may further include an electron injection layer disposed between the electron transporting layer and the cathode electrode 134 and made of an organic material having an electron injecting property.

The light emitting layer 133 may be formed of an organic light emitting material that converts electron-hole pairs into light.

The organic light emitting material may include a host material and a dopant. The dopant may include a phosphorescent material or a fluorescent material.

For example, the light emitting layer 133 of the first emission area EA1 emitting the first color may include a host material including carbazole biphenyl (CBP) or 1,3-bis (carbazol-9-yl) (mCP).

Further, the dopant of the light emitting layer 133 of the first emission area EA1 may be selected as any one or more phosphorescent materials selected among bis(1-phenyliso-quinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP), or a florescent material including PBD: Eu(DBM)3(Phen) or perylene.

The light emitting layer 133 of the second emission area EA2 emitting the second color having a wavelength band lower than that of the first color may include a host material including CBP or mCP.

Further, a phosphorescent material including fac tris(2-phenylpyridine)iridium (Ir(ppy)3), or a fluorescent material including tris(8-hydroxyquinolino)aluminum (Alq3) may be selected as the dopant of the light emitting layer 133 of the second emission area EA2.

The light emitting layer 133 of the third emission area EA3 emitting the third color having a wavelength band lower than that of the second color may include a host material including CBP or mCP.

A phosphorescent material including (4,6-F2ppy)2Irpic or L2BD111 may be selected as the dopant of the light emitting layer 133 of the third emission area EA3.

The description of the organic light emitting material of the light emitting layer 133 is only an example, and the material of the light emitting layer 133 according to one embodiment is not limited to the above description.

The cathode electrode 134 may correspond to the entire emission areas EA.

The cathode electrode 134 may include a transparent conductive material (TCO) such as ITO or IZO that can transmit light or a semi-transmissive conductive material such as magnesium (Mg), silver (Ag), or an alloy of Mg and Ag. When the cathode electrode 134 is made of a semi-transmissive conductive material, an improvement in light output efficiency due to a micro cavity may be expected.

Accordingly, the light emitting elements LE, each including the anode electrode 131 and the cathode electrode 134 facing each other, and the first common layer 135, the light emitting layer 133, and the second common layer 136 that are interposed between the anode electrode 131 and the cathode electrode 134, may be provided to correspond to the emission areas EA, respectively.

The light emitting array layer 130 is covered with the encapsulation layer 140.

Figure 13:
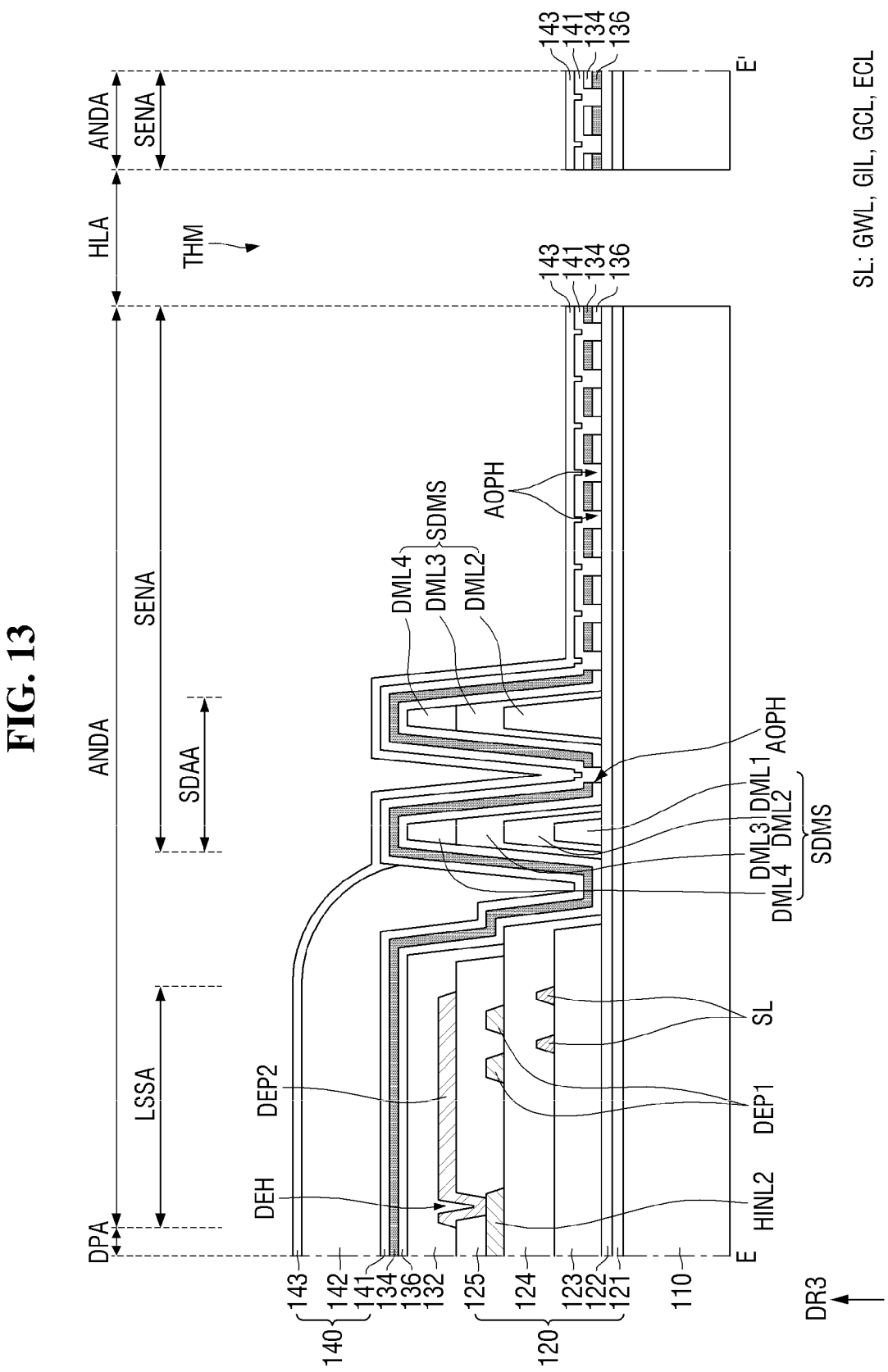
FIG. 13 is a cross-sectional view taken along line E-E of FIG. 12.

FIG. 12 is a layout diagram showing portion C of FIG. 4 according to a first embodiment. FIG. 13 is a cross-sectional view taken along line E-E of FIG. 12.

Referring to FIG. 12, the substrate 110 of the display device 10 according to the first embodiment includes the display area DPA, the hole area HLA surrounded by the display area DPA, and the additional non-display area ANDA between the display area DPA and the hole area HLA.

Referring to FIG. 13, the additional non-display area ANDA may include a sub-encapsulation area SENA adjacent to the edge of the hole area HLA and surrounding the periphery of the hole area HLA, and a line detour area LSSA adjacent to the display area DPA and surrounding the sub-encapsulation area SENA. The sub-encapsulation area SENA may include a sub-dam area SDAA that is relatively adjacent to the display area DPA.

The display device 10 of the first embodiment includes the through portion THM (see FIG. 13) disposed in the hole area HLA.

As illustrated in FIG. 12, the circuit array layer 120 includes the pixel drivers PXD respectively electrically connected to the light emitting elements LE of the emission areas EA, and the second direction lines VDRL spaced apart from each other in the first direction DR1, extending in the second direction DR2, formed of the line conductive layer (the third conductive layer CDL3 of FIG. 10), and electrically connected to the pixel drivers PXD.

In accordance with the first embodiment, the second direction lines VDRL may include the data lines DL transmitting the data signal Vdata and the first power lines VDL transmitting the first power ELVDD.

The second direction lines VDRL include hole intersection lines HINL intersecting the additional non-display area ANDA. The hole intersection lines HINL may include first hole intersection lines HINL1 and second hole intersection lines HINL2.

That is, the data lines DL may include first hole intersection lines HINL1 intersecting the additional non-display area ANDA, and the other general data lines DL'.

In addition, the first power lines VDL may include second hole intersection lines HINL2 intersecting the additional non-display area ANDA, and the other general first power lines VDL'.

Among the second direction lines VDRL, the hole intersection lines HINL intersecting the additional non-display area ANDA are respectively electrically connected to detour line portions DEP disposed in the additional non-display area ANDA and detouring around the hole area HLA. The detour line portions DEP may include first detour line portions DEP1 and second detour line portions DEP2.

The detour line portions DEP may be disposed in the line detour area LSSA of the additional non-display area ANDA.

In accordance with the first embodiment, the second direction lines VDRL are formed of the line conductive layer (i.e., the third conductive layer CDL3), whereas some of the detour line portions DEP are formed of an electrode conductive layer on the insulating layer (i.e., the second planarization layer 125) covering the line conductive layer, and the other detour line portions DEP are formed of the line conductive layer (i.e., the third conductive layer CDL3).

That is, in accordance with the first embodiment, not all the detour line portions DEP are disposed as the line conductive layer together with the second direction lines VDRL, but are disposed while being divided into the line conductive layer and the electrode conductive layer on the insulating layer covering the line conductive layer, so that the width of the area (i.e., the line detour area LSSA of FIG. 13) allocated to the arrangement of the detour line portions DEP may be reduced, or the gap between the detour line portions DEP may be reduced.

Accordingly, short-circuit defects or coupling defects between adjacent detour line portions DEP may be reduced.

In accordance with the first embodiment, among the data lines DL, the first hole intersection lines HINL1 intersecting the additional non-display area ANDA may be respectively electrically connected to first detour line portions DEP1 disposed in the additional non-display area ANDA and detouring around the hole area HLA.

Further, among the first power lines VDL, the second hole intersection lines HINL2 intersecting the additional non-display area ANDA may be electrically connected to the second detour line portion DEP2 disposed in the additional non-display area ANDA and detouring around the hole area HLA.

Referring to FIGS. 12 and 13, the first detour line portions DEP1 may be formed of the line conductive layer similarly to the first hole intersection line HINL1. The first detour line portions DEP1 may be disposed to be continuous with the first hole intersection lines HINL1, respectively.

The second detour line portion DEP2 is formed of the electrode conductive layer on the insulating layer (i.e., the second planarization layer 125) covering the second hole intersection lines HINL2.

Each of the second hole intersection lines HINL2 may be electrically connected to the second detour line portion DEP2 through a detour contact hole DEH penetrating the second planarization layer 125.

The second detour line portion DEP2 is used to transmit the first power ELVDD of a constant voltage, and thus may be electrically connected to two or more second hole intersection lines HINL2. Accordingly, the second detour line portion DEP2 may be disposed as one integrated body without being divided to be respectively connected to the two or more second hole intersection lines HINL2.

In this case, the second detour line portion DEP2 may be disposed to have a relatively large width, and thus may overlap the first detour line portions DEP1.

For example, the second detour line portion DEP2 may be disposed in the entire line detour area LSSA.

The second detour line portion DEP2 has a relatively large width enough to overlap the entire first detour line portions DEP1, and thus may have a relatively low resistance. Therefore, the RC delay of the first power line VDL by the second detour line portion DEP2 may be reduced.

In addition, since the second detour line portion DEP2 is formed of the electrode conductive layer on the insulating layer (i.e., the second planarization layer 125) covering the line conductive layer (i.e., the third conductive layer CDL3), the line conductive layer (i.e., the third conductive layer CDL3) includes only the first detour line portions DEP1 among the detour line portion DEP. That is, the detour line portions DEP are arranged while being divided into the line conductive layer (i.e., the third conductive layer CDL3) and the electrode conductive layer on the insulating layer (i.e., the second planarization layer 125) covering the line conductive layer. Accordingly, only the first detour line portions DEP1 are disposed as the line conductive layer (i.e., the third conductive layer CDL3) in the line detour area LSSA, so that the gap or width between the first detour line portions DEP1 may be widened. Accordingly, short-circuit defects or coupling defects between adjacent first detour line portions DEP1 may be reduced, or the resistance of each of the first detour line portions DEP1 may be reduced.

Alternatively, since the detour line portions DEP are arranged while being divided into the line conductive layer and the electrode conductive layer, the width of the line detour area LSSA in which the detour line portions DEP are disposed may be reduced and, thus, the width of the additional non-display area ANDA may be reduced.

Further, as shown in FIG. 12, the circuit array layer 120 may further include first direction lines SL extending in the first direction DR1, formed of the first conductive layer CDL1, and electrically connected to the pixel drivers PXD. The first direction lines SL may include the scan write line GWL, the scan initialization line GIL, the emission control line ECL, and the gate control line GCL.

FIG. 12 schematically illustrates some of the first direction lines SL in order to more clearly illustrate the second direction lines VDRL.

Some of the first direction lines SL intersecting the additional non-display area ANDA may each include a detour portion disposed in the additional non-display area ANDA and detouring around the hole area HAL.

In addition, although not shown in FIG. 12, the circuit array layer 120 may further include the initialization voltage line VIL and the first power auxiliary line VDAL extending in the first direction DR1 and formed of the second conductive layer CDL2.

Among the first direction lines SL, the initialization voltage line VIL intersecting the additional non-display area ANDA and the first power auxiliary line VDAL intersecting the additional non-display area ANDA may each include a detour portion (not shown) disposed in the additional non-display area ANDA and detouring around the hole area HAL.

As illustrated in FIG. 13, the encapsulation layer 140 may include a first encapsulation layer 141, a second encapsulation layer 142, and a third encapsulation layer 143 that are sequentially stacked on the light emitting array layer 130.

Each of the first encapsulation layer 141 and the third encapsulation layer 143 may be made of an inorganic insulating material. For example, each of the first sealing layer 141 and the third sealing layer 143 may have a structure in which one or more inorganic layers of a silicon nitride layer, a silicon oxynitride layer, a silicon oxide layer, a titanium oxide layer, and an aluminum oxide layer are stacked.

The first encapsulation layer 141 and the third encapsulation layer 143 may be in contact with each other in the main non-display area MNDA and the additional non-display area ANDA. Accordingly, an encapsulation structure for preventing permeation of oxygen or moisture may be provided by bonding the first encapsulation layer 141 and the third encapsulation layer 143, that is, bonding between inorganic insulating materials.

The second encapsulation layer 142 is disposed between the first encapsulation layer 141 and the third encapsulation layer 143. The second encapsulation layer 142 may be formed of an organic layer such as acryl resin, epoxy resin, phenolic resin, polyamide resin, polyimide resin and the like.

In this way, the damage to the light emitting array layer 130 by foreign substances such as dust or the like may be prevented by the second encapsulation layer 142 disposed relatively thickly and made of an organic insulating material.

The display device 10 may further include a sub-dam structure SDMS disposed in the sub-dam area SDAA and surrounding the hole area HLA.

The sub-dam structure SDMS is used to limit the diffusion of the second encapsulation layer 142 of the encapsulation layer 140 to the hole area HLA over the sub-dam area SDAA.

The sub-dam structure SDMS may have a stacked structure of dam layers DML1, DML2, DML3, and DML4. The dam layers DML1, DML2, DML3, and DML4 may include the same layers as at least one of the interlayer insulating layer 123, the first planarization layer 124, the second planarization layer 125, or the pixel defining layer 132.

Alternatively, the dam layers DML1, DML2, DML3, and DML4 of the sub-dam structure SDMS may include the same layer as a spacer (not shown) disposed on the pixel defining layer 132.

Two or more sub-dam structures SDMS may be disposed to be spaced apart from each other in the sub-dam area SDAA. Among the two or more sub-dam structures SDMS, any one sub-dam structure SDMS adjacent to the display area DPA may be formed of the first to fourth dam layers DML1 to DML4, and another one of the two or more sub-dam structures SDMS may be formed of the second to fourth dam layers DML2 to DML4. However, this is only an example, and the arrangement pattern of the sub-dam structure SDMS may be changed depending on the material, thickness, and width of the second encapsulation layer 142.

The sub-dam structure SDMS is spaced apart from the organic layers provided on the circuit array layer 120 and the light emitting array layer 130. That is, a valley region in which the gate insulating layer 122 is exposed may be provided between the sub-dam structure SDMS and the organic layers provided on the circuit array layer 120 and the light emitting array layer 130 and between the sub-dam structures SDMS.

In addition, the second common layer 136 and the cathode electrode 134 correspond to the entire display area DPA, and thus may be disposed by a stacking process without a mask. Therefore, the second common layer 136 and the cathode electrode 134 may also be disposed in the additional non-display area ANDA on the gate insulating layer 122.

Accordingly, in accordance with the first embodiment, in order to provide a bonding structure between the first encapsulation layer 141 and the gate insulating layer 122 in the sub-encapsulation area SENA, the display device 10 may include two or more additional opening holes AOPH disposed in the sub-encapsulation area SENA, spaced apart from each other, and penetrating the second common layer 136 and the cathode electrode 134.

For example, the two or more additional opening holes AOPH may be formed by a process of disposing a sacrificial layer (not shown) on the gate insulating layer 122 and a process of disposing the second common layer 136 and the cathode electrode 134 and then removing the second common layer 136 and the cathode electrode 134 disposed on the sacrificial layer together with the sacrificial layer by peeling off the sacrificial layer.

Meanwhile, when the interlayer insulating layer 123 is made of an inorganic insulating material, the interlayer insulating layer 123 may be exposed in the valley region.

In this case, the second common layer 136 and the cathode electrode 134 may be disposed in the additional non-display area ANDA on the interlayer insulating layer 123, and the interlayer insulating layer 123 of the additional non-display area ANDA may be exposed by the additional opening holes AOPH.

Further, the first encapsulation layer 141 may be in contact with the gate insulating layer 122 or the interlayer insulating layer 123 exposed through the two or more additional opening holes AOPH.

The third encapsulation layer 143 may be in contact with the first encapsulation layer 141 in the additional non-display area ANDA.

Accordingly, in the additional non-display area ANDA, the bonding structure of inorganic materials by the gate insulating layer 122 or the interlayer insulating layer 123, and the bonding structure of inorganic materials by the first encapsulation layer 141 and the third encapsulation layer 143 may be provided. Accordingly, the permeation of oxygen or moisture through the through portion THM may be blocked.

As described above, in accordance with the first embodiment, the first detour line portions DEP1 electrically connected to some of the data lines DL are disposed as the line conductive layer (i.e., the third conductive layer CDL3), and the second detour line portion DEP2 electrically connected to some of the first power lines VDL is disposed as the electrode conductive layer on the insulating layer (i.e., the second planarization layer 125) covering the line conductive layer (i.e., the third conductive layer CDL3). Further, the second detour line portion DEP2 has a relatively large width enough to overlap the entire first detour line portions DEP1.

Accordingly, the gap between the first detour line portions DEP1 may be increased and, thus, short-circuit defects between the first detour line portions DEP1 may be reduced.

Further, the second detour line portion DEP2 has a width greater than each of the first detour line portions DEP1, and thus may have a relatively small resistance, which makes it possible to reduce the RC delay of the first power line VDL by the second detour line portion DEP2.

Figure 14:
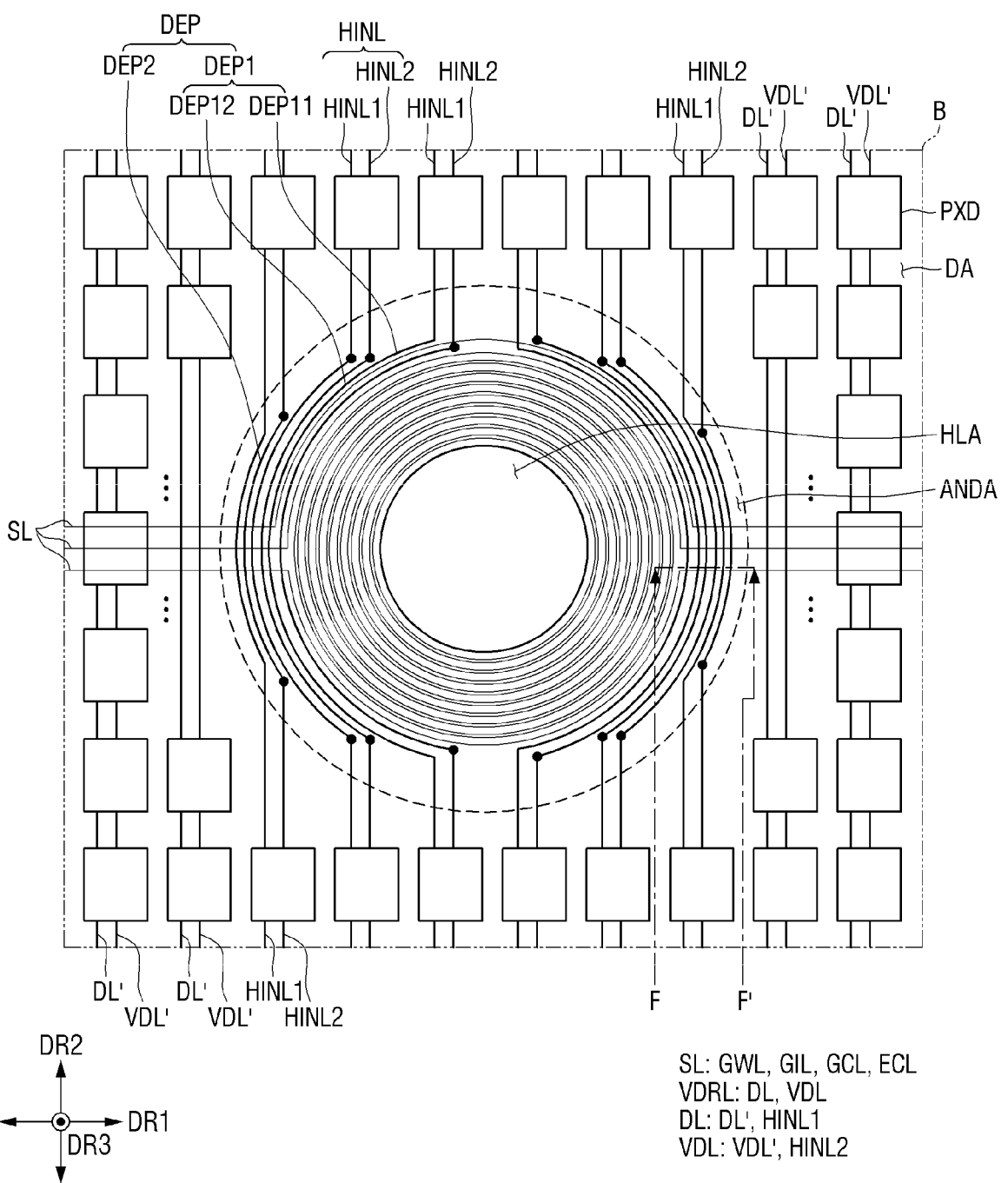
FIG. 14 is a layout diagram showing portion C of FIG. 4 according to a second embodiment.
Figure 15:
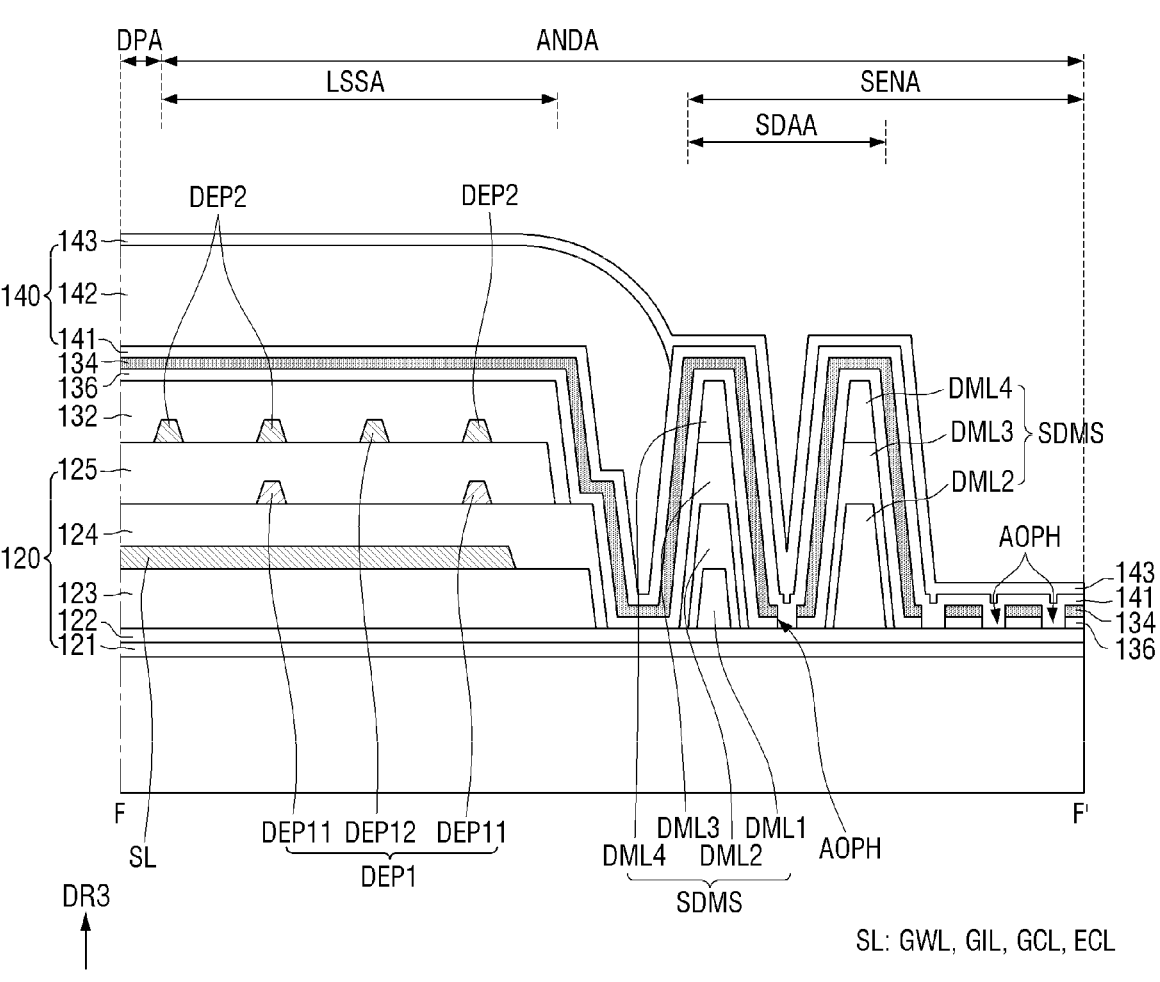
FIG. 15 is a cross-sectional view taken along line F-F' of FIG. 14.

FIG. 14 is a layout diagram showing portion C of FIG. 4 according to a second embodiment. FIG. 15 is a cross-sectional view taken along line F-F' of FIG. 14.

Referring to FIGS. 14 and 15, a display device 10 according to the second embodiment is the same as the display device 10 according to the first embodiment illustrated in FIGS. 12 and 13 except that the first detour line portions DEP1 include a first data detour line portion DEP11 formed of the line conductive layer (i.e., the third conductive layer) and a second data detour line portion DEP12 formed of the electrode conductive layer, and that the second hole intersection lines HINL2 intersecting the additional non-display area ANDA among the first power lines VDL are respectively electrically connected to the second detour line portions DEP2 formed of the electrode conductive layer, so that the redundant description will be omitted.

The first data detour line portion DEP11 may overlap some of the second detour line portions DEP2.

The second data detour line portions DEP12 and the second detour line portions DEP2 may be alternately disposed in the first direction DR1 or the second direction DR2.

In this way, the first detour line portions DEP1 are arranged while being divided into the line conductive layer and the electrode conductive layer, so that the gap between the first detour line portions DEP1 may be increased, which makes it possible to further reduce short-circuit defects between the first detour line portions DEP1.

Further, the first data detour line portion DEP11 overlaps the second detour line portion DEP2 transmitting the first power ELVDD of a constant voltage, and the second data detour line portion DEP12 is adjacent to the second detour line portion DEP2. Accordingly, coupling defects between the first detour line portions DEP1 may be reduced.

Figure 16:
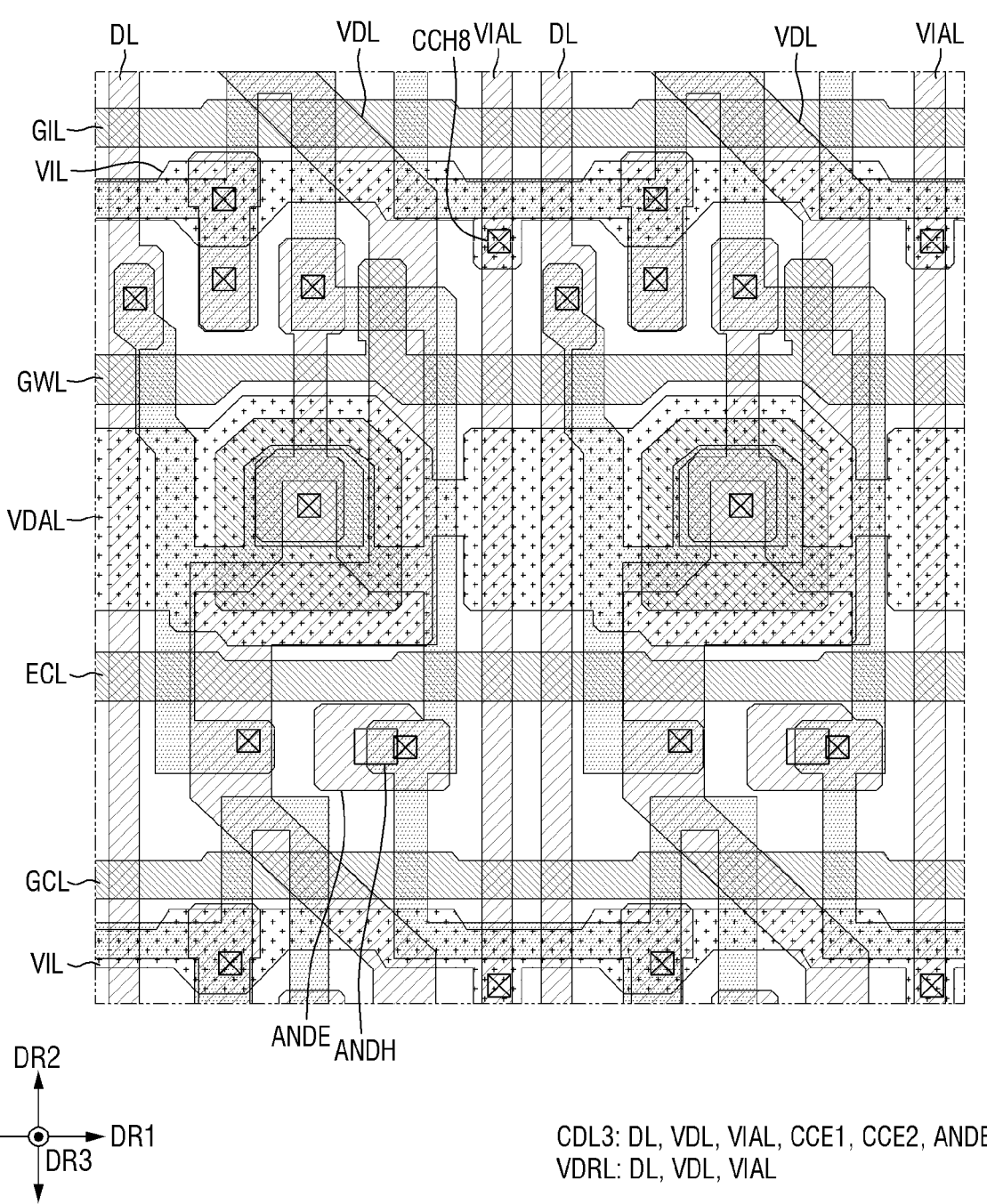
FIG. 16 is a plan view illustrating two adjacent pixel drivers according to a third embodiment.

FIG. 16 is a plan view illustrating two adjacent pixel drivers according to a third embodiment.

Referring to FIG. 16, a display device 10 according to the third embodiment is substantially the same as the display device 10 according to the first embodiment illustrated in FIGS. 7 to 11 except that the second direction lines VDRL of the circuit array layer 120 further include initialization voltage auxiliary lines VIAL in the pixel drivers PXD, so that the redundant description will be omitted below.

The initialization voltage auxiliary line VIAL may be electrically connected to the initialization voltage line VIL transmitting the initialization voltage Vint.

The initialization voltage auxiliary line VIAL may be spaced apart from the data line DL and the first power line VDL in the first direction DR1, extend in the second direction DR2, and be formed of the line conductive layer (i.e., the third conductive layer CDL3).

The initialization voltage auxiliary line VIAL may be electrically connected to the initialization voltage line VIL through an eighth connection contact hole CCH8.

The eighth connection contact hole CCH8 may overlap the initialization voltage line VIL and penetrate the first planarization layer 124.

Figure 17:
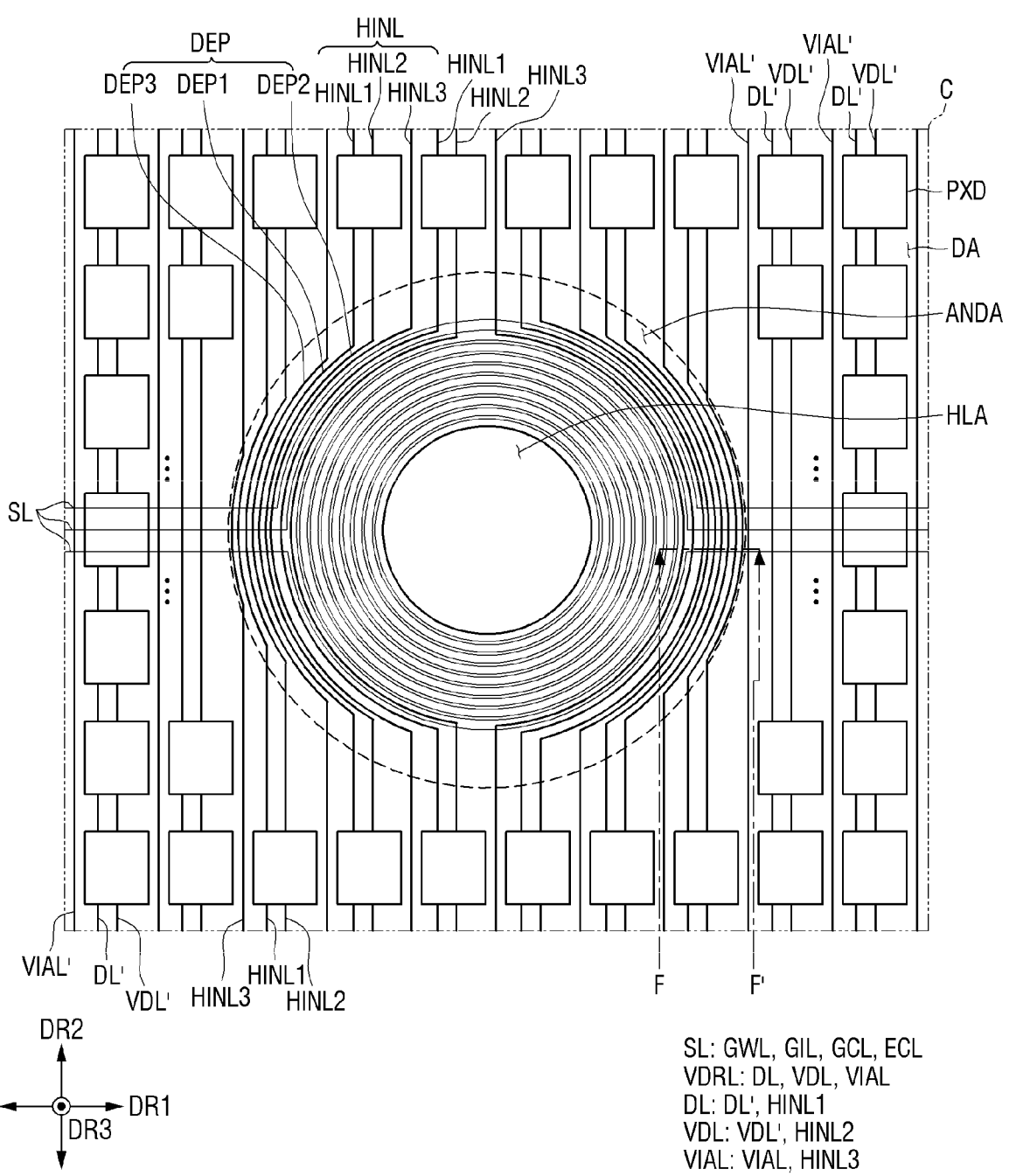
FIG. 17 is a layout diagram showing portion C of FIG. 4 according to the third embodiment.
Figure 18:
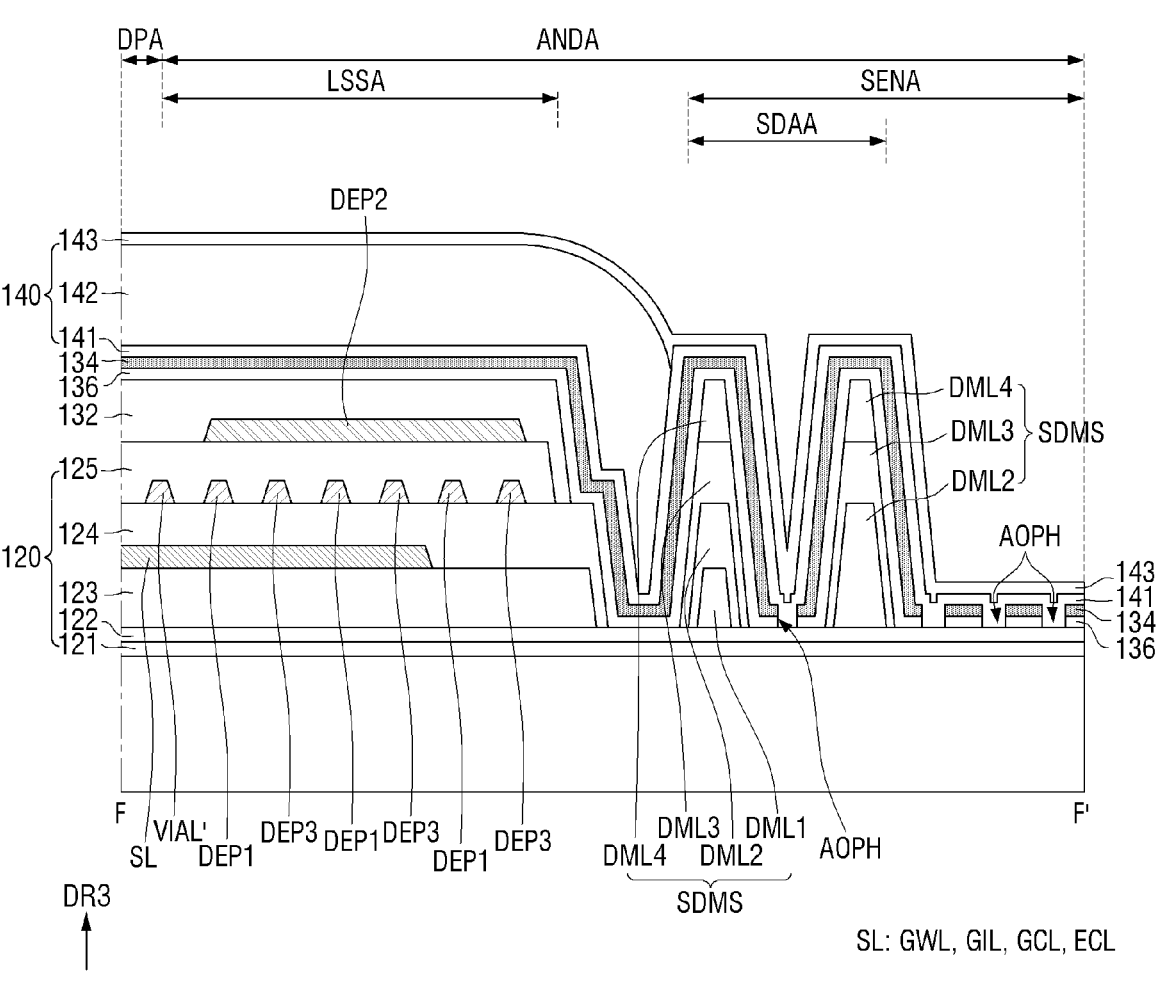
FIG. 18 is a cross-sectional view taken along line F-F' of FIG. 17 according to the third embodiment.

FIG. 17 is a layout diagram showing portion C of FIG. 4 according to the third embodiment. FIG. 18 is a cross-sectional view taken along line F-F' of FIG. 17 according to the third embodiment.

Referring to FIGS. 17 and 18, a display device 10 according to the third embodiment is substantially the same as the display device 10 according to the first embodiment shown in FIGS. 12 and 13 except that the second direction lines VDRL further include the initialization voltage auxiliary lines VIAL, and that the third hole intersection lines HINL3 intersecting the additional non-display area ANDA among the initialization voltage auxiliary lines VIAL are respectively electrically connected to the third detour line portions DEP3 disposed in the additional non-display area ANDA, so that the redundant description will be omitted. The hole intersection lines HINL may include the first hole intersection lines HINL1, the second hole intersection lines HINL2, and the third hole intersection lines HINL3. The detour line portions DEP may include the first detour line portions DEP1, the second detour line portions DEP2, and the third detour line portions DEP3.

In accordance with the third embodiment, the initialization voltage auxiliary lines VIAL may include the third hole intersection lines HINL3 intersecting the additional non-display area ANDA, and the other general initialization voltage auxiliary line VIAL'.

The third hole intersection lines HINL3 may be respectively electrically connected to the third detour line portions DEP3 disposed in the additional non-display area ANDA and detouring around the hole area HLA.

In accordance with the third embodiment, the first detour line portions DEP1 respectively electrically connected to the first hole intersection lines HINL1 intersecting the additional non-display area ANDA among the data lines DL may be formed of the line conductive layer (i.e., the third conductive layer CDL3) and disposed to be respectively continuous with the first hole intersection lines HINL1.

The second detour line portions DEP2 electrically connected to the second hole intersection lines HINL2 intersecting the additional non-display area ANDA among the first power lines VDL may be formed of the electrode conductive layer on the insulating layer (i.e., the second planarization layer 125) covering the line conductive layer (i.e., the third conductive layer CDL3).

The third detour line portions DEP3 respectively electrically connected to the third hole intersection lines HINL3 intersecting the additional non-display area ANDA among the initialization voltage auxiliary lines VIAL may be formed of the line conductive layer (i.e., the third conductive layer CDL3), spaced apart from the first detour line portions DEP1, and disposed to be respectively continuous with the third hole intersection lines HINL3. The detour line portions DEP may include first detour line portions DEP1, the second detour line portions DEP2, and the third detour line portions DEP3.

The first detour line portions DEP1 and the third detour line portions DEP3 may be formed of the line conductive layer (i.e., the third conductive layer CDL3) of the line detour area LSSA, and may be arranged to be spaced apart from each other.

For example, according to the positional relationship between the data line DL and the initialization voltage line VIL, the first detour line portions DEP1 and the third detour line portions DEP3 may be alternately disposed at least one by one in the first direction DR1 or the second direction DR2. That is, one of the first detour line portions DEP1 may be adjacent to at least one of the third detour line portions DEP3.

The second detour line portion DEP2 may overlap the first detour line portions DEP1 and the third detour line portions DEP3.

That is, the second detour line portion DEP2 may be disposed to have a relatively large width enough to completely overlap the first detour line portions DEP1 and the third detour line portions DEP3. For example, the second detour line portion DEP2 may be disposed in the entire line detour area LSSA.

In this way, the second detour line portion DEP2 has a relatively large width, and thus may have a relatively low resistance. Therefore, the RC delay of the first power line VDL by the second detour line portion DEP2 may be reduced.

Further, the gap between the first detour line portions DEP1 and the third detour line portions DEP3 formed of the line conductive layer may be widened, so that a short-circuit defect or a coupling defect between the first detour line portion DEP1 and the third detour line portion DEP3 adjacent to each other may be reduced.

Figure 19:
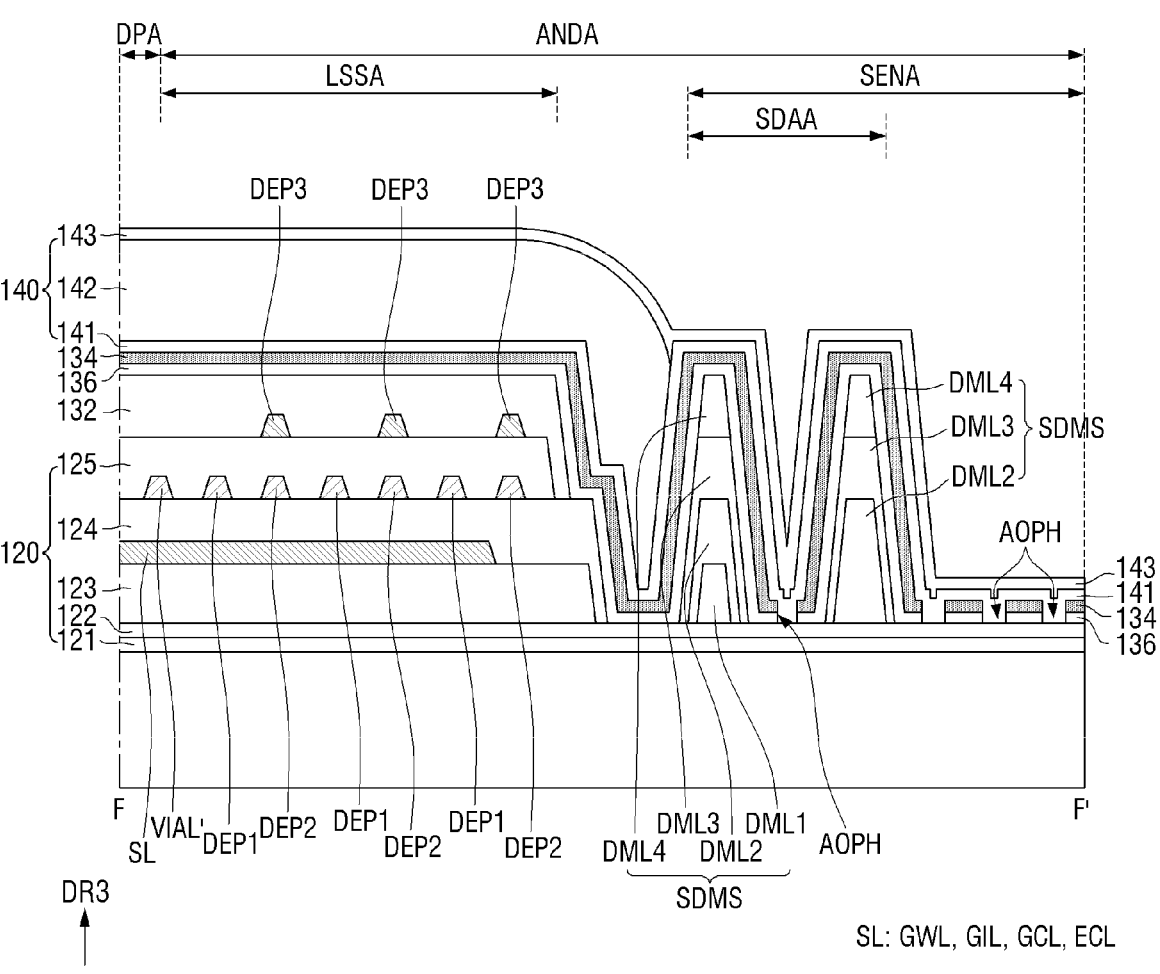
FIG. 19 is a cross-sectional view taken along line F-F' of FIG. 17 according to a fourth embodiment.

FIG. 19 is a cross-sectional view taken along line F-F of FIG. 17 according to a fourth embodiment.

Referring to FIG. 19, a display device 10 according to a fourth embodiment is the same as the display device 10 according to the third embodiment illustrated in FIGS. 17 and 18 except that the second hole intersection lines HINL2 intersecting the additional non-display area ANDA among the first power lines VDL are respectively electrically connected to the second detour line portions DEP2 formed of the line conductive layer (i.e., the third conductive layer CDL3), and that the third detour line portions DEP3 respectively electrically connected to the third hole intersection lines HINL3 intersecting the additional non-display area ANDA among the initialization voltage auxiliary lines VIAL are formed of the electrode conductive layer, so that the redundant description will be omitted below.

In accordance with the fourth embodiment, the second detour line portions DEP2 respectively electrically connected to the second hole intersection lines HINL2 intersecting the additional non-display area ANDA among the first power lines VDL may be disposed to be respectively continuous with the second hole intersection lines HINL2.

The first detour line portions DEP1 and the second detour line portions DEP2 may be formed of the line conductive layer (i.e., the third conductive layer CDL3) of the line detour area LSSA, and may be arranged to be spaced apart from each other.

According to the positional relationship between the data line DL and the first power line VDL, the first detour line portions DEP1 and the second detour line portions DEP2 may be alternately disposed at least one by one in the first direction DR1 or the second direction DR2.

The third detour lines DEP3 respectively electrically connected to the third hole intersection lines HINL3 intersecting the additional non-display area ANDA among the initialization voltage auxiliary lines VIAL may be formed of the electrode conductive layer on the insulating layer (i.e., the second planarization layer 125) covering the line conductive layer (i.e., the third conductive layer CDL3).

The third detour line portions DEP3 may be respectively electrically connected to the third hole intersection lines HINL3 through detour contact holes (not shown) penetrating the insulating layer (i.e., the second planarization layer 125) covering the line conductive layer (i.e., the third conductive layer CDL3).

The third detour line portions DEP3 may overlap the second detour line portions DEP2 transmitting the first power ELVDD, respectively.

In this way, the influence of coupling by the data signal Vdata of each of the first detour line portions DEP1 may be reduced by the second detour line portion DEP2. Accordingly, a coupling defect in which the potential of the initialization voltage Vint of the third detour line portion DEP3 varies while being coupled with the data signal Vdata of each of the first detour line portions DEP1 may be reduced.

Figure 20:
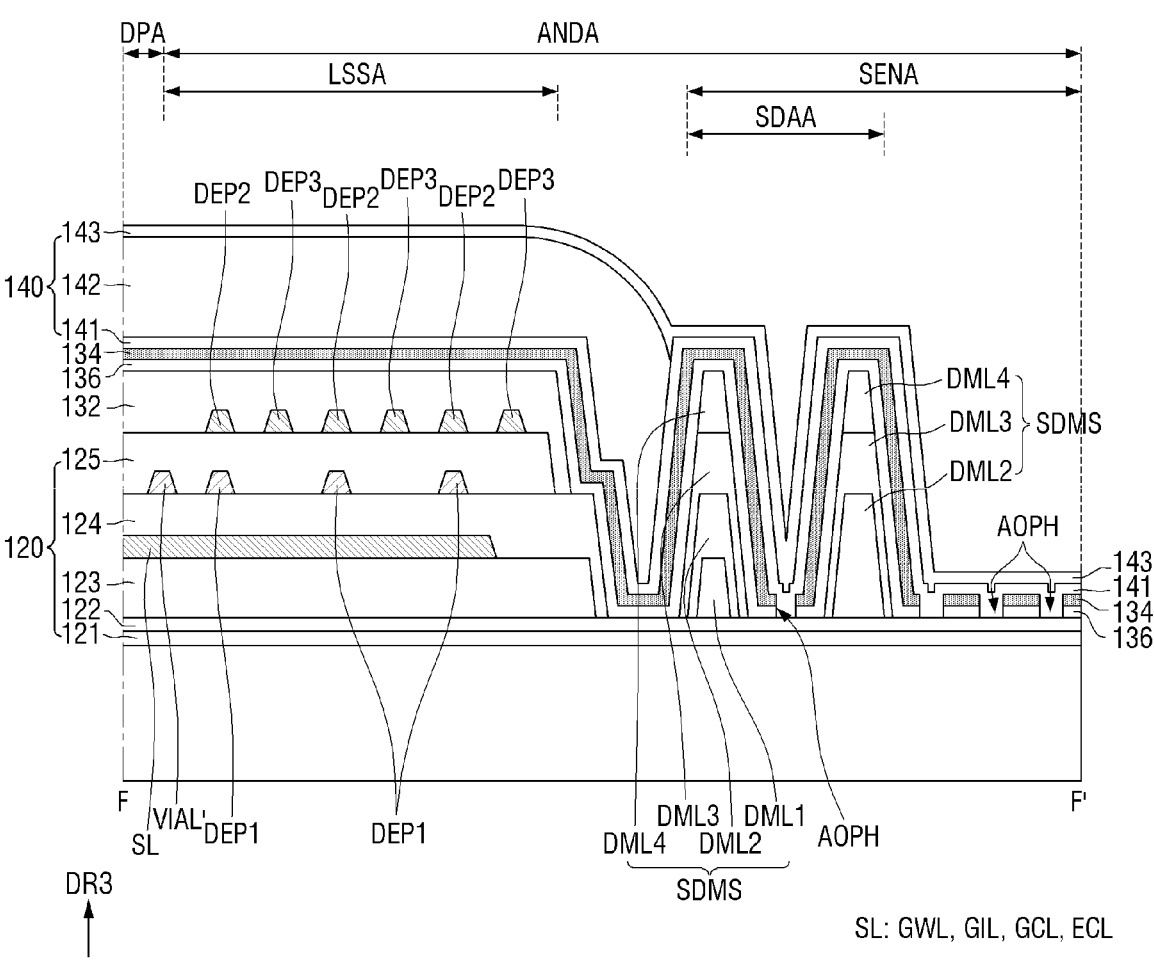
FIG. 20 is a cross-sectional view taken along line F-F' of FIG. 17 according to a fifth embodiment.

FIG. 20 is a cross-sectional view taken along line F-F' of FIG. 17 according to a fifth embodiment.

Referring to FIG. 20, a display device 10 according to the fifth embodiment is substantially the same as the display device 10 according to the fourth embodiment illustrated in FIG. 19 except that the second detour line portions DEP2 are formed of the electrode conductive layer on the insulating layer (i.e., the second planarization layer 125) covering the line conductive layer (i.e., the third conductive layer CDL3), so that the redundant description will be omitted below.

The second detour line portions DEP2 and the third detour line portions DEP3 may be formed of the same electrode conductive layer, and may be arranged to be spaced apart from each other in the line detour area LSSA.

At least some of the second detour line portions DEP2 may overlap the first detour line portions DEP1.

In this way, a coupling defect in which the potential of the initialization voltage Vint of the third detour line portions DEP3 varies by the influence of the data signal Vdata of each of the first detour line portions DEP1 may be reduced.

Further, the line conductive layer (i.e., the third conductive layer CDL3) of the line detour area LSSA includes only the first detour line portions DEP1, so that the gap between the first detour line portions DEP1 may be widened, which makes it possible to further reduce short-circuit defects or coupling defects between the first detour line portions DEP1.

Figure 21:
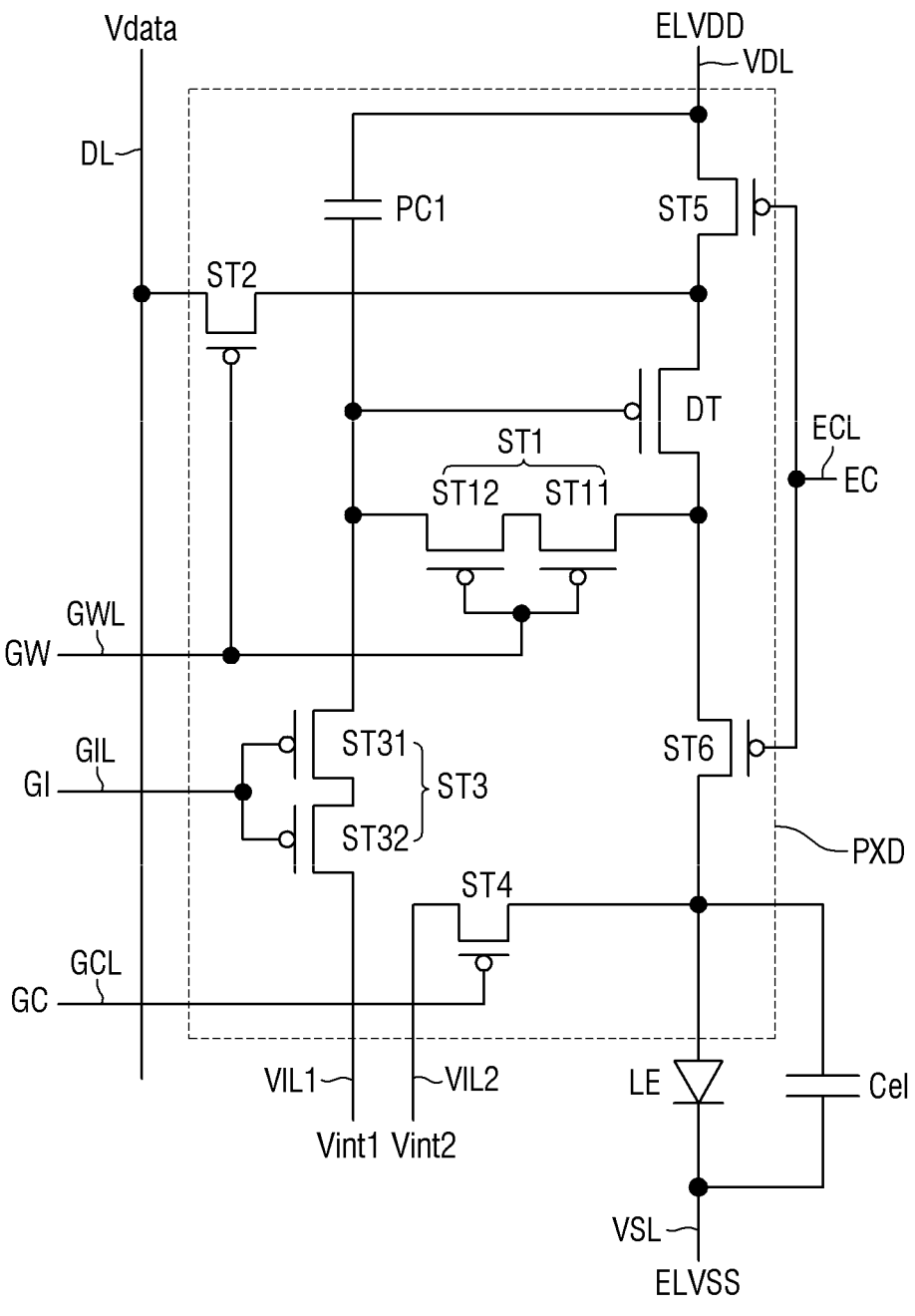
FIG. 21 is an equivalent circuit diagram illustrating a pixel driver according to a sixth embodiment.

FIG. 21 is an equivalent circuit diagram illustrating a pixel driver according to a sixth embodiment.

Referring to FIG. 21, a pixel driver PXD according to a sixth embodiment is substantially the same as the pixel driver PXD according to the first embodiment illustrated in FIG. 6 except that the third transistor ST3 is disposed between the first initialization voltage line VIL1 transmitting a first initialization voltage Vint1 and the gate electrode of the driving transistor DT, and that the fourth transistor ST4 is disposed between the second initialization voltage line VIL2 transmitting a second initialization voltage Vint2 and the anode electrode of the light emitting element LE, so that the redundant description will be omitted below.

Accordingly, the potential of the gate electrode of the driving transistor DT may be initialized to the first initialization voltage Vint1, and the potential of the anode electrode of the light emitting element LE may be initialized to the second initialization voltage Vint2.

Figure 22:
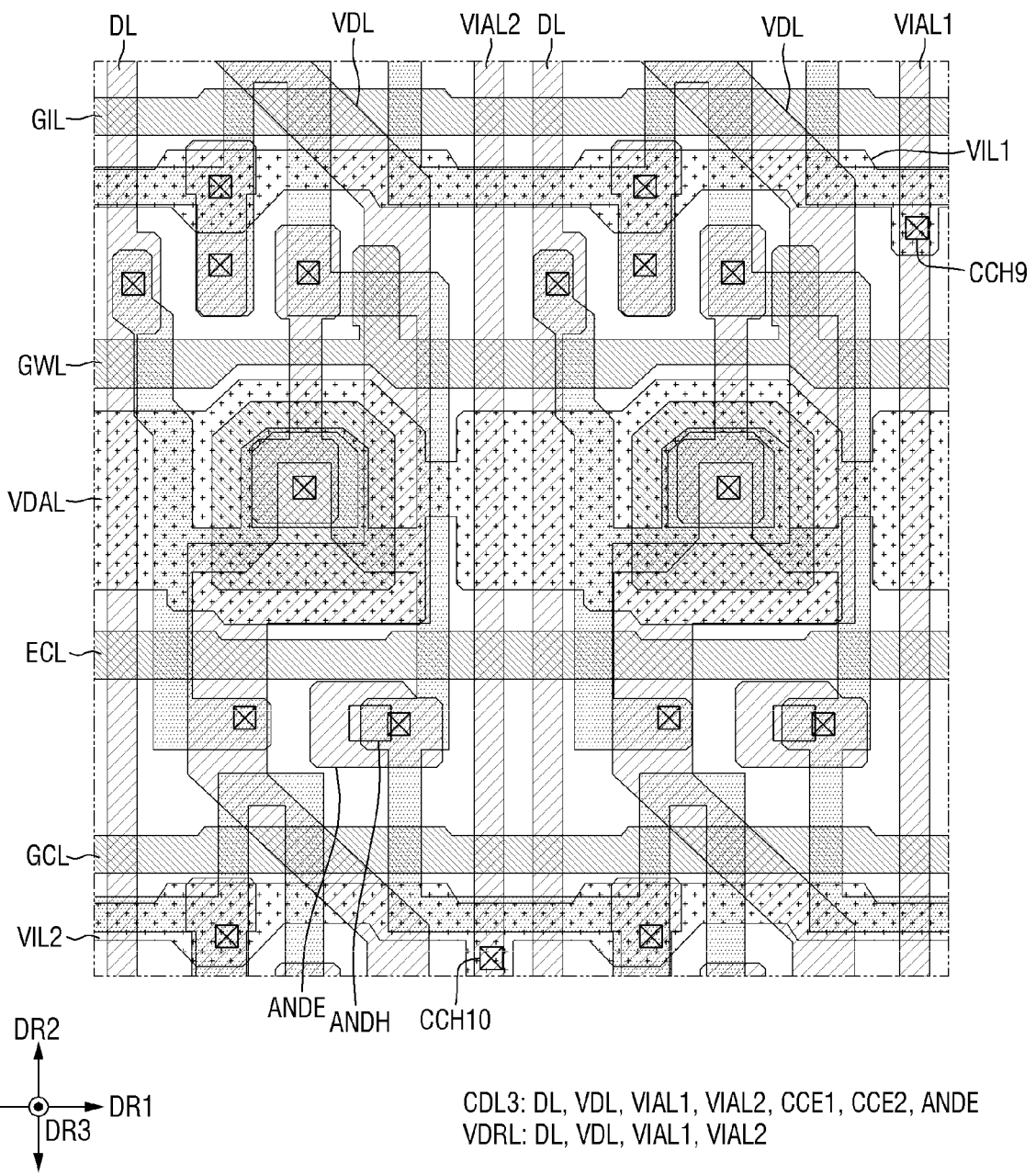
FIG. 22 is a plan view illustrating two pixel drivers according to the sixth embodiment.

FIG. 22 is a plan view illustrating two pixel drivers according to the sixth embodiment.

Referring to FIG. 22, a circuit array layer 120 according to the sixth embodiment is substantially the same as the circuit array layer 120 according to the first embodiment illustrated in FIGS. 7 to 11 except that the second direction lines VDRL further include first initialization voltage auxiliary lines VIAL1 and second initialization voltage auxiliary lines VIAL2, so that the redundant description will be omitted below.

The first initialization voltage auxiliary line VIAL1 may be electrically connected to the first initialization voltage line VIL1 transmitting the first initialization voltage Vint1 for initializing the potential of the gate electrode of the driving transistor DT.

The second initialization voltage auxiliary line VIAL2 may be electrically connected to the second initialization voltage line VIL2 transmitting the second initialization voltage Vint2 for initializing the potential of the anode electrode of the light emitting element LE.

The first initialization voltage auxiliary line VIAL1 and the second initialization voltage auxiliary line VIAL2 may be formed of the line conductive layer (i.e., the third conductive layer CDL3) together with the data line DL and the first power line VDL.

The first initialization voltage auxiliary line VIAL1 may be spaced apart from the data line DL and the first power line VDL in the first direction DR1, and may extend in the second direction DR2.

The second initialization voltage auxiliary line VIAL2 may be spaced apart from the data line DL, the first power line VDL, and the first initialization voltage auxiliary line VIAL1 in the first direction DR1, and may extend in the second direction DR2.

For example, the data line DL and the first power line VDL may be disposed adjacent to each other in the first direction DR1. The first initialization voltage auxiliary line VIAL1 and the second initialization voltage auxiliary line VIAL2 may be alternately disposed between the first power line VDL and the data line DL in the first direction DR1.

The first initialization voltage auxiliary line VIAL1 may be electrically connected to the first initialization voltage line VIL1 through a ninth connection contact hole CCH9.

The second initialization voltage auxiliary line VIAL2 may be electrically connected to the second initialization voltage line VIL2 through a tenth connection contact hole CCH10.

The ninth connection contact hole CCH9 may overlap the first initialization voltage line VIL1, and may penetrate the first planarization layer 124.

The tenth connection contact hole CCH10 may overlap the second initialization voltage line VIL2, and may penetrate the first planarization layer 124.

Figure 23:
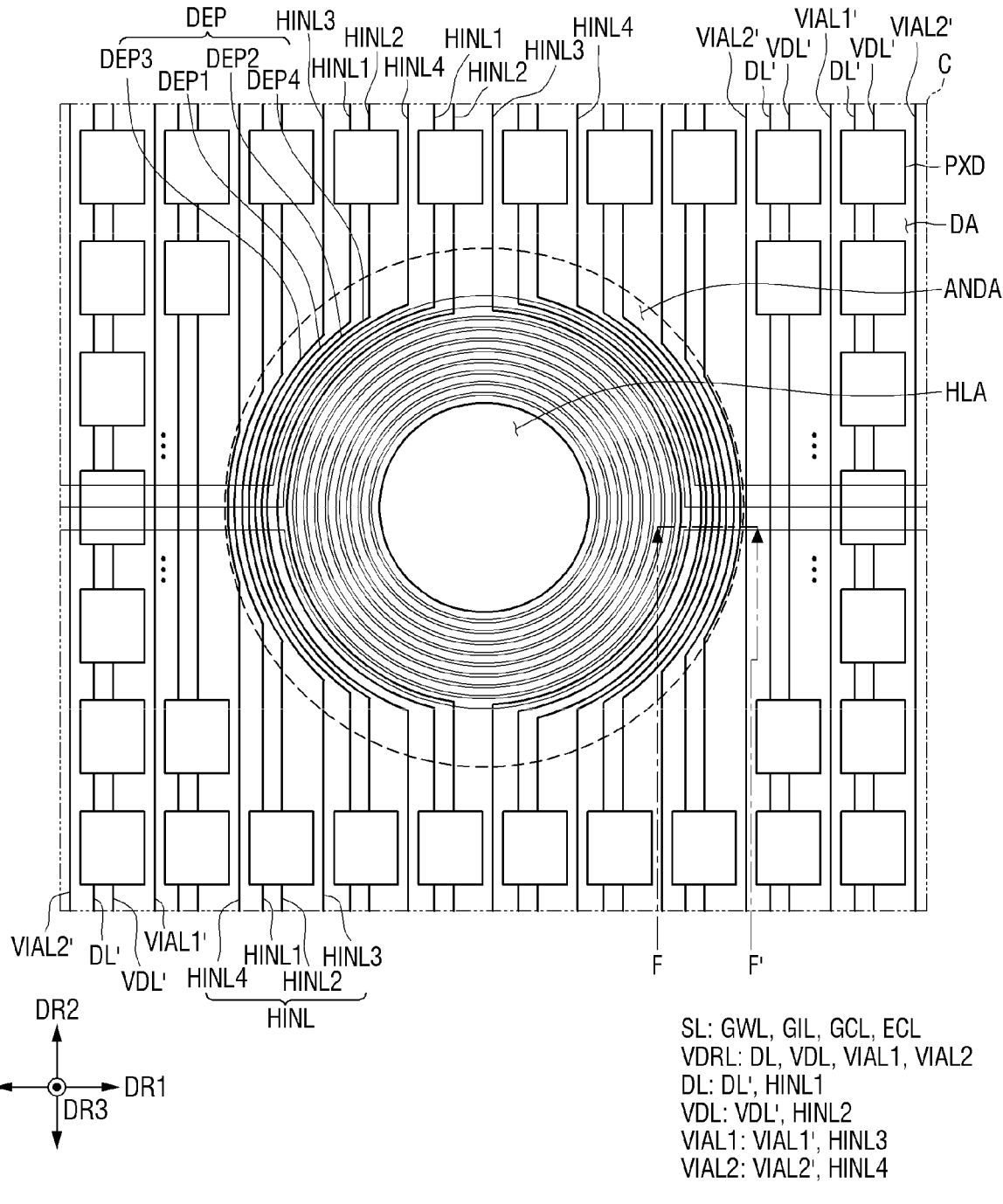
FIG. 23 is a layout diagram showing portion C of FIG. 4 according to the sixth embodiment.
Figure 24:
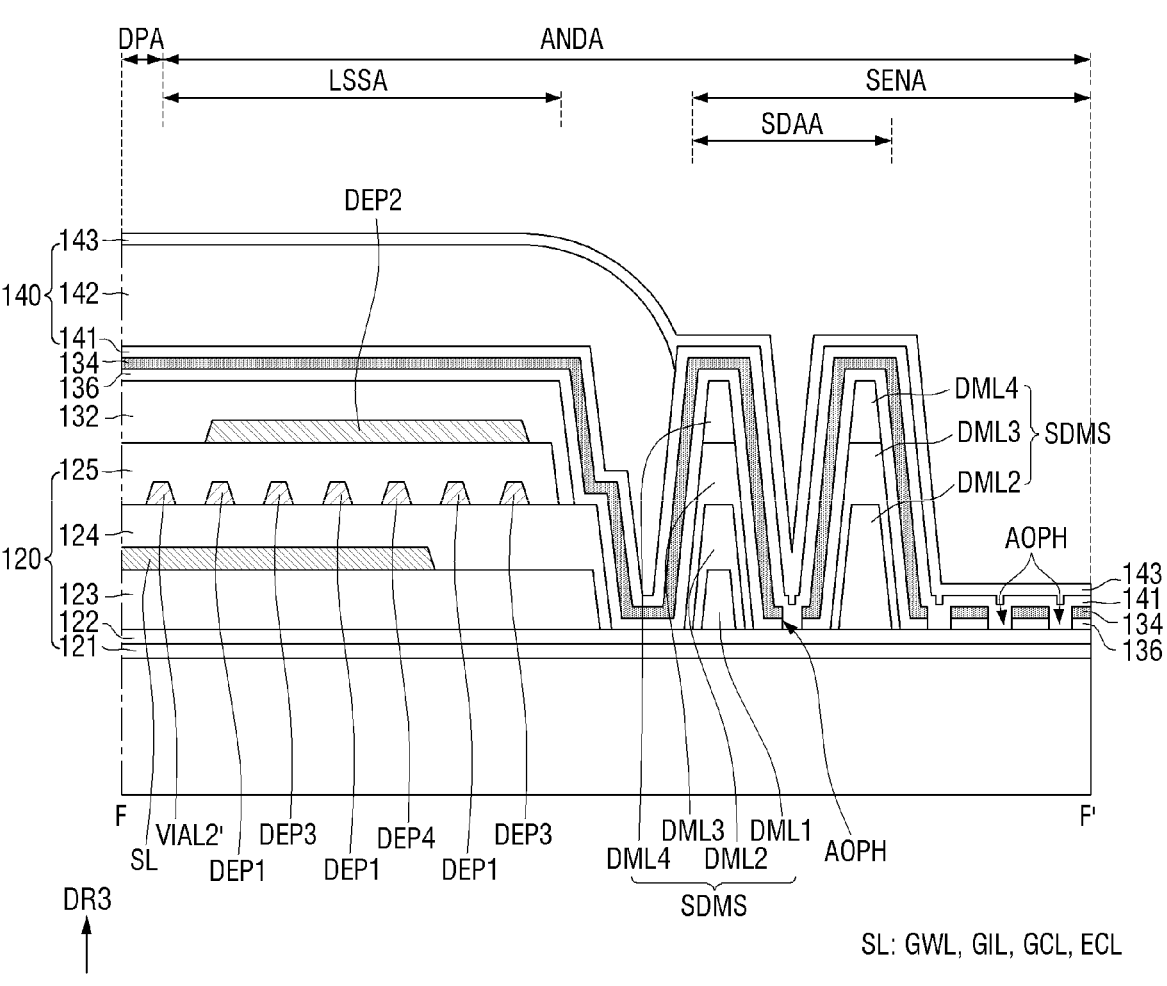
FIG. 24 is a cross-sectional view taken along line F-F of FIG. 23 according to the sixth embodiment.

FIG. 23 is a layout diagram showing portion C of FIG. 4 according to the sixth embodiment. FIG. 24 is a cross-sectional view taken along line F-F' of FIG. 23 according to the sixth embodiment.

Referring to FIGS. 23 and 24, a display device 10 according to the sixth embodiment is substantially the same as the display device 10 according to the first embodiment illustrated in FIGS. 12 and 13 except that the second direction lines VDRL further include the first initialization voltage auxiliary lines VIAL1 and the second initialization voltage auxiliary lines VIAL2, and that the hole intersection lines HINL further include the third hole intersection line HINL3 transmitting the first initialization voltage Vint1 and a fourth hole intersection line HINL4 transmitting the second initialization voltage Vint2, and also that the detour line portion DEP further includes the third detour line portion DEP3 and a fourth detour line portion DEP4, so that the redundant description will be omitted.

The first initialization voltage auxiliary lines VIAL1 may include the third hole intersection line HINL3 intersecting the additional non-display area ANDA, and the other general first initialization voltage auxiliary line VIAL1'.

The third hole intersection line HINL3 may be electrically connected to the third detour line portion DEP3 disposed in the additional non-display area ANDA and detouring around the hole area HLA.

The second initialization voltage auxiliary lines VIAL2 may include the fourth hole intersection line HINL4 intersecting the additional non-display area ANDA, and the other general second initialization voltage auxiliary line VIAL2'.

The fourth hole intersection line HINL4 may be electrically connected to the fourth detour line portion DEP4 disposed in the additional non-display area ANDA and detouring around the hole area HLA.

In accordance with the sixth embodiment, the first detour line portions DEP1 respectively electrically connected to the first hole intersection lines HINL1 intersecting the additional non-display area ANDA among the data lines DL may be formed of the line conductive layer (i.e., the third conductive layer CDL3), and may be disposed to be respectively continuous with the first hole intersection lines HINL1.

The second detour line portion DEP2 electrically connected to the second hole intersection lines HINL2 intersecting the additional non-display area ANDA among the first power lines VDL may be formed of the electrode conductive layer on the insulating layer (i.e., the second planarization layer 125) covering the line conductive layer (i.e., the third conductive layer CDL3).

The third detour line portion DEP3 electrically connected to the third hole intersection line HINL3 intersecting the additional non-display area ANDA among the first initialization voltage auxiliary lines VIAL1 may be formed of the line conductive layer (i.e., the third conductive layer CDL3), spaced apart from the first detour line portions DEP1, and disposed to be continuous with the third hole intersection line HINL3.

The fourth detour line portion DEP4 electrically connected to the fourth hole intersection line HINL4 intersecting the additional non-display area ANDA among the second initialization voltage auxiliary lines VIAL2 may be formed of the line conductive layer (i.e., the third conductive layer CDL3), spaced apart from the first detour line portions DEP1 and the third detour line portion DEP3, and disposed to be continuous with the fourth hole intersection line HINL4.

The first detour line portions DEP1, the third detour line portion DEP3, and the fourth detour line portion DEP4 may be formed of the line conductive layer (i.e., the third conductive layer CDL3) of the line detour area LSSA, and may be arranged to be spaced apart from each other.

For example, according to the positional relationship of the data line DL, the first initialization voltage auxiliary line VIAL1, and the second initialization voltage auxiliary line VIAL2, each of the third detour line portion DEP3 and the fourth detour line portion DEP4 may be disposed between the first detour line portions DEP1.

Alternatively, although not shown separately, when the first initialization voltage auxiliary line VIAL1 and the second initialization voltage auxiliary line VIAL2 are disposed between the data line DL and the first power line VDL, the first detour line portions DEP1, the third detour line portion DEP3, and the fourth detour line portion DEP4 may be alternately disposed at least one by one in the first direction DR1 or the second direction DR2. That is, one first detour line portion DEP1, one third detour line portion DEP3, and one fourth detour line portion DEP4 may be repeatedly arranged.

The second detour line portion DEP2 may overlap the first detour line portions DEP1, the third detour line portion DEP3, and the fourth detour line portion DEP4.

That is, the second detour line portion DEP2 has a relatively large width enough to completely overlap the first detour line portions DEP1, the third detour line portion DEP3, and the fourth detour line portion DEP4. For example, the second detour line portion DEP2 may be disposed in the entire line detour area LSSA.

In this way, the second detour line portion DEP2 has a relatively large width, and thus may have a relatively low resistance. Therefore, the RC delay of the first power line VDL by the second detour line portion DEP2 may be reduced.

Further, since the gap between the first detour line portions DEP1 and the third and fourth detour line portions DEP3 and DEP4, which are formed of the line conductive layer (i.e., the third conductive layer CDL3) of the line detour area LSSA, may be widened, short circuit defects or coupling defects between the first detour line portions DEP1 and the third and fourth detour line portions DEP3 and DEP4 may be reduced.

Figure 25:
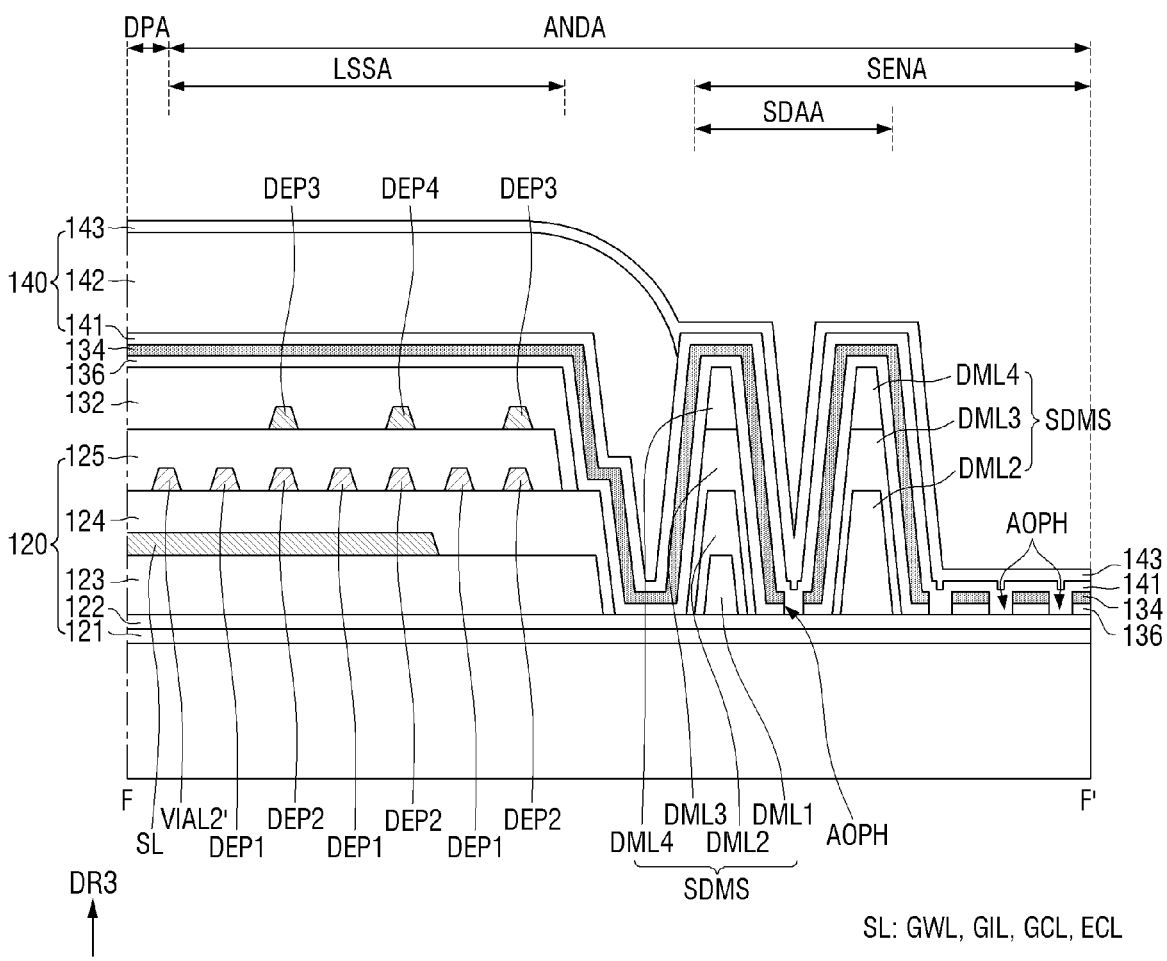
FIG. 25 is a cross-sectional view taken along line F-F' of FIG. 23 according to a seventh embodiment.

FIG. 25 is a cross-sectional view taken along line F-F' of FIG. 23 according to a seventh embodiment.

Referring to FIG. 25, a display device 10 according to the seventh embodiment is substantially the same as the display device 10 according to the sixth embodiment illustrated in FIGS. 21 to 24 except that the second hole intersection lines HINL2 intersecting the additional non-display area ANDA among the first power lines VDL are respectively electrically connected to the second detour line portions DEP2 formed of the line conductive layer (i.e., the third conductive layer CDL3), and that the third detour line portion DEP3 and the fourth detour line portion DEP4 are formed of the electrode conductive layer on the insulating layer (i.e., the second planarization layer 125) covering the line conductive layer (i.e., the third conductive layer CDL3), so that the redundant description will be omitted below.

In accordance with the seventh embodiment, the second detour line portions DEP2 respectively electrically connected to the second hole intersection lines HINL2 intersecting the additional non-display area ANDA among the first power lines VDL may be disposed to be respectively continuous with the second hole intersection lines HINL2.

The first detour line portions DEP1 and the second detour line portions DEP2 may be formed of the line conductive layer (i.e., the third conductive layer CDL3) of the line detour area LSSA, and may be arranged to be spaced apart from each other.

According to the positional relationship between the data line DL and the first power line VDL, the first detour line portions DEP1 and the second detour line portions DEP2 may be alternately disposed at least one by one in the first direction DR1 or the second direction DR2.

The third detour line portion DEP3 electrically connected to the third hole intersection line HINL3 intersecting the additional non-display area ANDA among the first initialization voltage auxiliary lines VIAL1 may be formed of the electrode conductive layer on the insulating layer (i.e., the second planarization layer 125) covering the line conductive layer (i.e., the third conductive layer CDL3).

The fourth detour line portion DEP4 electrically connected to the fourth hole intersection line HINL4 intersecting the additional non-display area ANDA among the second initialization voltage auxiliary lines VIAL2 may be formed of the electrode conductive layer on the insulating layer (i.e., the second planarization layer 125) covering the line conductive layer (i.e., the third conductive layer CDL3), and may be spaced apart from the third detour line portion DEP3.

Each of the third detour line portion DEP3 and the fourth detour line portion DEP4 may overlap the second detour line portions DEP2.

In this way, the influence of coupling by the data signal Vdata of each of the first detour line portions DEP1 may be reduced by the second detour line portion DEP2. Accordingly, the coupling defect in which the potential of the first initialization voltage Vint1 of the third detour line portion DEP3 or the potential of the second initialization voltage Vint2 of the fourth detour line portion DEP4 varies by the data signal Vdata of each of the first detour line portions DEP1 may be reduced.

Figure 26:
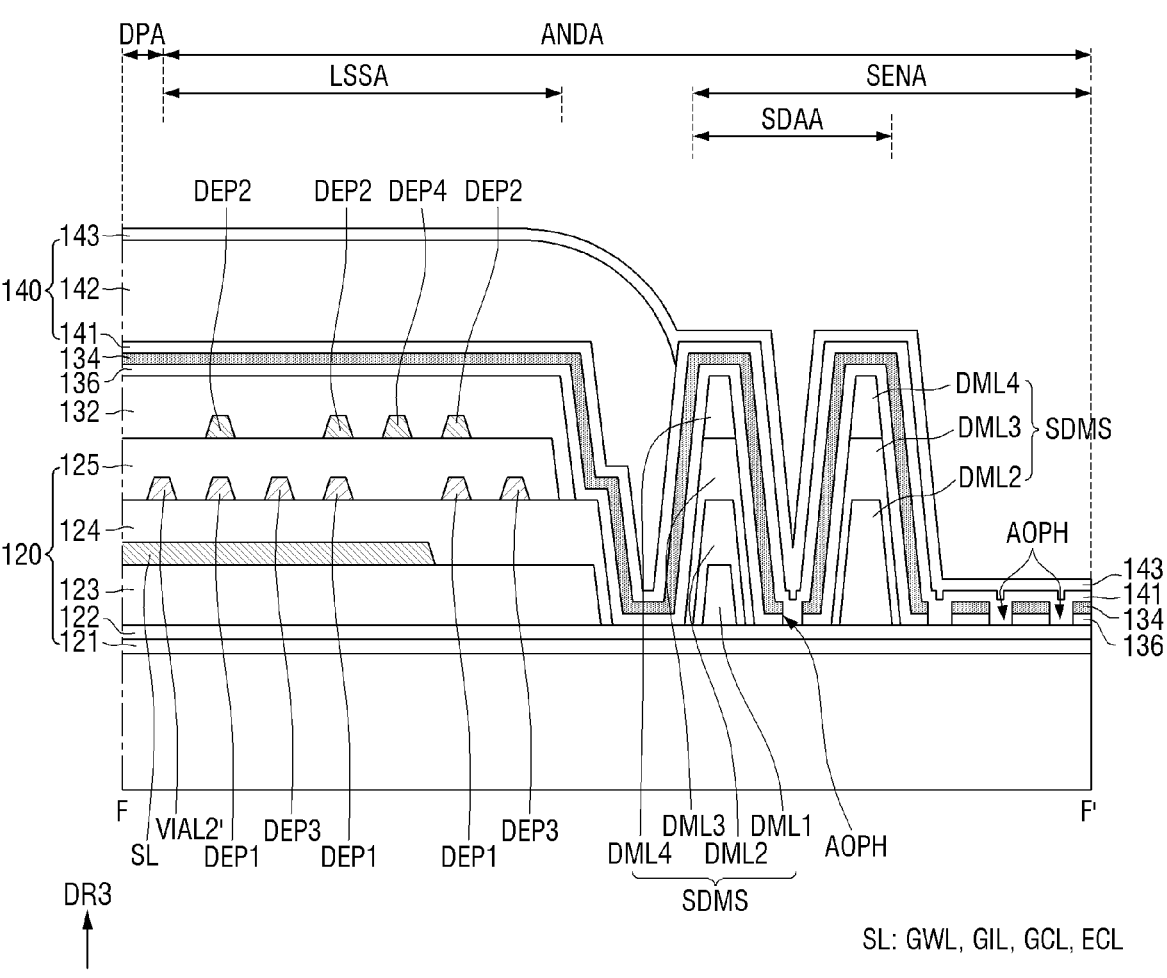
FIG. 26 is a cross-sectional view taken along line F-F' of FIG. 23 according to an eighth embodiment.

FIG. 26 is a cross-sectional view taken along line F-F' of FIG. 23 according to an eighth embodiment.

Referring to FIG. 26, a display device 10 according to an eighth embodiment is substantially the same as the display device 10 according to the seventh embodiment illustrated in FIG. 25 except that the third detour line portion DEP3 transmitting the first initialization voltage Vint1 is formed of the line conductive layer (i.e., the third conductive layer CDL3), and that the second detour line portion DEP2 transmitting the first power ELVDD and the fourth detour line portion DEP4 transmitting the second initialization voltage Vint2 are formed of the electrode conductive layer on the insulating layer (i.e., the second planarization layer 125) covering the line conductive layer (i.e., the third conductive layer CDL3), so that the redundant description will be omitted below.

Since the first initialization voltage Vint1 is a constant voltage for initializing the potential of the gate electrode of the driving transistor DT, when the potential of the gate electrode is not properly initialized by the first initialization voltage Vint1, an error in which the source-drain current of the driving transistor DT, that is, the driving current, is generated with a magnitude that does not correspond to the data signal Vdata may occur.

On the other hand, since the second initialization voltage Vint2 is a constant voltage for initializing the potential of the anode electrode of the light emitting element LE, when the potential of the anode electrode 131 is not properly initialized by the second initialization voltage Vint2, an error in which the light emitting element LE is driven without supply of the driving current may occur.

In this way, the second initialization voltage Vint2 is directly related to the driving of the light emitting element LE, so that the influence of the coupling defect of the second initialization voltage Vint2 is relatively large compared to the coupling defect of the first initialization voltage Vint1.

Accordingly, in accordance with the eighth embodiment, the fourth detour line portion DEP4 transmitting the second initialization voltage Vint2 may be formed of the electrode conductive layer on the insulating layer (i.e., the second planarization layer 125) together with the second detour line portions DEP2 transmitting the first power ELVDD. The fourth detour line portion DEP4 may be spaced apart from the second detour line portions DEP2.

Further, the first detour line portions DEP1 transmitting the data signal Vdata and the third detour line portion DEP3 transmitting the first initialization voltage Vint1 may be formed of the line conductive layer (i.e., the third conductive layer CDL3). The third detour line portion DEP3 may be spaced apart from the first detour line portions DEP1.

At least some of the second detour line portions DEP2 may overlap the first detour line portions DEP1, respectively.

Further, the fourth detour line portion DEP4 may be disposed between the second detour line portions DEP2.

In this way, the fourth detour line portion DEP4 may be surrounded by the second detour line portions DEP2, and may be further spaced apart from the first detour line portions DEP1 compared to the second detour line portions DEP2. Accordingly, the degree of influence of coupling by the data signal Vdata of the first detour line portions DEP1 on the second initialization voltage Vint2 of the fourth detour line portion DEP4 may be reduced.

In addition, the third detour line portion DEP3 may be disposed between the first detour line portions DEP1.

Figure 27:
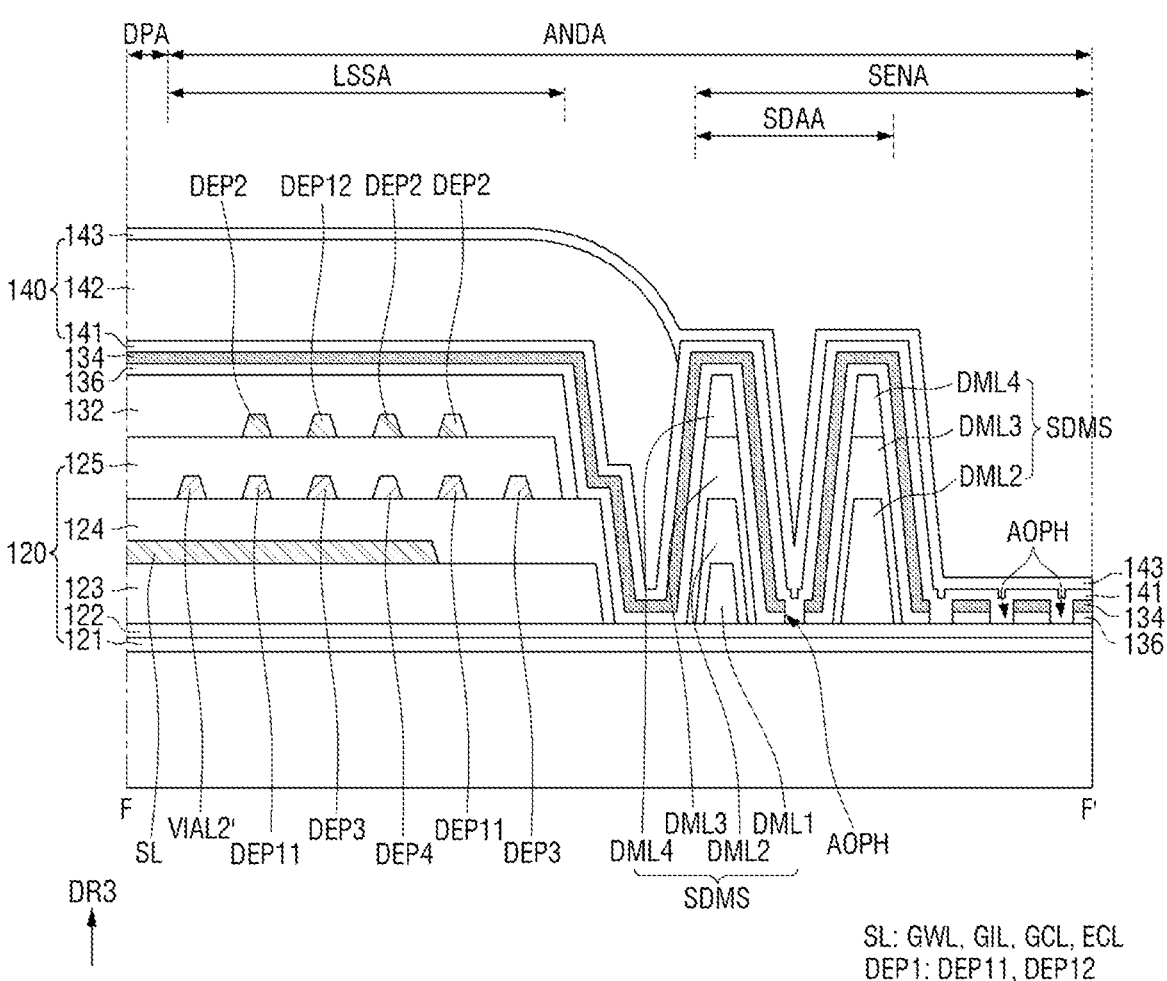
FIG. 27 is a cross-sectional view taken along line F-F' of FIG. 23 according to a ninth embodiment.

FIG. 27 is a cross-sectional view taken along line F-F' of FIG. 23 according to a ninth embodiment.

Referring to FIG. 27, a display device 10 according to a ninth embodiment is substantially the same as the display device 10 according to the seventh embodiment illustrated in FIG. 25 except that the first detour line portions DEP1 include the first data detour line portions DEP11 formed of the line conductive layer (i.e., the third conductive layer) and the second data detour line portion DEP12 formed of the electrode conductive layer, and that the second detour line portion DEP2 transmitting the first power ELVDD is formed of the electrode conductive layer on the insulating layer (i.e., the second planarization layer 125) covering the line conductive layer (i.e., the third conductive layer CDL3), and also that the third detour line portion DEP3 transmitting the first initialization voltage Vint1 and the fourth detour line portion DEP4 transmitting the second initialization voltage Vint2 are formed of the line conductive layer (i.e., the third conductive layer), so that the redundant description will be omitted below.

The first data detour line portion DEP11 may overlap some of the second detour line portions DEP2.

The second data detour line portions DEP12 and the second detour line portions DEP2 may be alternately disposed in the first direction DR1 or the second direction DR2.

The second detour line portions DEP2 are spaced apart from the second data detour line portions DEP12.

The third detour line portion DEP3 is spaced apart from the first data detour line portion DEP11.

The fourth detour line portion DEP4 is spaced apart from the first data detour line portion DEP11 and the third detour line portion DEP3.

In this way, the first detour line portions DEP1 are arranged while being divided into the line conductive layer and the electrode conductive layer, so that the gap between the first detour line portions DEP1 may be further increased, which makes it possible to further reduce the short-circuit defects between the first detour line portions DEP1.

Figure 28:
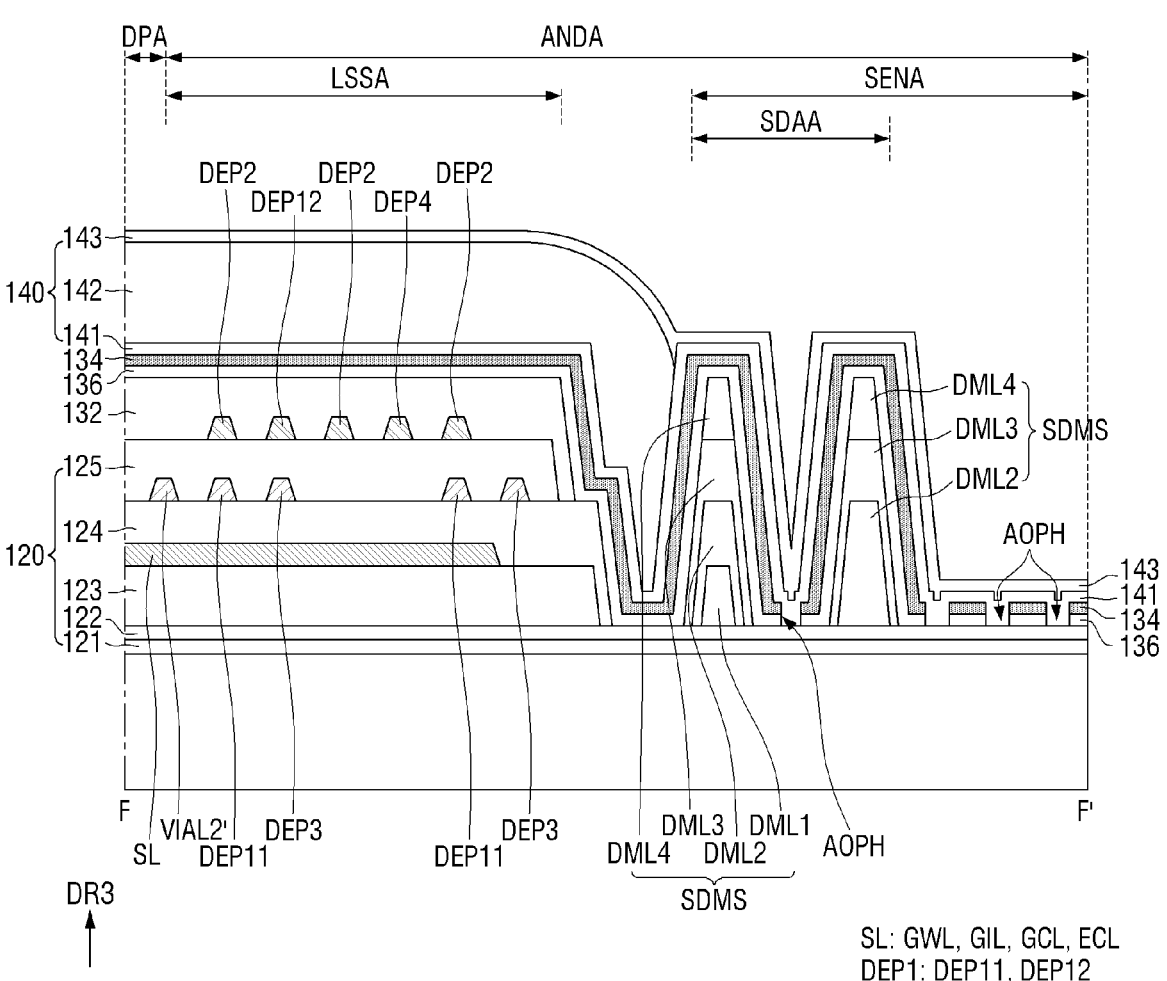
FIG. 28 is a cross-sectional view taken along line F-F' of FIG. 23 according to a tenth embodiment.

FIG. 28 is a cross-sectional view taken along line F-F of FIG. 23 according to a tenth embodiment.

Referring to FIG. 28, a display device 10 according to a tenth embodiment is substantially the same as the display device 10 according to the ninth embodiment illustrated in FIG. 27 except that the fourth detour line portion DEP4 is formed of the electrode conductive layer on the insulating layer (i.e., the second planarization layer 125) covering the line conductive layer (i.e., the third conductive layer CDL3), so that the redundant description will be omitted below.

The fourth detour line portion DEP4 may be disposed between the second detour line portions DEP2.

In this way, the fourth detour line portion DEP4 may be surrounded by the second detour line portions DEP2, and may be further spaced apart from the first detour line portions DEP1 compared to the second detour line portions DEP2. Accordingly, the degree of influence of coupling by the data signal Vdata of the first detour line portions DEP1 on the second initialization voltage Vint2 of the fourth detour line portion DEP4 may be reduced.

While the present disclosure has been described with reference to embodiments thereof, it will be apparent to those of ordinary skill in the art that various changes and modifications may be made thereto without departing from the scope and spirit of the present disclosure as set forth in the following claims.

What is claimed is:

1. A display device comprising:
a substrate comprising a display area in which emission areas are arranged, a main non-display area disposed around the display area, a hole area surrounded by the display area, and an additional non-display area between the hole area and the display area;
a circuit array layer disposed on the substrate;
a light emitting array layer disposed on the circuit array layer and comprising light emitting elements respectively corresponding to the emission areas;
an encapsulation layer disposed on the light emitting array layer; and
a through portion disposed in the hole area and penetrating the substrate, the circuit array layer, the light emitting array layer, and the encapsulation layer,
wherein the circuit array layer comprises:
pixel drivers electrically connected to the light emitting elements, respectively, and
second direction lines spaced apart from each other in a first direction, extending in a second direction crossing the first direction, comprised in a line conductive layer, and electrically connected to the pixel drivers,
wherein the light emitting array layer comprises an anode electrode of each of the light emitting elements comprised in an electrode conductive layer on an insulating layer covering the line conductive layer,
wherein the second direction lines comprise hole intersection lines intersecting the additional non-display area,
wherein the hole intersection lines are electrically connected to detour line portions, respectively,
wherein the detour line portions are disposed in the additional non-display area and detour around the hole area,
wherein some of the detour line portions are comprised in the electrode conductive layer,
wherein the second direction lines comprise:
data lines configured to transmit data signals to the pixel drivers; and
first power lines configured to transmit a first power to the pixel drivers,
wherein the data lines comprise first hole intersection lines intersecting the additional non-display area,
wherein the first power lines comprise second hole intersection lines intersecting the additional non-display area, and
wherein the hole intersection lines comprise the first hole intersection lines and the second hole intersection lines.

2. The display device of claim 1, wherein first detour line portions electrically connected to the first hole intersection lines, respectively, are comprised in the line conductive layer and are continuous with the first hole intersection lines, respectively, and
wherein a second detour line portion electrically connected to the second hole intersection lines is comprised in the electrode conductive layer and overlaps the first detour line portions.

3. The display device of claim 1, wherein a first data detour line portion electrically connected to some of the first hole intersection lines is comprised in the line conductive layer and is continuous with the some of the first hole intersection lines,
wherein a second data detour line portion electrically connected to an other of the first hole intersection lines is comprised in the electrode conductive layer,
wherein second detour line portions electrically connected to the second hole intersection lines, respectively, are comprised in the electrode conductive layer and are spaced apart from the second data detour line portion,
wherein the first data detour line portion overlaps some of the second detour line portions, and
wherein the detour line portions comprise the first data detour line portion, the second data detour line portion, and the second detour line portions.

4. The display device of claim 3, wherein the second data detour line portions and the second detour line portions are alternately disposed.

5. The display device of claim 1, wherein a pixel driver of the pixel drivers comprises:
a driving transistor configured to generate a driving current for driving a light emitting element of the light emitting elements;
a first transistor disposed between a gate electrode of the driving transistor and a second electrode of the driving transistor;

a second transistor disposed between a data line of the data lines and a first electrode of the driving transistor;

a third transistor disposed between an initialization voltage line transmitting an initialization voltage and the gate electrode of the driving transistor;

a fourth transistor disposed between the initialization voltage line and the light emitting element;

a fifth transistor disposed between a first power line of the first power lines and the first electrode of the driving transistor; and a sixth transistor disposed between the light emitting element and the second electrode of the driving transistor.

6. The display device of claim 5, wherein the circuit array layer comprises:

a semiconductor layer disposed on the substrate;

a first conductive layer disposed on a gate insulating layer covering the semiconductor layer and comprising first direction lines extending in the first direction;

a second conductive layer disposed on an interlayer insulating layer covering the first conductive layer;

a third conductive layer disposed on a first planarization layer covering the second conductive layer and comprising the second direction lines; and a second planarization layer covering the third conductive layer, wherein the line conductive layer comprises the third conductive layer, wherein the insulating layer comprises the second planarization layer, and wherein the initialization voltage line is comprised in the second conductive layer and extends in the first direction.

7. The display device of claim 1, wherein the second direction lines further comprise initialization voltage auxiliary lines configured to transmit an initialization voltage to the pixel drivers, wherein the initialization voltage auxiliary lines comprise third hole intersection lines intersecting the additional non-display area, and wherein the hole intersection lines comprise the third hole intersection lines.

8. The display device of claim 7, wherein first detour line portions electrically connected to the first hole intersection lines, respectively, are comprised in the line conductive layer and are continuous with the first hole intersection lines, respectively, wherein a second detour line portion electrically connected to the second hole intersection lines is comprised in the electrode conductive layer, wherein third detour line portions electrically connected to the third hole intersection lines, respectively, are comprised in the line conductive layer, are spaced apart from the first detour line portions, and are continuous with the third hole intersection lines, respectively, wherein the second detour line portion overlaps the first detour line portions and the third detour line portions, and wherein the detour line portions comprise the first detour line portions, the second detour line portion, and the third detour line portions.

9. The display device of claim 8, wherein the first detour line portions and the third detour line portions are alternately disposed.

10. The display device of claim 7, wherein first detour line portions electrically connected to the first hole intersection lines, respectively, are comprised in the line conductive layer and are continuous with the first hole intersection lines, respectively, wherein second detour line portions electrically connected to the second hole intersection lines, respectively, are comprised in the line conductive layer, are spaced apart from the first detour line portions, and are continuous with the second hole intersection lines, respectively, wherein third detour line portions electrically connected to the third hole intersection lines, respectively, are comprised in the electrode conductive layer and overlap the second detour line portions, respectively, and wherein the detour line portions comprise the first detour line portions, the second detour line portions, and the third detour line portions.

11. The display device of claim 10, wherein the first detour line portions and the second detour line portions are alternately disposed.

12. The display device of claim 7, wherein first detour line portions electrically connected to the first hole intersection lines, respectively, are comprised in the line conductive layer and are continuous with the first hole intersection lines, respectively, wherein second detour line portions electrically connected to the second hole intersection lines, respectively, are comprised in the electrode conductive layer, wherein third detour line portions electrically connected to the third hole intersection lines are comprised in the electrode conductive layer and are spaced apart from the second detour line portions, wherein at least some of the second detour line portions overlap the first detour line portions, respectively, and wherein the detour line portions comprise the first detour line portions, the second detour line portions, and the third detour line portions.

13. The display device of claim 12, wherein the second detour line portions and the third detour line portions are alternately disposed.

14. The display device of claim 7, wherein a pixel driver of the pixel drivers comprises:

a driving transistor configured to generate a driving current for driving a light emitting element of the light emitting elements;

a first transistor disposed between a gate electrode of the driving transistor and a second electrode of the driving transistor;

a second transistor disposed between a data line of the data lines and a first electrode of the driving transistor;

a third transistor disposed between an initialization voltage line transmitting the initialization voltage and the gate electrode of the driving transistor;

a fourth transistor disposed between the initialization voltage line and the one light emitting element;

a fifth transistor disposed between a first power line of the first power lines and the first electrode of the driving transistor; and a sixth transistor disposed between the light emitting element and the second electrode of the driving transistor.

15. The display device of claim 14, wherein the circuit array layer comprises:

a semiconductor layer disposed on the substrate;

a first conductive layer disposed on a gate insulating layer covering the semiconductor layer and comprising first direction lines extending in the first direction;

a second conductive layer disposed on an interlayer insulating layer covering the first conductive layer;

a third conductive layer disposed on a first planarization layer covering the second conductive layer and comprising the second direction lines; and a second planarization layer covering the third conductive layer, wherein the line conductive layer comprises the third conductive layer, wherein the insulating layer comprises the second planarization layer, and wherein the initialization voltage line is comprised in the second conductive layer, extends in the first direction, and is electrically connected to the initialization voltage auxiliary lines.

16. The display device of claim 1, wherein a pixel driver of the pixel drivers comprises a driving transistor configured to generate a driving current for driving a light emitting element of the light emitting elements, wherein the second direction lines further comprise:

first initialization voltage auxiliary lines configured to transmit a first initialization voltage for initializing a potential of a gate electrode of the driving transistor to the pixel drivers; and second initialization voltage auxiliary lines configured to transmit a second initialization voltage for initializing a potential of the anode electrode of the light emitting element to the pixel drivers, wherein the first initialization voltage auxiliary lines comprise a third hole intersection line intersecting the additional non-display area, wherein the second initialization voltage auxiliary lines comprise a fourth hole intersection line intersecting the additional non-display area, and wherein the hole intersection lines comprise the third hole intersection line and the fourth hole intersection line.

17. The display device of claim 16, wherein first detour line portions electrically connected to the first hole intersection lines, respectively, are comprised in the line conductive layer and are continuous with the first hole intersection lines, respectively, wherein a second detour line portion electrically connected to the second hole intersection lines is comprised in the electrode conductive layer, wherein a third detour line portion electrically connected to the third hole intersection line is comprised in the line conductive layer, is spaced apart from the first detour line portions, and is continuous with the third hole intersection line, wherein a fourth detour line portion electrically connected to the fourth hole intersection line is comprised in the line conductive layer, is spaced apart from the first detour line portions and the third detour line portion, and is continuous with the fourth hole intersection line, wherein the second detour line portion overlaps the first detour line portions, the third detour line portion, and the fourth detour line portion, and wherein the detour line portions comprise the first detour line portions, the second detour line portion, the third detour line portion, and the fourth detour line portion.

18. The display device of claim 17, wherein each of the third detour line portion and the fourth detour line portion is disposed between the first detour line portions.

19. The display device of claim 16, wherein first detour line portions electrically connected to the first hole intersection lines, respectively, are comprised in the line conductive layer and are continuous with the first hole intersection lines, respectively, wherein second detour line portions electrically connected to the second hole intersection lines, respectively, are comprised in the line conductive layer, are spaced apart from the first detour line portions, and are continuous with the second hole intersection lines, respectively, wherein a third detour line portion electrically connected to the third hole intersection line is comprised in the electrode conductive layer, wherein a fourth detour line portion electrically connected to the fourth hole intersection line is comprised in the electrode conductive layer and is spaced apart from the third detour line portion, wherein the third detour line portion and the fourth detour line portion overlap the second detour line portions, respectively, and wherein the detour line portions comprise the first detour line portions, the second detour line portions, the third detour line portion, and the fourth detour line portion.

20. The display device of claim 19, wherein the first detour line portions and the second detour line portions are alternately disposed.

21. The display device of claim 16, wherein first detour line portions electrically connected to the first hole intersection lines, respectively, are comprised in the line conductive layer and are continuous with the first hole intersection lines, respectively, wherein second detour line portions electrically connected to the second hole intersection lines, respectively, are comprised in the electrode conductive layer, wherein a third detour line portion electrically connected to the third hole intersection line is comprised in the line conductive layer and is spaced apart from the first detour line portions, wherein a fourth detour line portion electrically connected to the fourth hole intersection line is comprised in the electrode conductive layer and is spaced apart from the second detour line portions, wherein at least some of the second detour line portions overlap the first detour line portions, respectively, and wherein the detour line portions comprise the first detour line portions, the second detour line portions, the third detour line portion, and the fourth detour line portion.

22. The display device of claim 21, wherein the third detour line portion is disposed between the first detour line portions, and wherein the fourth detour line portion is disposed between the second detour line portions.

23. The display device of claim 16, wherein a first data detour line portion electrically connected to some of the first hole intersection lines is comprised in the line conductive layer and is continuous with the some of the first hole intersection lines, wherein a second data detour line portion electrically connected to an other of the first hole intersection lines is comprised in the electrode conductive layer, wherein second detour line portions electrically connected to the second hole intersection lines, respectively, are comprised in the electrode conductive layer and are spaced apart from the second data detour line portion, wherein a third detour line portion electrically connected to the third hole intersection line is comprised in the line conductive layer and is spaced apart from the first data detour line portions, wherein a fourth detour line portion electrically connected to the fourth hole intersection line is comprised in the line conductive layer and is spaced apart from the first data detour line portions and the third detour line portion, wherein the first data detour line portion overlaps some of the second detour line portions, and wherein the detour line portions comprise the first data detour line portion, the second data detour line portion, the second detour line portions, the third detour line portion, and the fourth detour line portion.

24. The display device of claim 23, wherein the fourth detour line portion overlaps some others of the second detour line portions.

25. The display device of claim 16, wherein a first data detour line portion electrically connected to some of the first hole intersection lines is comprised in the line conductive layer and is continuous with the some of the first hole intersection lines, wherein a second data detour line portion electrically connected to an other of the first hole intersection lines is comprised in the electrode conductive layer, wherein second detour line portions electrically connected to the second hole intersection lines, respectively, are comprised in the electrode conductive layer and are spaced apart from the second data detour line portion, wherein a third detour line portion electrically connected to the third hole intersection line is comprised in the line conductive layer and is spaced apart from the first data detour line portions, wherein a fourth detour line portion electrically connected to the fourth hole intersection line is comprised in the electrode conductive layer and is spaced apart from the second data detour line portion and the second detour line portions, wherein the first data detour line portion overlaps some of the second detour line portions, and wherein the detour line portions comprise the first data detour line portion, the second data detour line portion, the second detour line portions, the third detour line portion, and the fourth detour line portion.

26. The display device of claim 25, wherein the fourth detour line portion is disposed between the second detour line portions.

27. The display device of claim 16, wherein a pixel driver of the pixel drivers comprises:

a driving transistor configured to generate a driving current for driving a light emitting element of the light emitting elements;

a first transistor disposed between a gate electrode of the driving transistor and a second electrode of the driving transistor;

a second transistor disposed between a data line of the data lines and a first electrode of the driving transistor;

a third transistor disposed between a first initialization voltage line transmitting the first initialization voltage and the gate electrode of the driving transistor;

a fourth transistor disposed between a second initialization voltage line transmitting the second initialization voltage and the one light emitting element;

a fifth transistor disposed between a first power line of the first power lines and the first electrode of the driving transistor; and a sixth transistor disposed between the light emitting element and the second electrode of the driving transistor.

28. The display device of claim 27, wherein the circuit array layer comprises:

a semiconductor layer disposed on the substrate;

a first conductive layer disposed on a gate insulating layer covering the semiconductor layer and comprising first direction lines extending in the first direction;

a second conductive layer disposed on an interlayer insulating layer covering the first conductive layer;

a third conductive layer disposed on a first planarization layer covering the second conductive layer and comprising the second direction lines; and a second planarization layer covering the third conductive layer, wherein the line conductive layer comprises the third conductive layer, wherein the insulating layer comprises the second planarization layer, wherein each of the first initialization voltage line and the second initialization voltage line is comprised in the second conductive layer and extends in the first direction, wherein the first initialization voltage line is electrically connected to the first initialization voltage auxiliary line, and wherein the second initialization voltage line is electrically connected to the second initialization voltage auxiliary line.

* * * * *